(12) United States Patent
Hayamizu et al.

(10) Patent No.: US 7,113,683 B2
(45) Date of Patent: Sep. 26, 2006

(54) OPTICAL WAVEGUIDE DEVICE, MANUFACTURING METHOD THEREOF AND OPTICAL COMMUNICATION APPARATUS

(75) Inventors: Kazuyuki Hayamizu, Kyotanabe (JP); Yoshiyuki Komura, Kyotanabe (JP); Yukari Terakawa, Kyoto (JP); Hayami Hosokawa, Tsuzuki-gun (JP); Toshiyuki Takahashi, Nara (JP); Masayoshi Higuchi, Soraku-gun (JP); Yoshitaka Tatara, Nara (JP); Naru Yasuda, Uji (JP); Hiroto Nozawa, Nara (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 11/312,663

(22) Filed: Dec. 20, 2005

(65) Prior Publication Data

US 2006/0110098 A1 May 25, 2006

Related U.S. Application Data

(63) Continuation of application No. 10/611,684, filed on Jul. 1, 2003, now Pat. No. 7,013,055.

(30) Foreign Application Priority Data

| Jul. 2, 2002 | (JP) | ............................... 2002-194017 |
| Jan. 20, 2003 | (JP) | ............................... 2003-11709 |

(51) Int. Cl.
*G02B 6/10* (2006.01)
*G02B 6/12* (2006.01)

(52) U.S. Cl. .................. 385/129; 385/14; 385/131; 438/31

(58) Field of Classification Search ............... 385/14, 385/39, 129, 131; 438/29, 31; 65/386, 473
See application file for complete search history.

(56) References Cited

U.S. PATENT DOCUMENTS

| 5,113,471 | A | * | 5/1992 | Inaishi et al. ............... 385/126 |
| 6,027,671 | A | * | 2/2000 | Kragl ........................ 264/1.24 |
| 6,660,192 | B1 | * | 12/2003 | Kim et al. ................. 264/1.27 |
| 6,868,214 | B1 | * | 3/2005 | Sakata et al. ............... 385/129 |

* cited by examiner

*Primary Examiner*—Akm Enayet Ullah
*Assistant Examiner*—Daniel Petkovsek
(74) *Attorney, Agent, or Firm*—Osha Liang LLP

(57) ABSTRACT

A method of manufacturing an optical waveguide device includes providing an optical fiber guide for fixing an optical fiber and optical element placing portions for providing element mounting benches outside a waveguide fixing region of a silicon substrate. A metallic thin film is formed outside the waveguide fixing region of the silicon substrate. After an optical waveguide substrate is bonded to a whole of an upper surface of the silicon substrate through a bonding resin which will become an upper cladding layer, the optical waveguide substrate is diced along an edge of the waveguide fixing region, and the optical waveguide substrate outside the waveguide fixing region is removed to expose the optical fiber guide and the optical element placing portions.

14 Claims, 48 Drawing Sheets

ULTRAVIOLET RAY

ULTRAVIOLET RAY

ULTRAVIOLET RAY

ULTRAVIOLET RAY (a)
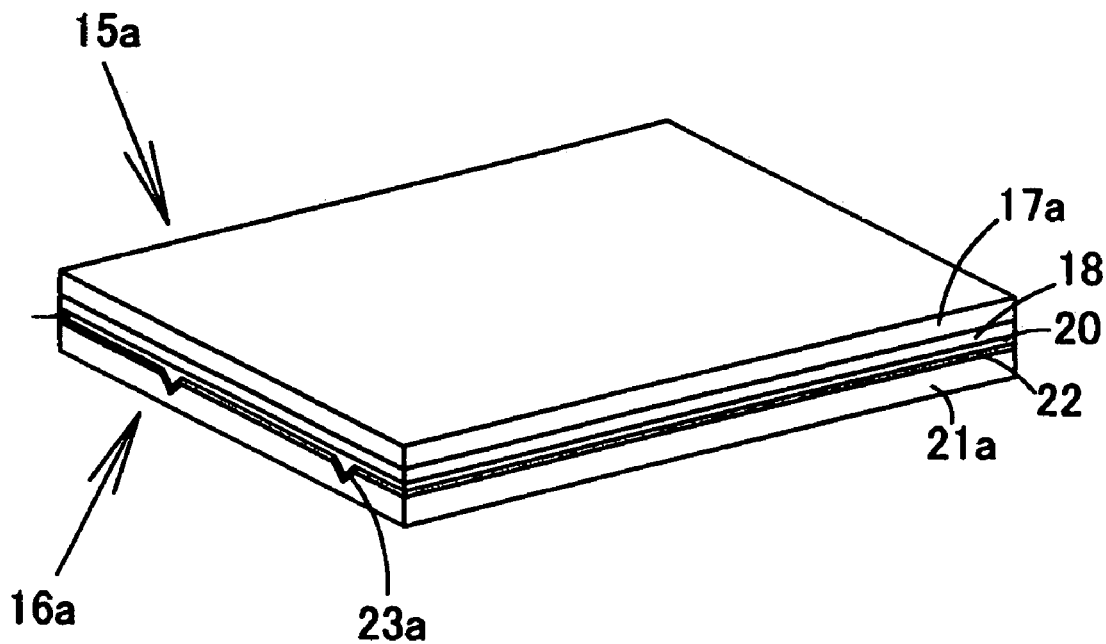
(b)
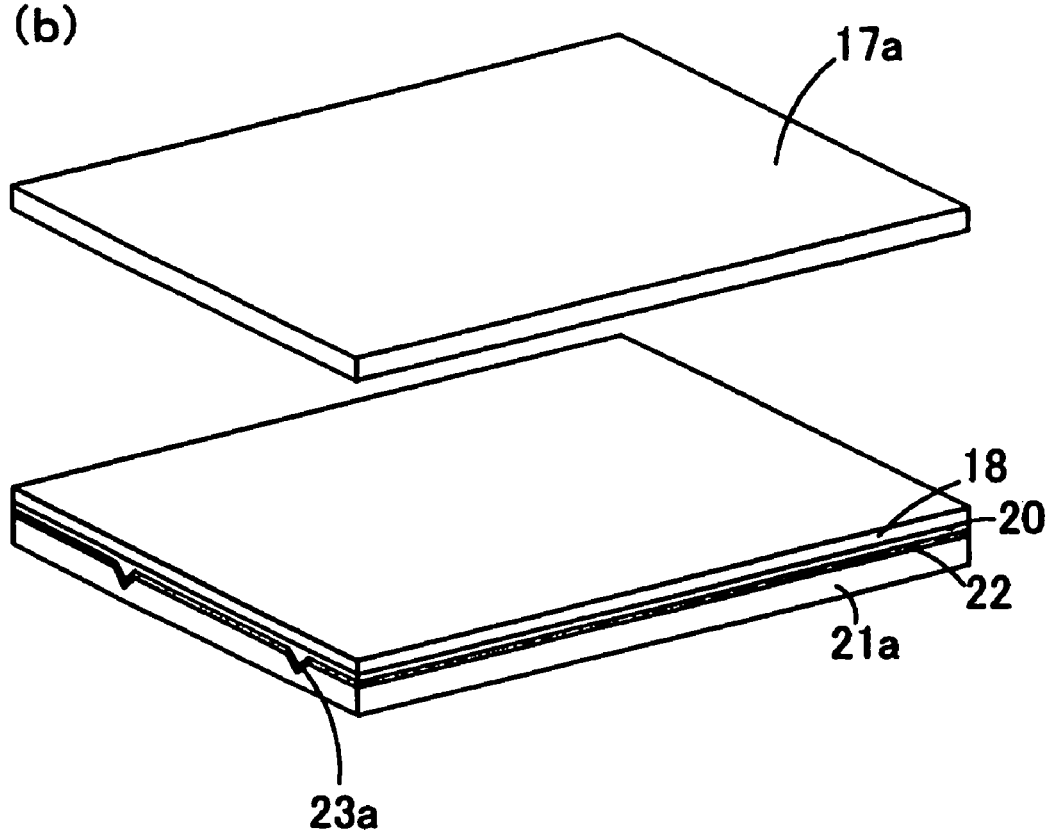
FIG. 32

ULTRAVIOLET RAY

OPTICAL WAVEGUIDE DEVICE, MANUFACTURING METHOD THEREOF AND OPTICAL COMMUNICATION APPARATUS

CROSS-REFERENCE TO RELATED APPLICATIONS

This patent application is a continuation application of U.S. patent application Ser. No. 10/611,684, filed Jul. 1, 2003 now U.S. Pat. No. 7,013,055.

BACKGROUND OF THE INVENTION

1. Field of the Invention

The present invention relates to an optical waveguide device which adds an optical fiber guide and an optical element placing portion for mounting an optical fiber, a light emitting element, a light receiving element, or the like and light modulating function to an optical waveguide for transmitting light in a core, a manufacturing method of the optical waveguide device, and an optical communication apparatus which uses the optical waveguide device.

2. Description of the Background Art

In a joint portion or an end portion of the optical fiber cable used for optical communication, the optical waveguide device is used in order to connect the optical fiber cable to other optical fiber cable, the light emitting element, or the light receiving element. In recent years, utilization of optical communication that can transmit large-capacity data at high speed has progressed. Thus, the manufacturing of an optical waveguide device that is inexpensive and suitable for mass production is desired.

FIG. 1 is a schematically perspective view of an optical waveguide device 1 which is conventionally used. As shown in FIG. 2, the optical waveguide device 1 includes an optical waveguide 6 and a supporting substrate 7. The optical waveguide device 1 can be used in such a manner that the optical waveguide 6 is put on an optical waveguide placing portion 12 of the supporting substrate 7, and a core 4 of the optical waveguide is connected to the optical fiber, a light emitting element 8, light receiving element 10, or the like.

The optical waveguide 6 includes a substrate 2, the core 4 for transmitting a light therein, a lower cladding layer 3 and an upper cladding layer 5 which surround the core 4, and a filter 13d. The core 4, the lower cladding layer 3, and the upper cladding layer 5 are made of a substance, such as resin or glass, which has relatively large refractive index. So that the light is trapped in the core 4 and propagated, the refractive index of the core 4 need be large compared with the refractive indices of the lower cladding layer 3 and the upper cladding layer 5. The filter 13d is the optical element having characteristics which transmit the light having a specific wavelength and reflect the light having the wavelengths except the specific wavelength. The filter 13d is used by placing it in a filter placing groove 13c which is formed in the optical waveguide 6 so that the core 4 is divided into a core 4a and cores 4b and 4c.

An optical fiber guide 9 for positioning and placing the optical fiber, which has a V-shaped groove in cross section, and an optical fiber placing portion 12 for putting the optical waveguide 6 on it are formed on the supporting substrate 7 formed by etching a silicon substrate 11. On the supporting substrate 7, the light emitting element 8 such as a laser diode (LD) or a light emitting diode (LED), the light receiving element, and the like 10 are placed while an end face of the core 4 is aligned with an optical axis of the transmitting light. A lead and wire bonding pads 13a and 13b for applying electric power to the light emitting element 8 and the light receiving element 10 is formed on the supporting substrate 7.

In the manufacturing of the optical waveguide device 1 in the conventional art, the optical waveguide 6 and the supporting substrate 7 were produced separately, and the optical waveguide 6 and the supporting substrate 7 were bonded one by one with the bonding resin to produce the optical waveguide device 1. Accordingly, a manufacturing process became complicated, it took much time and cost for the manufacturing process, and the mass production could not be efficiently performed. Further, since the individual optical waveguide 6 and supporting substrate 7 are minute components, it took much time and cost to precisely align the optical waveguide 6 and supporting substrate 7 to assemble the optical waveguide device 1, and it was difficult to improve net productivity.

On the other hand, a plurality of optical waveguides 6 and a plurality of supporting substrates 7 are formed on wafers or mother boards respectively, the two wafers or the two mother boards are bonded together, and then the bonded body is divided into the individual optical waveguide devices. As a result, the productivity is improved. However, in the optical waveguide device 1 in which the pad portion for mounting the light emitting element 8 or the light receiving element 10 and the optical fiber guide 9 are provided in the supporting substrate 7, since the light emitting element and the light receiving element are finally mounted on the pad portion and the optical fiber need be fixed to the optical fiber guide 9, it is necessary to expose the pad portion and the optical fiber guide 9. Accordingly, in the method in which the plurality of optical waveguides 6 and the plurality of supporting substrates 7 are formed on the wafer or the mother board respectively and the both wafers or the both the mother boards are bonded over the surfaces, it is difficult to expose the optical fiber guide 9 or the pad portion, and possibility of the manufacturing method was low in the optical waveguide device having the optical fiber guide 9 or the pad portion.

SUMMARY OF THE INVENTION

In view of the foregoing, it is an object of the invention to provide the manufacturing method of the optical waveguide device which simplifies the manufacturing process of the optical waveguide device and is suitable for the mass production.

A manufacturing method of an optical waveguide device according to a first aspect of the invention, including the steps of bonding a first substrate having an optical waveguide region, which includes a core transmitting light and a cladding surrounding the core, and a second substrate having a functional region over almost a whole surface, opposing at least a part of the functional region to an outside of the optical waveguide region in the first substrate, and removing an unnecessary part of the first substrate opposite to the functional region. At this point, the functional region provided in the second substrate is the region concerning the optical modulating function, in which the light emitting element or the light receiving element, an element mounting bench or the optical fiber guide for mounting the element such as the optical fiber or the component, a heater, or an electrode is formed. The optical waveguide region may include the filter or the heater element which influences the light propagating through the core. Further, the optical waveguide region may be provided in a whole of the first substrate, may be provided in a part of the first substrate, or may be the first substrate itself.

In the above-described manufacturing method of the optical waveguide device according to the first aspect of the invention, even if the first substrate and the second substrate are bonded over almost the whole surface, the functional region of the second substrate can be exposed to mount a predetermined element or component on the functional region in a manner that removes the unnecessary part opposite to the region where the functional region is formed in the first substrate. Accordingly, in bonding the first substrate and the second substrate, it is not necessary to apply the bonding resin onto a predetermined pattern except the unnecessary part of the first substrate, the bonding process of the first and second substrates can be simplified, and the manufacturing process of the optical waveguide device can be also simplified.

A manufacturing method of an optical waveguide device according to a second aspect of the invention, including the steps of bonding a first substrate having a plurality of optical waveguide regions, which include a core transmitting light and a cladding surrounding the core, and a second substrate having a plurality of functional regions over almost a whole surface, opposing at least a part of each of the functional regions to an outside of each optical waveguide region in the first substrate, and separating the first and the second substrates into individual optical waveguide devices including the optical waveguide region and the functional region, while an unnecessary part of the first substrate opposite to the functional region is removed.

In the above-described manufacturing method of the optical waveguide device according to the second aspect of the invention, even if the plurality of optical waveguide devices are simultaneously produced from the first substrate of the mother board and the second substrate of the mother board, after the first substrate of the mother board and the second substrate of the mother board are bonded over almost the whole surface, the unnecessary part of the first substrate can be removed to expose the functional region and the first and second substrates can be divided into the individual optical waveguide devices. Accordingly, after the first substrate of the mother board and the second substrate of the mother board are separately cut off, compared with the case in which the cut-off first and second substrates are bonded one by one, the manufacturing process of the optical waveguide device can be remarkably simplified and the productivity can be improved.

A manufacturing method of an optical waveguide device according to a third aspect of the invention, in which an uncured layer of a bonding resin is left between the first substrate and the second substrate in a region where the functional region is formed in bonding the first substrate and the second substrate, and the unnecessary part of the first substrate opposite to the functional region is removed by the uncured layer. In order to leave the uncured layer of the bonding resin between the first substrate and the second substrate, for example the photo-curing bonding resin such as a ultraviolet-curing resin is applied between the first and second substrates, then, the region which is left as the uncured layer may be covered with a mask, and the bonding resin may be irradiated with the light or an electron beam to partly cure the bonding resin.

In the above-described manufacturing method of the optical waveguide device according to the third aspect of the invention, in bonding the first substrate and the second substrate, the bonding resin is left at the uncured state in the region corresponding to the unnecessary part of the first substrate by partly curing the bonding resin, so that the unnecessary part can be simply removed to expose the functional region without injuring the functional region only by cutting off a periphery of the unnecessary part of the first substrate.

A manufacturing method of an optical waveguide device according to a forth aspect of the invention, in which a layer having low adhesive properties is formed in the unnecessary part of the first substrate opposite to the functional region or the region of the second substrate opposite to the unnecessary part before bonding the first substrate and the second substrate, and the unnecessary part of the first substrate opposite to the functional region is removed by the layer having low adhesive properties. At this point, the layer having low adhesive properties is not limited in particular, and the layer having the low adhesive properties may be the layer made of a metal film such as Ni or Au, an oxide film such as $SiO_2$, or fluororesin such as PTFE, which is difficult material to be bonded by the bonding resin used, the layer having the bad adhesive properties with the substrate, or the layers in which the layers having the bad adhesive properties with each other are laminated.

In the above-described manufacturing method of the optical waveguide device according to the forth aspect of the invention, before the first substrate and the second substrate are bonded with the bonding resin, the layer having low adhesive properties is formed at the position corresponding to the unnecessary part of the first substrate in the first substrate or the second substrate, so that the unnecessary part can be removed to expose the functional region without injuring the functional region only by cutting off the periphery of the unnecessary part of the first substrate.

A manufacturing method of an optical waveguide device according to a fifth aspect of the invention, in which a boundary between the region to be removed in the first substrate and the region to be left is cut off by dicing to remove the unnecessary part of the first substrate, so that the unnecessary part of the first substrate can be easily removed. Particularly in the case that the plurality of optical waveguide devices are simultaneously produced, the process for removing the unnecessary part of the first substrate and the process for separating the first and second substrates into the individual optical waveguide devices can be performed at the same time and the manufacturing process of the optical waveguide device can be simplified.

A manufacturing method of an optical waveguide device according to a sixth aspect of the invention, including the steps of forming a first substrate by providing an optical waveguide region, which includes a core transmitting light and a cladding surrounding the core, on a substrate which transmits light, bonding the first substrate to a second substrate which does not sufficiently transmit the light, and removing the substrate which transmits light. In the above-described manufacturing method of the optical waveguide device according to the sixth aspect of the invention, the substrate which transmits the light is removed, so that the optical waveguide device can be thinned.

A manufacturing method of an optical waveguide device according to a seventh aspect of the invention, including the steps of forming a first substrate by providing an optical waveguide region, which includes a core transmitting light and a cladding surrounding the core, on a substrate which transmits light, bonding the first substrate to a second substrate, which has a functional region and does not sufficiently transmit the light, over almost a whole surface, opposing at least a part of the functional region to an outside of the optical waveguide region in the first substrate, removing the substrate which transmits the light, and removing an unnecessary part of the first substrate opposite to the functional region.

In the above-described manufacturing method of the optical waveguide device according to the seventh aspect of the invention, even if the first substrate and the second substrate have been bonded over almost the whole surface, by removing the unnecessary part opposite to the region in which the functional region is formed in the first substrate, the functional region of the second substrate can be exposed and the predetermined element or component can be mounted on the functional region. Accordingly, in bonding the first substrate and the second substrate, it is not necessary to apply the bonding resin onto the predetermined pattern except the unnecessary part of the first substrate, the bonding process of the first and second substrates can be simplified, and the manufacturing process of the optical waveguide device can be also simplified. Further, in the above-described manufacturing method of the optical waveguide device according to the seventh aspect of the invention, the substrate which transmits the light is removed, so that the optical waveguide device can be thinned.

In a manufacturing method of an optical waveguide device according to the invention according to the eighth aspect of the invention, in which the substrate transmitting the light on the sixth aspect or seventh aspect is removed by peeling off the substrate. In the above-described manufacturing method of the optical waveguide device according to the eighth aspect of the invention, the substrate transmitting the light is removed by peeling off the substrate, so that the substrate transmitting the light can be re-used and the cost of the manufacturing can be reduced.

A manufacturing method of an optical waveguide device according to a ninth aspect of the invention, further including a step of forming the optical waveguide region on the sixth aspect or seventh aspect in such a manner that a stamper is pressed to a photo-curing resin to transfer a shape of the stamper to the photo-curing resin and the photo-curing resin is irradiated with the light to cure the photo-curing resin. In the above-described manufacturing method of the optical waveguide device according to the ninth aspect of the invention, it is not necessary to take the time for heating in the case of the use of a thermal-curing resin, and the productivity of the optical waveguide region having the minute core can be increased.

A manufacturing method of an optical waveguide device according to a tenth aspect of the invention, in which a groove is formed in the first substrate so as to separate the core after removing the substrate which transmits the light, and a filter is inserted the groove. In the above-described manufacturing method of the optical waveguide device according to the tenth aspect of the invention, since the groove for the filter is provided after the excess substrate is removed, it is not necessary to provide the groove for the filter in the substrate transmitting the light, a blade can be prevented from cracking by the substrate transmitting the light in providing the groove with a dicing blade. Further, only the groove may be provided in the cladding or the like, so that the thinner groove can be formed.

A manufacturing method of an optical waveguide device according to the eleventh aspect of the invention, in which the first substrate and the second substrate are bonded with a bonding resin having almost the same refractive index as that of the cladding. In the above-described manufacturing method of the optical waveguide device according to the eleventh aspect of the invention, since the first substrate having the core and the cladding and the second substrate are bonded with the bonding resin having almost the same refractive index as that of the cladding, the bonding resin functions as the cladding after the optical waveguide device is completed.

According to the manufacturing method of the optical waveguide device according to the invention, the optical waveguide device can be produced. In the optical waveguide device, when the cross section of the core is formed in almost trapezoid-shaped, mold release characteristics can be held at good conditions in molding the core groove. Further, the optical waveguide device which is produced by the manufacturing method according to the invention can be used as the optical communication apparatus.

The above-described constituent components of the invention may be optionally combined as many as possible.

BRIEF DESCRIPTION OF THE DRAWINGS

FIGS. 32A and 32B show continued views of FIG. 31.

DETAILED DESCRIPTION OF THE INVENTION

First Embodiment

Figure 1:
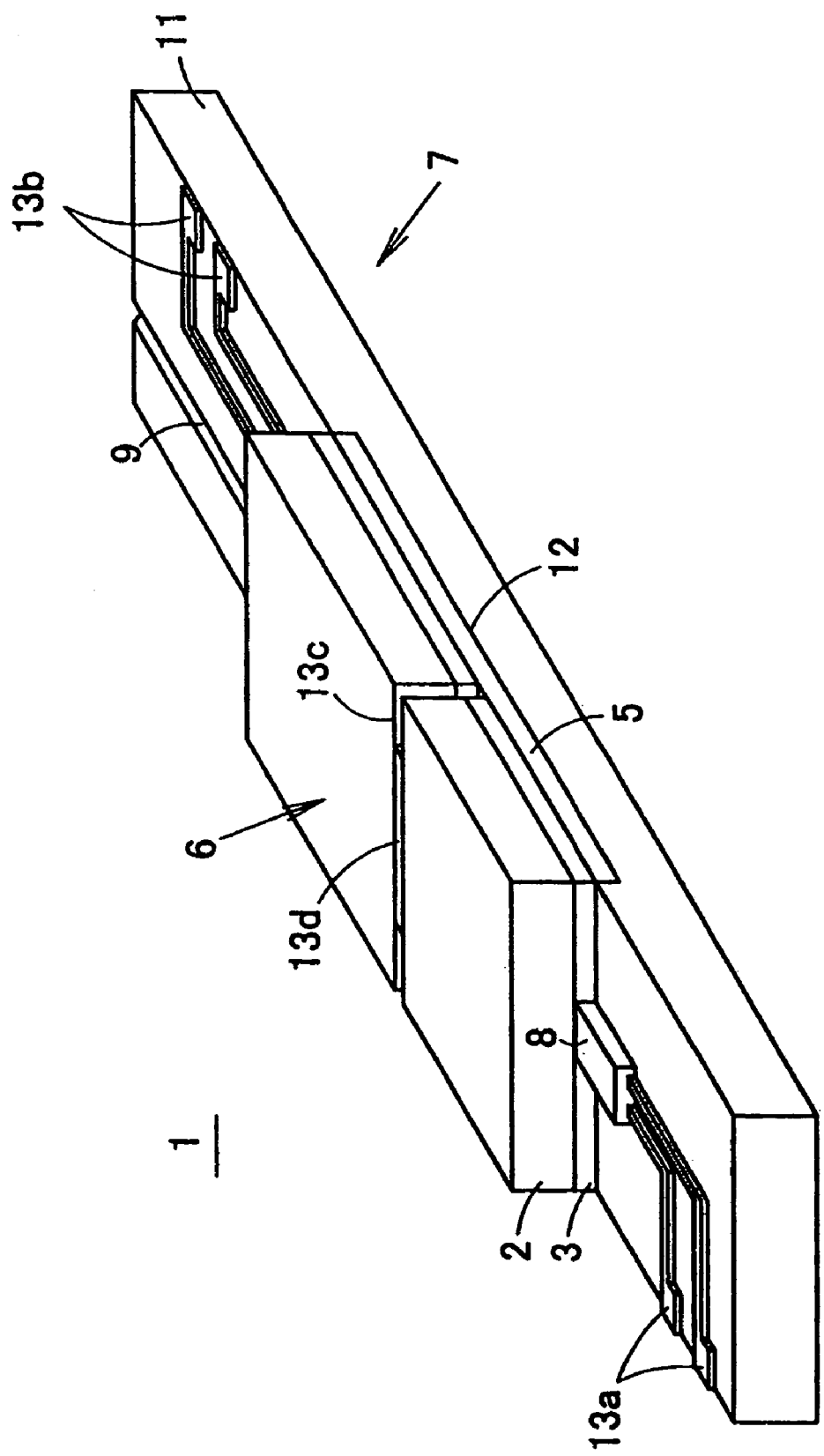
FIG. 1 shows a schematically perspective view of an optical waveguide device of the related art.
Figure 2:
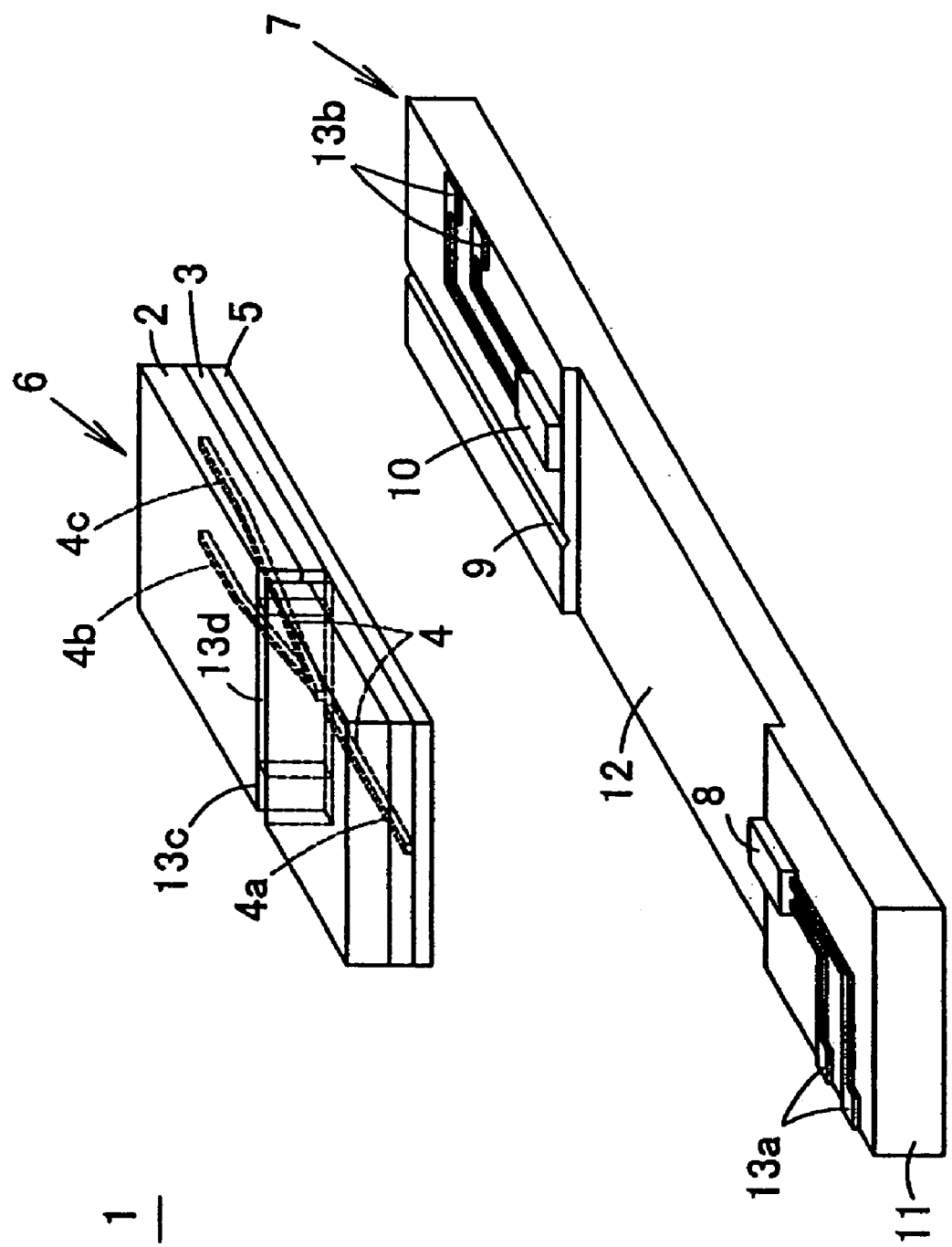
FIG. 2 shows a schematically exploded perspective view of the optical waveguide device shown in FIG. 1.
Figure 3:
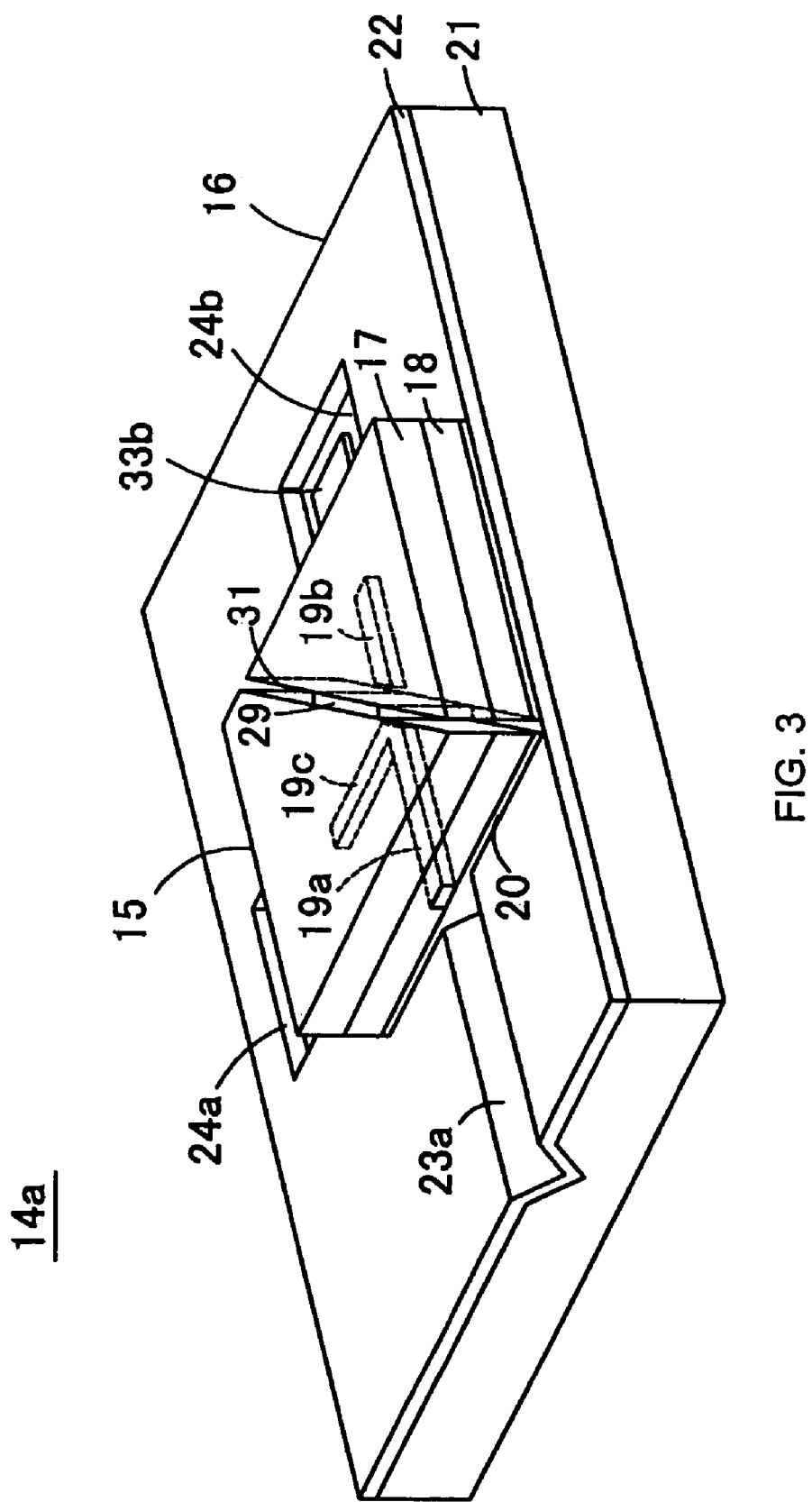
FIG. 3 shows a schematically perspective view of the optical waveguide device according to an embodiment of the invention.
Figure 4:
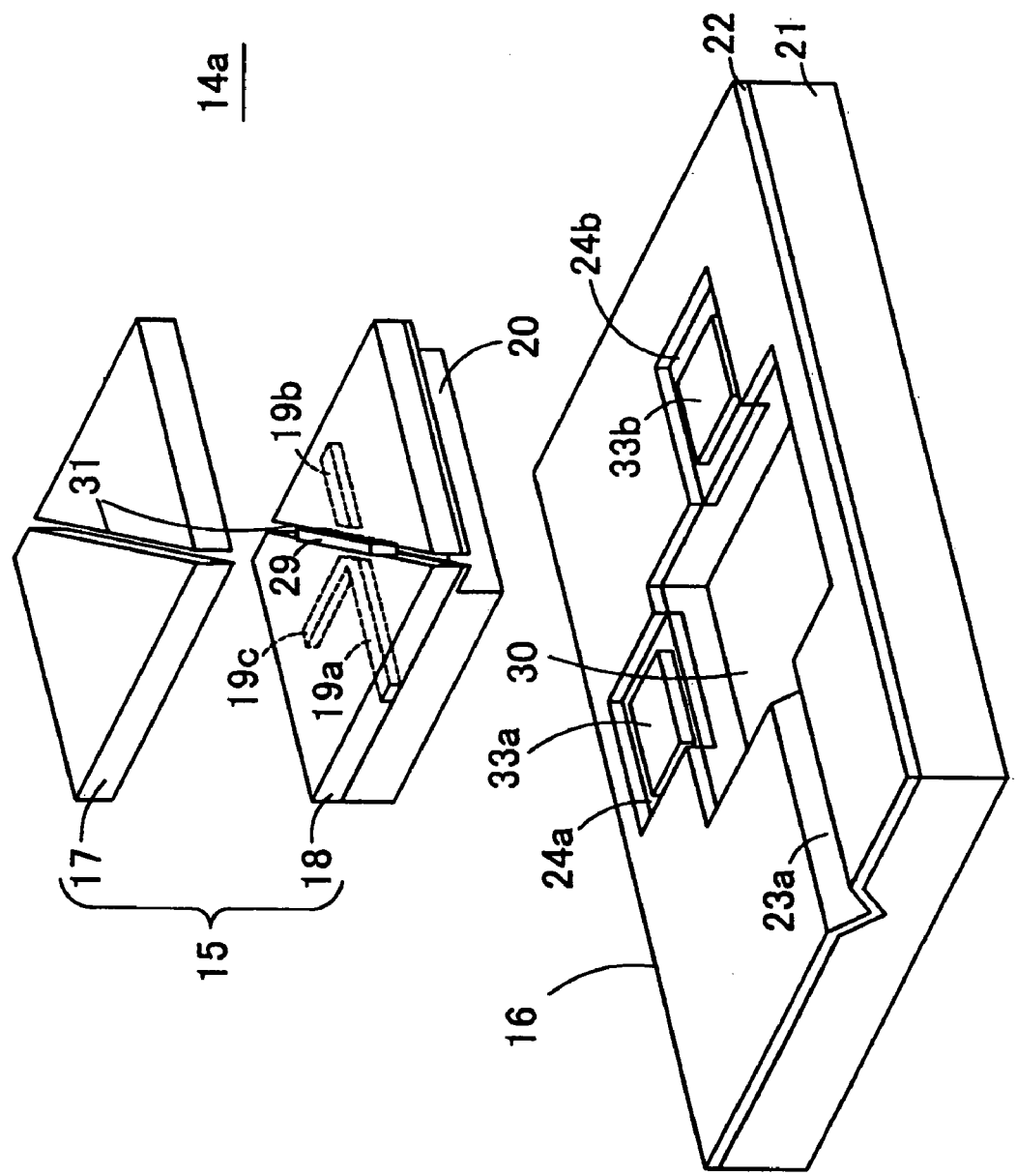
FIG. 4 shows a schematically exploded view of the optical waveguide device shown in FIG. 3.

FIG. 3 shows the schematically perspective view of an optical waveguide device 14a according to an embodiment of the invention. FIG. 4 shows the schematically exploded perspective view of it. The optical waveguide device 14a of this embodiment includes a substrate for mounting 16 and an optical waveguide substrate 15. The optical waveguide substrate 15 includes a cover glass 17, a lower cladding layer 18 which is made of an optical material having high refractive index, cores 19a, 19b, and 19c which are made of the optical material having the refractive index higher than that of the lower cladding layer 18 and transmit the light, a filter 29, and an upper cladding layer 20 which is made of the same optical material for the lower cladding layer 18. The filter 29 is an optical element which transmits only the light having a specific wavelength range but reflects the light having the wavelength range except the specific wavelength range. The filter 29 is placed inside a filter placing groove 31. The cores 19a and 19b embedded in the lower cladding layer 18 are arranged in line, the filter 29 is inserted in the filter placing groove 31 so as to partition the cores 19a and 19b and to be disposed at a 45° angle relative to an optical axis of the cores 19a and 19b, and the core 19c is arranged on a side face of the filter 29 so as to be disposed at a 90° angle relative to the optical axis of the cores 19a and 19b.

In the substrate for mounting 16, a waveguide fixing region 30 for laminating the waveguide substrate 15 is formed on a surface of a supporting substrate 21, a V groove-shaped optical fiber guide 23a and concave optical element placing portions 24a and 24b are provided on a periphery of the waveguide fixing region 30. The upper surface of the supporting substrate 21 except the waveguide fixing region 30 is thoroughly covered with a metallic thin film 22 such as Ni or Au. In the case that the supporting substrate 21 is made of a silicon substrate, the metallic thin film 22 may be formed onto a $SiO_2$ film which is formed by oxidizing the surface of the supporting substrate 21. Element mounting benches (electrode pads) 33a and 33b for mounting a light receiving element or a light emitting element are formed in each optical element placing portions 24a and 24b.

In the optical waveguide device 14a assembled as shown in FIG. 3, the optical waveguide substrate 15 is placed while the optical waveguide substrate 15 is vertically turned the other way round, the optical fiber guide 23a and the element mounting benches 33a and 33b are exposed from the optical waveguide substrate 15.

Figure 5:
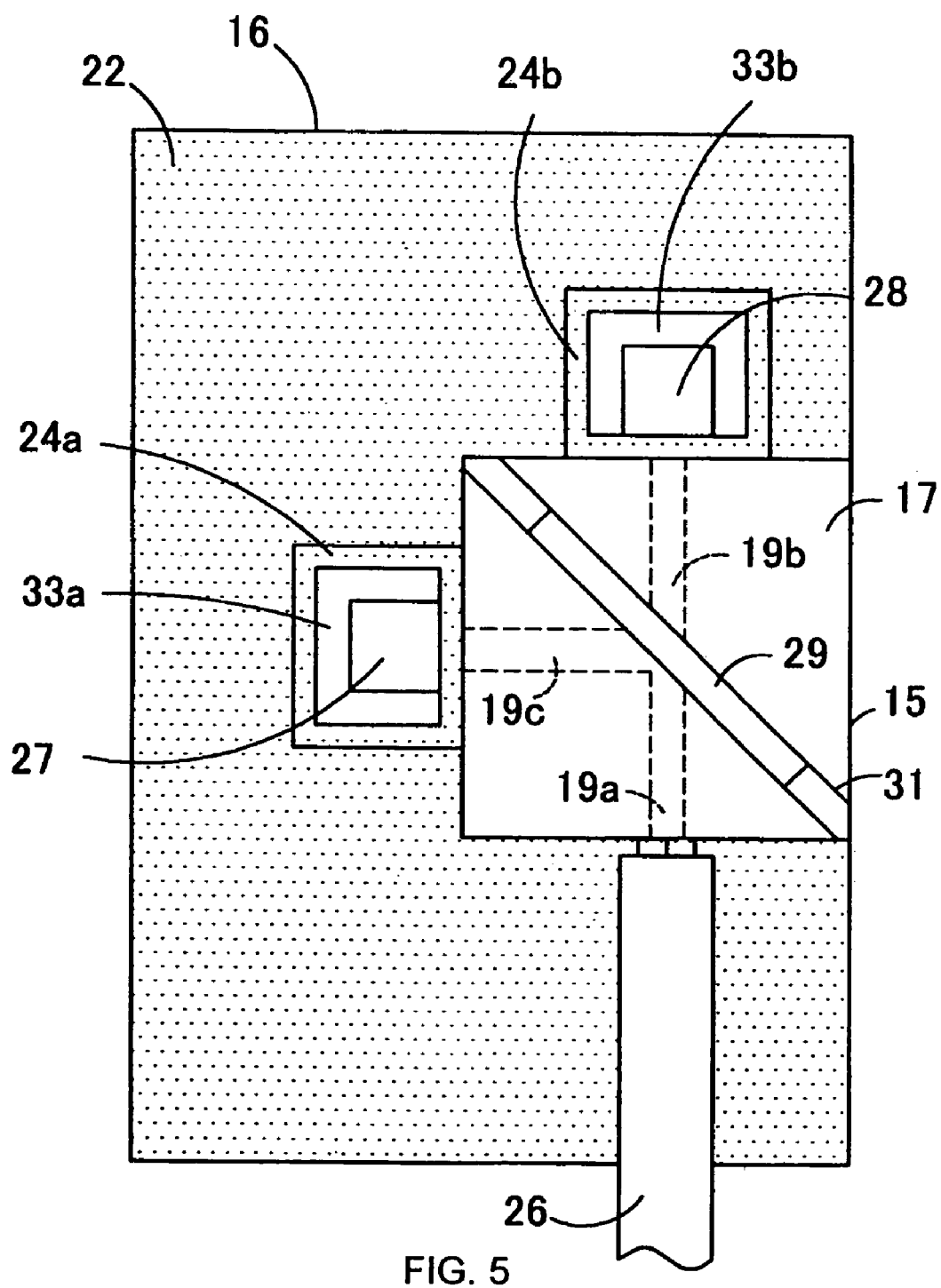
FIG. 5 shows a schematically plane view illustrating a using mode of the optical waveguide device shown in FIG. 3.

FIG. 5 is a plane view showing a state in which the optical transceiver is constituted by mounting a light emitting element 28 and a light receiving element 27 on the optical waveguide device 14a and connecting an optical fiber 26. The light receiving element 27 and the light emitting element 28 are mounted respectively on the element mounting benches 33a and 33b in the optical element placing portions 24a and 24b by die-bonding a lower surface electrode. The light receiving element 27 is opposed to an end face of the core 19c and the light emitting element 28 is opposed to the end face of the core 19b. The upper surface electrodes of the light emitting element 28 and the light receiving element 27 are connected to a circuit board or the like with a bonding wire. In this state, though the element mounting bench 33a is electrically connected to the element mounting bench 33b with the metallic thin film 22, there is no problem in the case that the sides of the element mounting benches 33a and 33b become ground electrodes. In the case that it is inconvenient that the element mounting bench 33a is electrically connected to the element mounting bench 33b, the metallic thin film 22 may be electrically separated by cutting the metallic thin film 22, with a dicing blade between the element mounting benches 33a and 33b. The optical fiber 26 is fixed with a bonding agent while the optical fiber 26 is contained in the optical fiber guide 23a to be positioned. Consequently, the optical axes of the core 19a and the optical fiber 26 are automatically aligned.

In the optical waveguide device 14a, the filter 29 is used one having characteristics which transmit the light having the wavelength outgoing from the light emitting element 28 and reflect the light having the wavelength outgoing from the optical fiber 26. Accordingly, when the light emitting element 28 emits the light to the core 19b, the emitted light propagates through the core 19b, transmits through the filter 29, propagates through the core 19a, and is incident to the optical fiber 26 to be transmitted through the optical fiber 26. The light (receiving signal) propagating through the optical fiber 26 is incident to the core 19a and reflected by the filter 29, and then the light propagates through the core 19c to be received by the light receiving element 27. Thus, the optical waveguide device 14a can perform the transmission and reception of the signal with an external other device connected through the optical fiber.

As described above, the optical waveguide device 14a can be utilized as the optical transceiver for transmitting and receiving the signal. For example, like a personal computer connected to the Internet, the optical waveguide device 14a is used inside the apparatus which receives the signal from the outside and transmits the signal to the outside.

Figure 6:
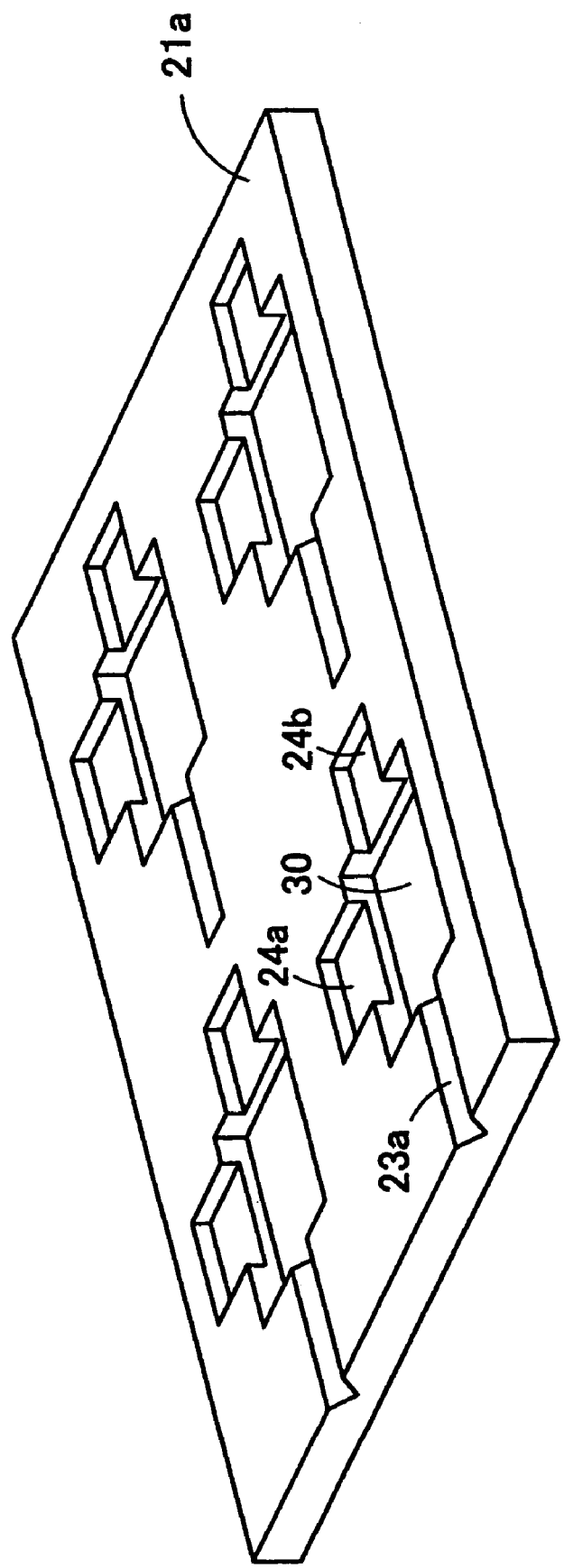
FIG. 6 shows a view explaining a manufacturing method of the optical waveguide device of the invention.

The manufacturing method of the optical waveguide device 14a will be described below referring to FIGS. 6 to 13. The surface of a silicon substrate (wafer) 21a which is a mother board of the supporting substrate 21 is etched, plural sets of the waveguide fixing region 30, the optical element placing portions 24a and 24b, and the optical fiber guide 23a are formed as shown in FIG. 6. Though the four substrates for mounting 16 can be made at once when the silicon substrate 21a of FIG. 6 is used, mass production of the substrate for mounting 16, i.e. the optical waveguide device 14a can be realized when the silicon substrate 21a having the larger area is used.

Figure 7:
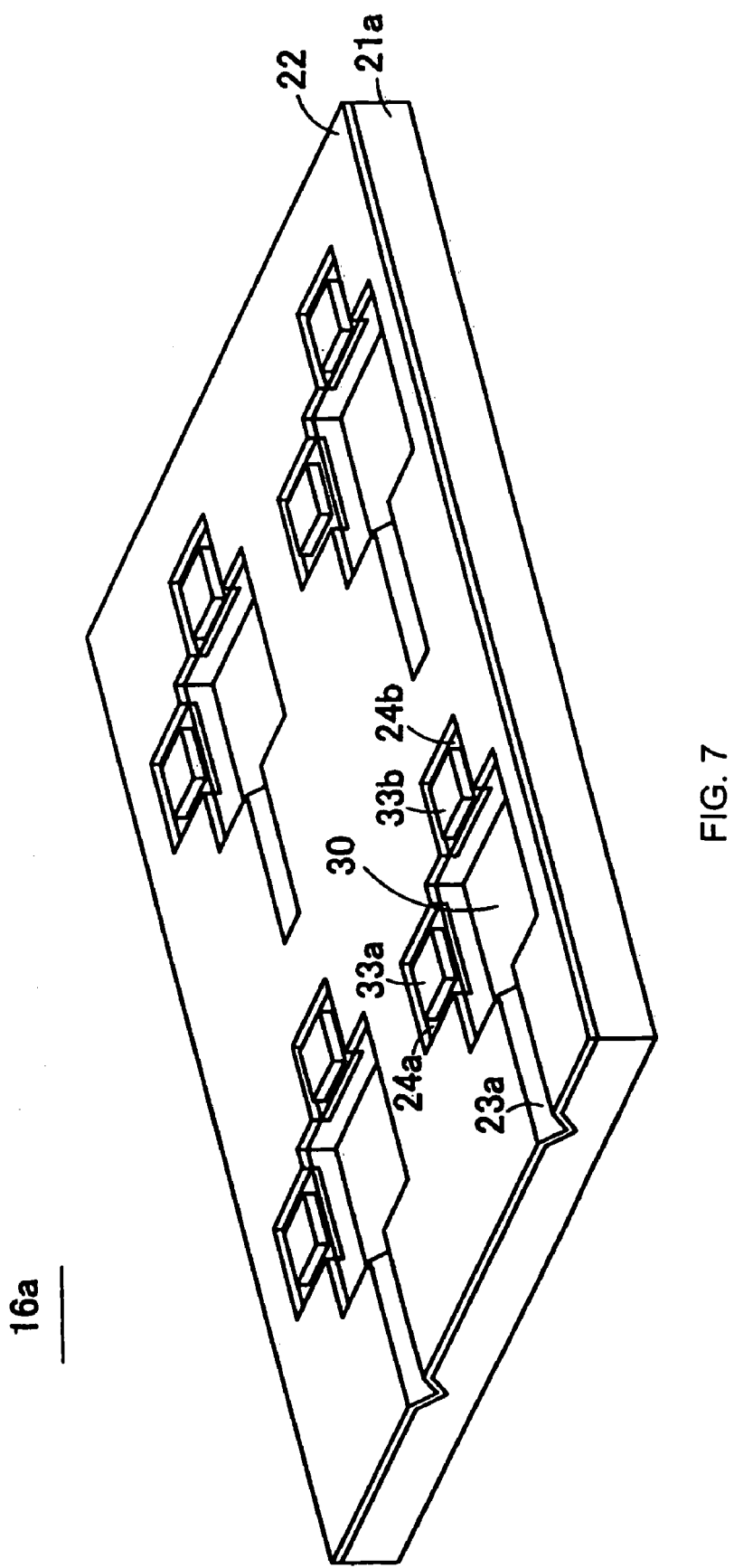
FIG. 7 shows a continued view of FIG. 6.

As shown in FIG. 7, the metallic thin film 22 is formed on the region except the waveguide fixing region 30 on the surface of the silicon substrate 21a by evaporating or sputtering the metal such as Ni or Au. Further, in the optical element placing portions 24a and 24b, the element mounting benches 33a and 33b are formed on the metallic thin film 22 by an electrode material respectively. Hereinafter, the silicon substrate 21a on which the metallic thin film 22 is formed is referred to as a base substrate 16a.

Figure 8:
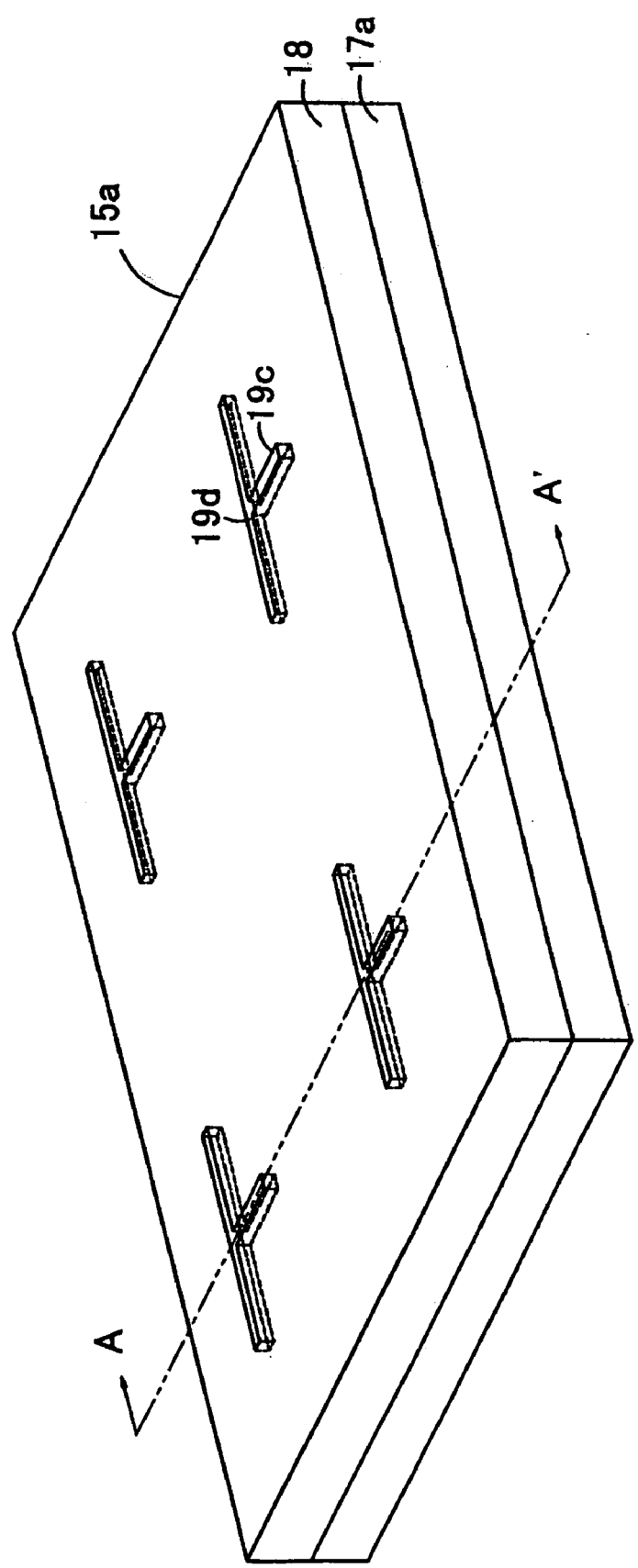
FIG. 8 shows a continued view of FIG. 7.

On the other hand, by using a glass substrate 17a having the area not lower than that of the silicon substrate 21a, the mother board (optical waveguide mother board 15a) of the optical waveguide substrate 15a including the lower cladding layer 18 and cores 19c and 19d, shown in FIG. 8, is formed by adopting a duplicating method (stamper method). The glass substrate (wafer) 17a is the motherboard of the cover glass 17 of the optical waveguide device 14a.

Figure 9:
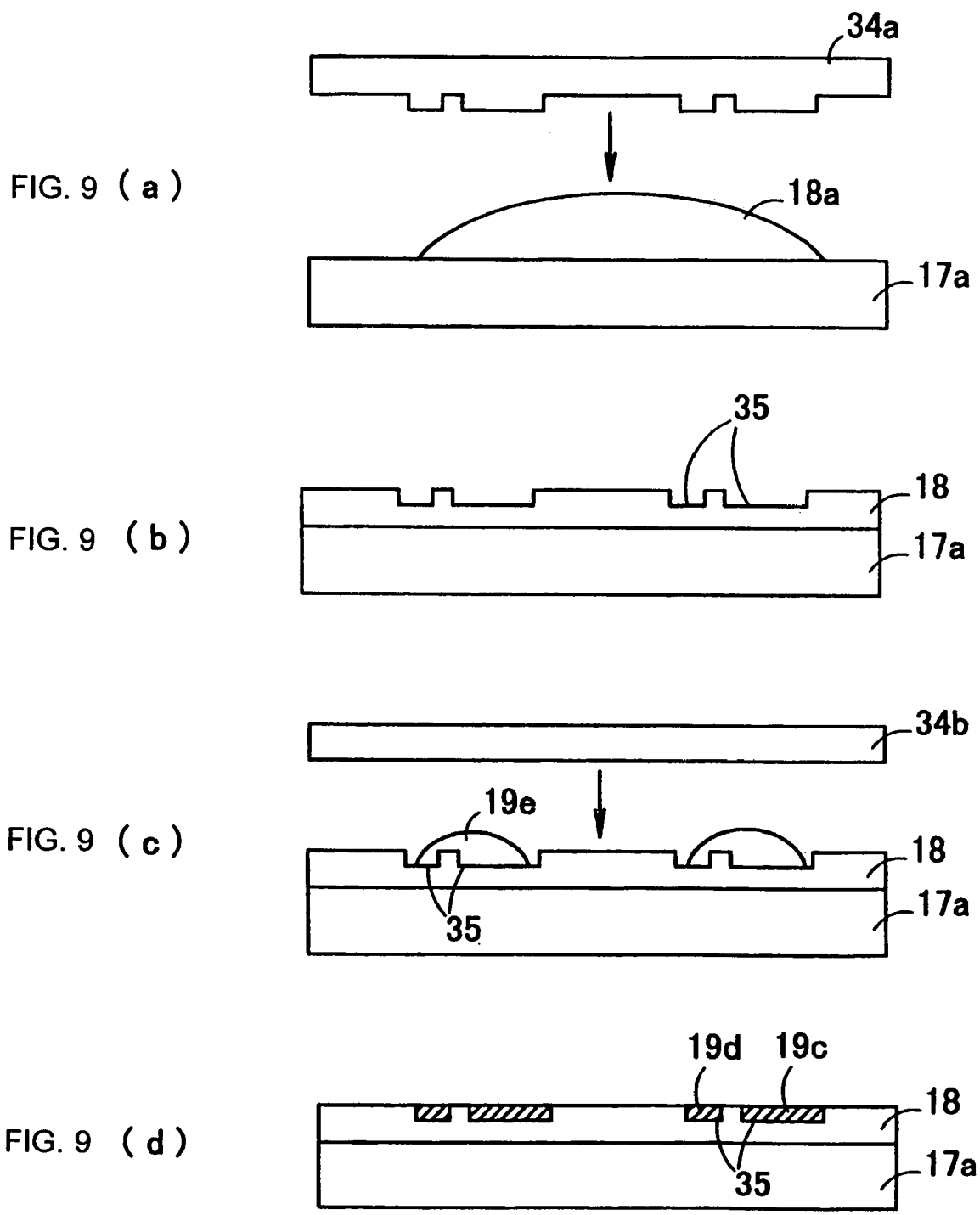
FIGS. 9A to 9D show sectional views taken on line A–A' of FIG. 8, which explains a process to a manufacturing process of a core.

The duplicating method (stamper method) using an ultraviolet-curing resin will be briefly described referring to FIG. 9. FIGS. 9A to 9D show the face corresponding to the cross section taken on line A–A' of FIG. 8. As shown in FIG. 9A, an uncured ultraviolet-curing resin (lower cladding resin) 18a is put onto the glass substrate 17a, the surface of the uncured ultraviolet-curing resin 18a is pressed with a stamper (mold) 34a having the pattern of the same shape for the cores 19c and 19d to form a core groove 35, and then the lower cladding layer 18 having the core groove 35, as shown in FIG. 9B, is formed in such a manner that the ultraviolet-curing resin 18a is irradiated with the ultraviolet ray to cure the ultraviolet-curing resin 18a.

An uncured ultraviolet-curing resin (core resin) 19e having the refractive index larger than that of the lower cladding layer 18 is put into the inside of the core groove 35 formed in the lower cladding layer 18 and is pressed with a stamper 34b in order to flatten the surface of the lower cladding layer 18 and thin a thickness of a flash formed on the surface of the lower cladding layer 18 by the ultraviolet-curing resin 19e overflowing the core groove 35, and then, as shown in FIG. 9D, the cores 19c and 19d are formed in the core groove 35 in such a manner that the ultraviolet-curing resin 19e is irradiated with the ultraviolet ray to cure the ultraviolet-curing resin 19e.

Figure 10:
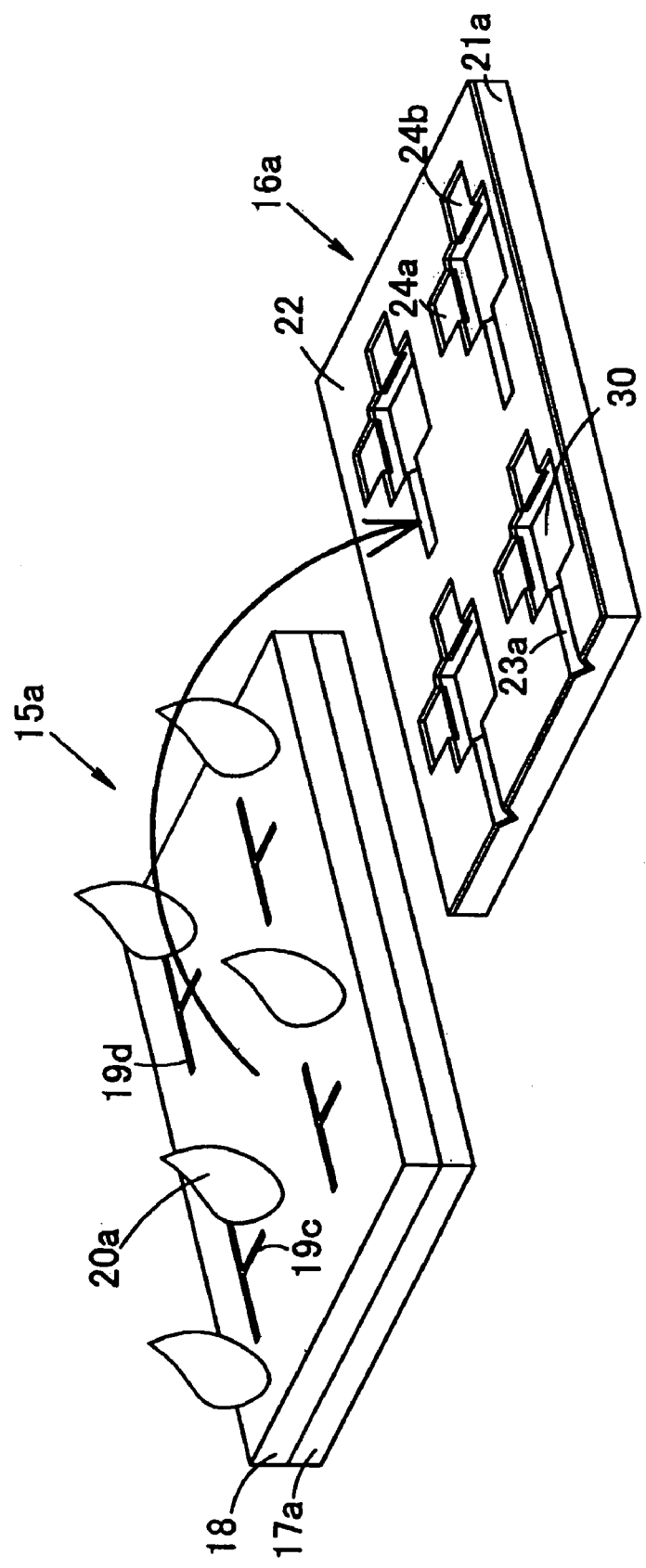
FIG. 10 shows a continued view of FIG. 8.

As shown in FIG. 10, an uncured resin 20a is put onto the surface of the optical waveguide mother board 15a, and the optical waveguide mother board 15a and the base substrate 16a are bonded with the resin 20a. Since the resin 20a becomes the upper cladding layer 20 when the resin 20a is cured, it is desirable that the resin 20a is the same ultraviolet-curing resin as the lower cladding layer 18 or the resin having the almost same refractive index for the lower cladding layer 18, and the resin 20 has the refractive index lower than that of the cores 19c and 19d.

It is necessary to precisely align the optical fiber guide 23a, the optical element placing portions 24a and 24b, and the cores 19c and 19d, when the base substrate 16a is bonded to the optical waveguide motherboard 15a. In order to align those components, the optical waveguide mother board 15a and the base substrate 16a may be bonded in such a manner that the alignment is precisely performed with alignment marks provided in the optical waveguide mother board 15a and the base substrate 16a. If the alignment is performed with the base substrate 16a having the large area and the optical waveguide mother board 15a having the large area, a complicated procedure such as the alignment among the individual components is not required, and it is efficient because the plurality of cores are precisely aligned with the fiber guide and the like.

Figure 11:
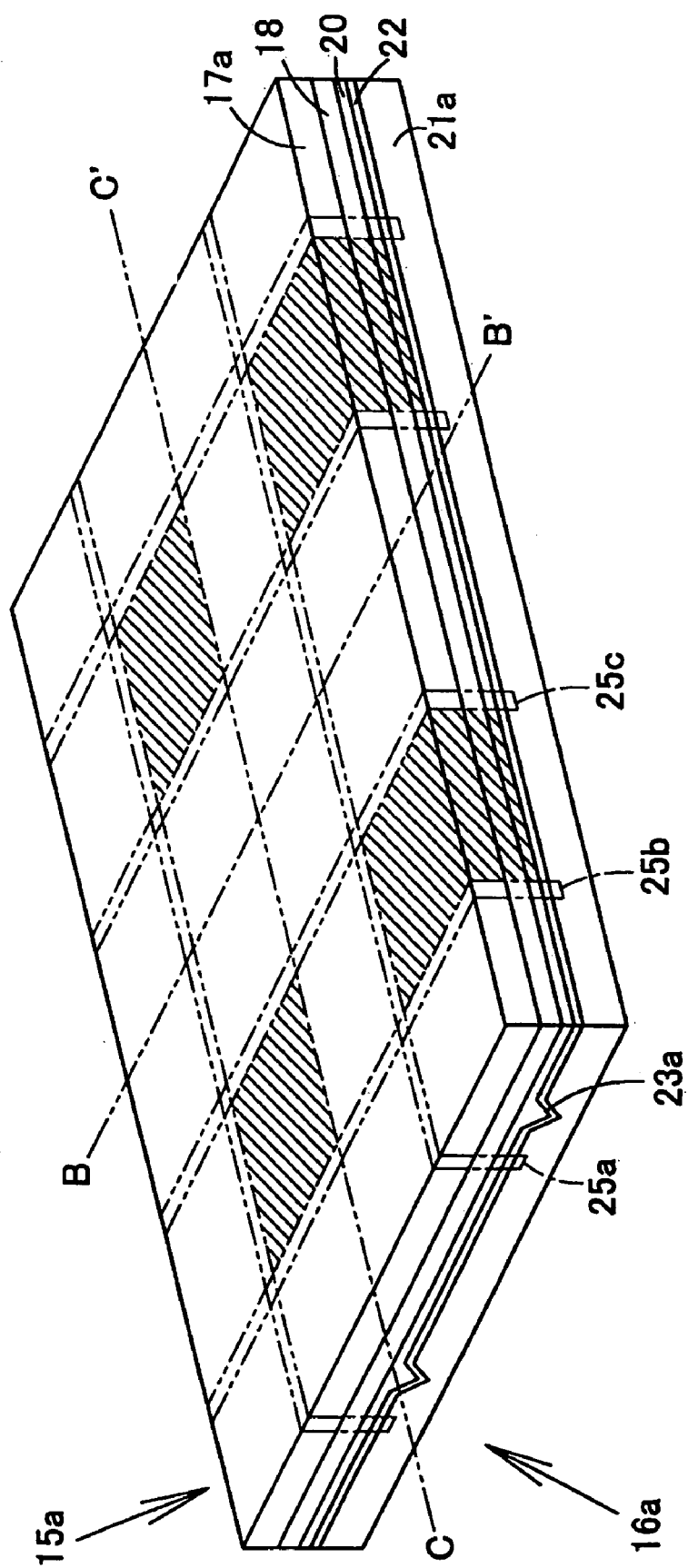
FIG. 11 shows a continued view of FIG. 10.

As shown in FIG. 11, the base substrate 16a is placed on the lower side and the optical waveguide mother board 15a is placed on the upper side, and separating grooves 25a, 25b, and 25c are formed by making a cut in the optical waveguide mother board 15a with the dicing blade so as to pass through an edge of the waveguide fixing region 30. The end face of the cores 19c and 19d are simultaneously formed by this cutting process to the separating grooves 25a, 25b, and 25c. Among the optical waveguide mother boards 15a divided by the separating grooves 25a, 25b, and 25c, because adhesion at an interface between the metallic thin film 22 and the upper cladding layer 20 is weak in the region (region outside the waveguide fixing region 30) where the metallic thin film 22 is formed on the surface of the base substrate 16a, the unnecessary part can be easily peeled off from the base substrate 16a when force is applied to an unnecessary part (region corresponding to the outside of the waveguide fixing region) from the divided optical waveguide mother board 15a. Accordingly, the optical fiber guide 23a of the base substrate 16a or the element mounting benches 33a and 33b in the optical element placing portions 24a and 24b can be exposed, while only the region in which the cores 19c and 19d are formed, shown by oblique lines in FIG. 11, remains. Each end face of the cores 19c and 19d is exposed on the surface of the outer periphery of the optical waveguide motherboard 15a which remains on the base substrate 16a.

In the forming of the separating grooves 25a, 25b, and 25c by dicing the optical waveguide mother board 15a; as shown in FIG. 11, when the metallic thin film 22 is divided so that the separating grooves 25a, 25b, and 25c are diced deeper than the metallic thin film 22, the optical element placing portions 24a and 24b, i.e., the element mounting benches 33a and 33b, can be electrically insulated.

Figure 12:
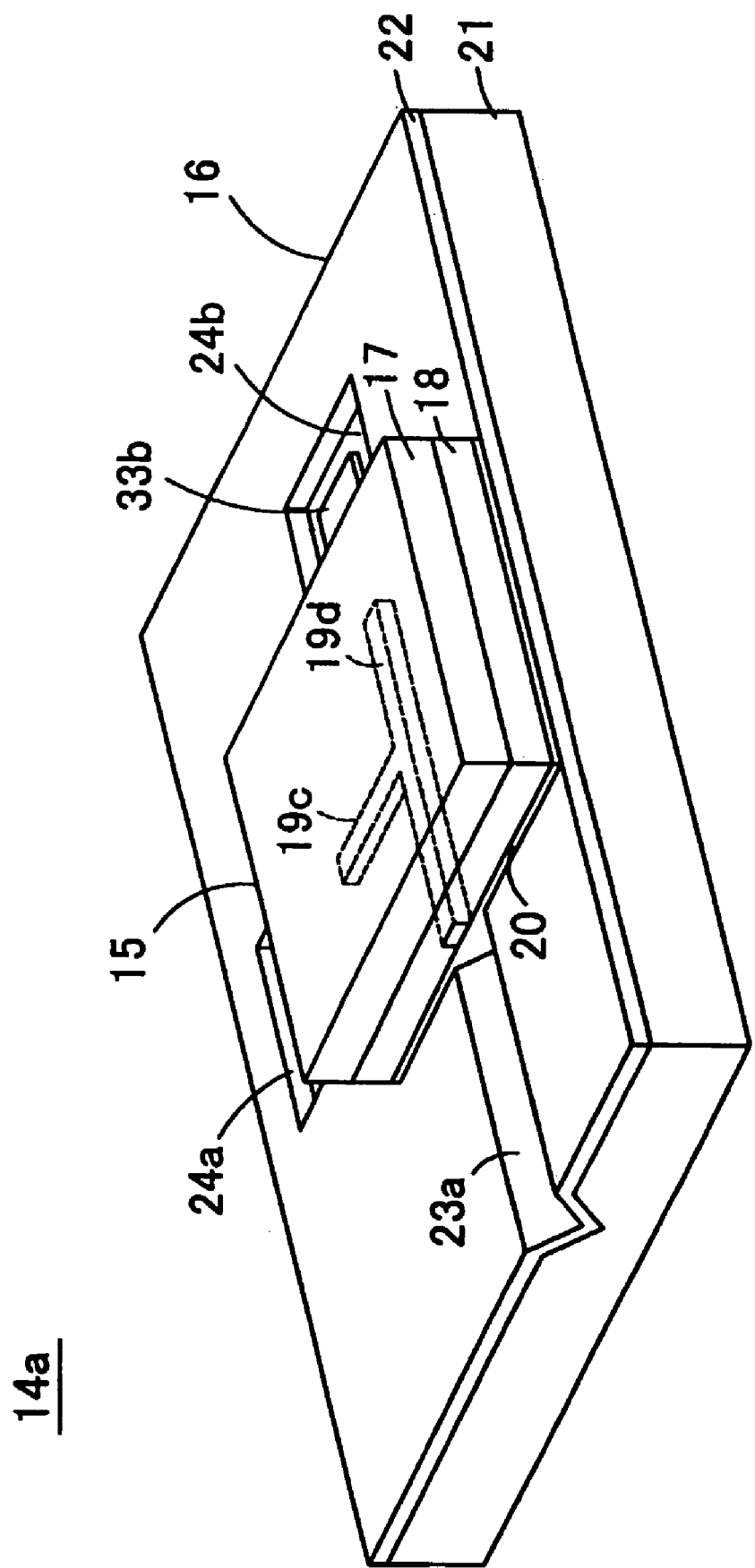
FIG. 12 shows a continued view of FIG. 11.
Figure 13:
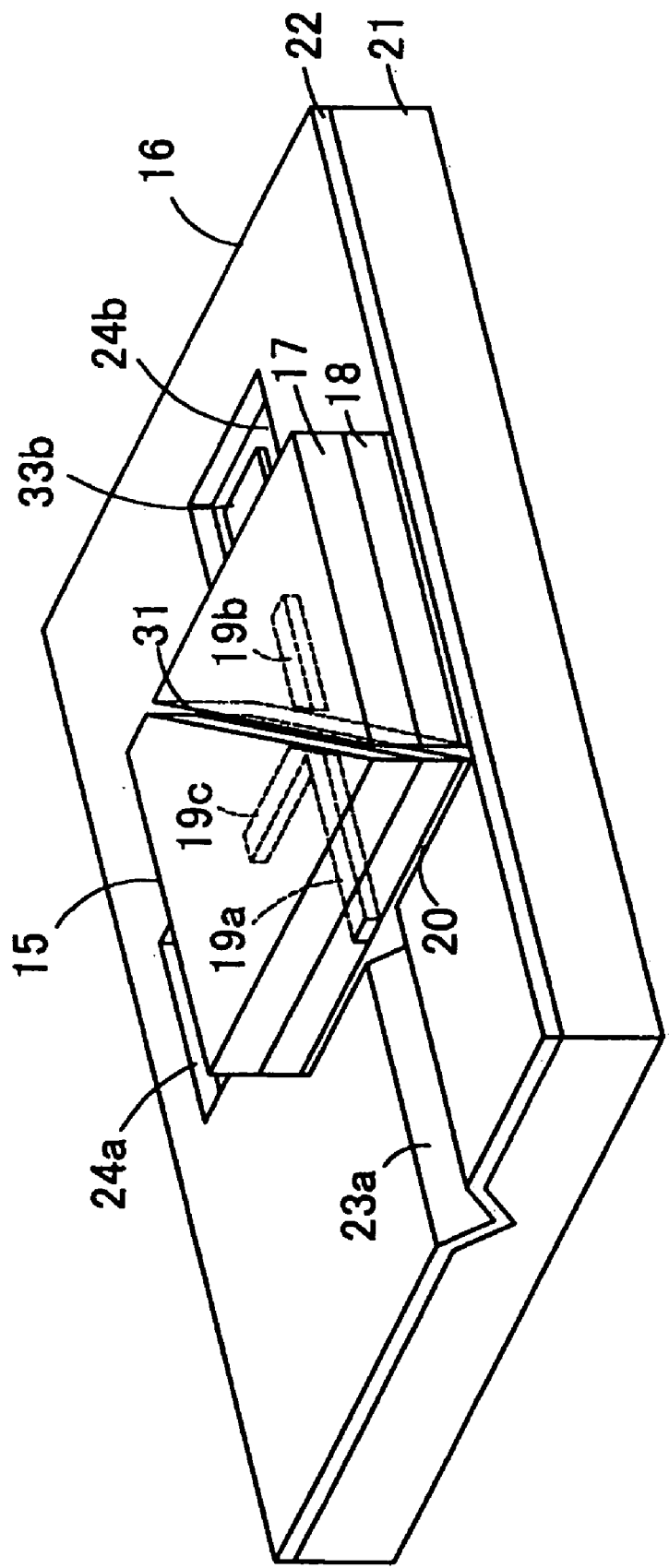
FIG. 13 shows a continued view of FIG. 12.

Then, the base substrate 16a and the optical waveguide mother board 15a are cut along line B–B' and line C–C' of FIG. 11 to divide them into chips shown in FIG. 12, and the chip in which the optical waveguide substrate 15 is joined onto the substrate for mounting 16 is obtained. At this point, if the unnecessary part of the optical waveguide mother board 15a remains, the unnecessary part should be removed. As shown in FIG. 13, the filter placing groove 31 is formed by making the cut in the cover glass 17 and the lower cladding layer 18 with the dicing blade. At this point, the core 19d is divided to form the cores 19a and 19b. Finally the optical waveguide device 14a shown in FIG. 3 is completed by fitting the filter 29 using the multilayered reflecting film in a portion between the cores 19a and 19b of the filter placing groove 31. The filter 29 may be projected from the upper surface of the cover glass 17.

In the manufacturing method of the optical waveguide device of the embodiment, the optical waveguide mother board 15a having the large area and the base substrate 16a having the large area are bonded with the upper cladding layer 20 and it is divided into the individual chip of the optical waveguide device 14a in the final process, so that the optical waveguide device 14a can be efficiently manufactured compared with the bonding of the individual optical waveguide substrate 15 and the individual substrate for mounting 16 and the manufacturing method of the embodiment is fit to the mass production. Further, since the base substrate 16a and the optical waveguide mother board 15a having the large area having the large area are bonded, the alignment can be performed more precisely compared with the alignment between the small components.

In the optical waveguide device 14a, it is necessary to expose finally the optical fiber guide 23a and the optical element placing portions 24a and 24b. In the manufacturing method of the optical waveguide device of the embodiment, since the adhesion of the bonding resin 20a (upper cladding layer 20) is weakened by previously forming the metallic thin film 22 on the base substrate 16a in the region corresponding to the unnecessary part of the optical waveguide mother board 15a, even if all the surfaces of the optical waveguide mother board 15a and the base substrate 16a are bonded, the unnecessary part of the optical waveguide mother board 15a can be easily removed and the manufacturing process can be further simplified.

In the embodiment, though the waveguide fixing region 30 is exposed from the metallic thin film 22, the metallic thin film 22 may be also formed on the surface of the waveguide fixing region 30. Though the unnecessary part of the optical waveguide mother board 15a can be easily removed from the metallic thin film 22 by applying force, since the bonding state between the unnecessary part and the supporting substrate 21 are held in the optical waveguide substrate 15 in which the cores 19a, 19b, and 19c and the like are formed unless the peeling-off is performed by applying the force, the unnecessary part does not become an obstacle.

Second Embodiment

Figure 14:
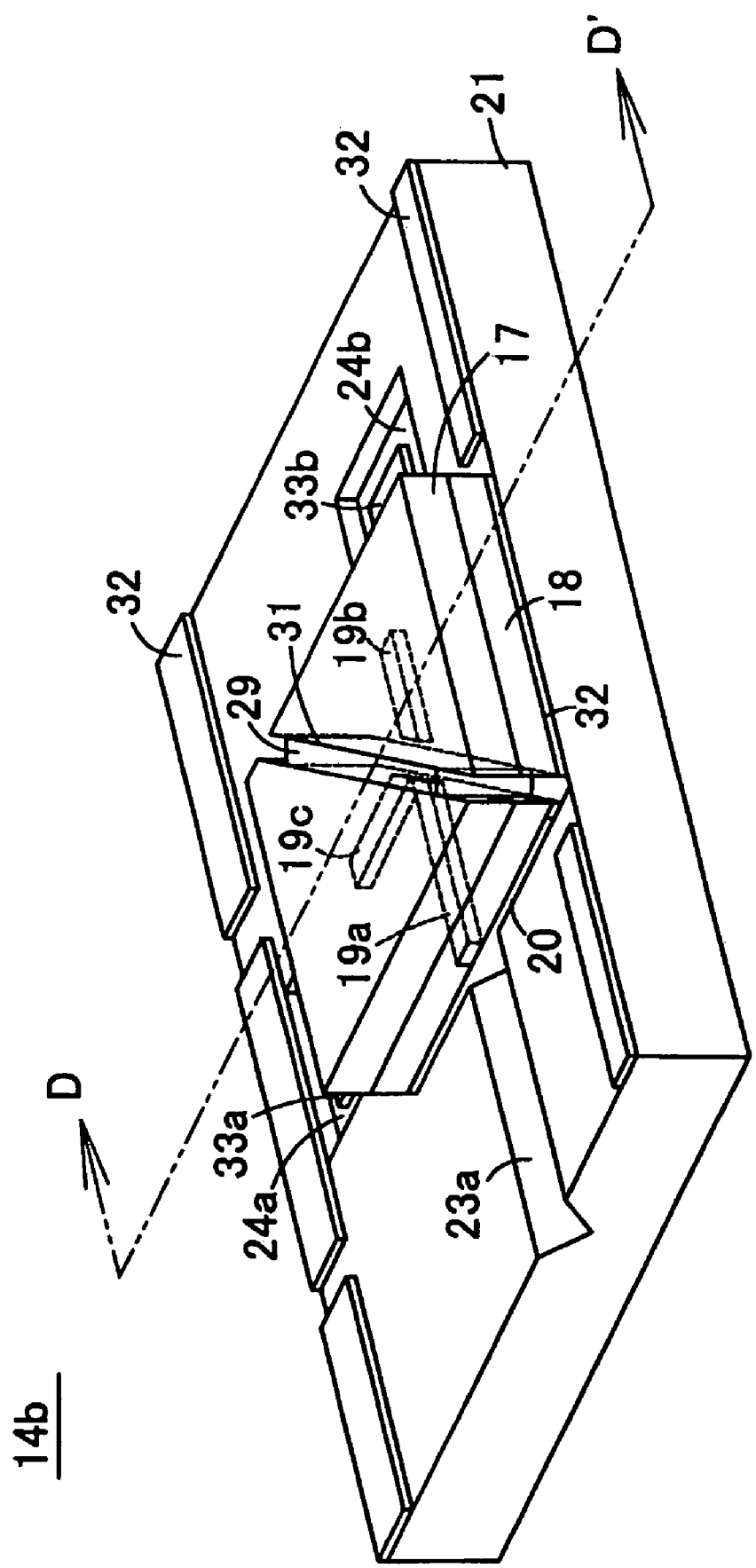
FIG. 14 shows a schematically perspective view of the optical waveguide device according to another embodiment of the invention.

FIG. 14 shows the schematically perspective view of an optical waveguide device 14b according to another embodiment of the invention. The optical waveguide device 14b of the embodiment includes the supporting substrate 21, the element mounting benches 33a and 33b, a spacer 32, the upper cladding layer 20, the cores 19a, 19b and 19c, the filter 29, the lower cladding layer 18, and the cover glass 17. The cores 19a and 19b are arranged in line, and the core 19c is arranged at a 90° angle relative to the optical axis of the cores 19a and 19b. The filter 29 is the optical element having characteristics which transmit the light having the specific wavelength range and reflect the light having the wavelengths except the specific one. The filter 29 is inserted into the filter placing groove 31, which is formed at a 45° angle relative to the optical axis so as to partition the cores 19a and 19b.

The optical fiber guide 23a, the optical element placing portions 24a and 24b, and the waveguide fixing region 30 are embedded in the surface of the supporting substrate 21. The V-shaped optical fiber guide 23a is designed so that the optical axes of the core 19a and the optical fiber are automatically aligned when the optical fiber is placed on the optical fiber guide 23a. In the element mounting benches 33a and 33b provided in the concave optical element placing portions 24a and 24b, the light emitting element or the light receiving element which is connected to the cores 19b and 19c is placed to connect the external power supply.

In the manufacturing of the optical waveguide device of the invention, because almost all of the manufacturing processes are the same for the optical waveguide device described in the first embodiment, the processes different from the first embodiment will be mainly described below.

Figure 15:
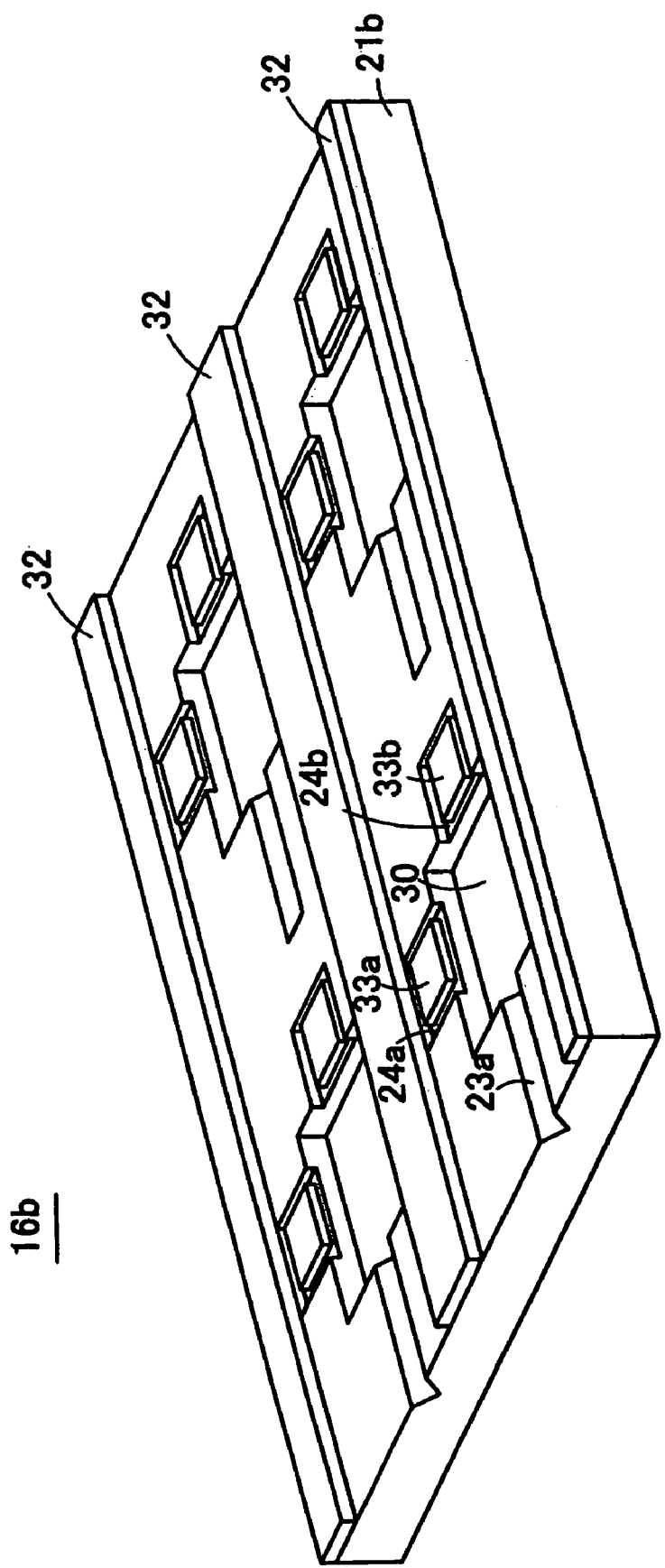
FIG. 15 shows a schematically perspective view of a supporting substrate which is used for manufacturing the optical waveguide device shown in FIG. 14.

As shown in FIG. 15, the metal is deposited on a silicon substrate 21b in which the waveguide fixing region 30, the optical element placing portions 24a and 24b, and the optical fiber guide 23a are formed by the etching to form the spacer 32 and the element mounting benches 33a and 33b, and this is used as a base substrate 16b. As shown in FIG. 8, the optical waveguide mother board 15a includes the glass substrate 17a, the lower cladding layer 18, and the cores 19c and 19d, and the optical waveguide mother board 15a is formed by the duplicating method (stamper method) as described in the first embodiment. In bonding the base substrate 16b and the optical waveguide mother board 15a together with the uncured ultraviolet-curing resin 20a which will be the upper cladding layer 20, as described below, the resin 20a remains at uncured state in the region corresponding to the unnecessary part of the optical waveguide mother board 15a and the ultraviolet-curing resin 20a is cured only in the remaining region.

Figure 16:
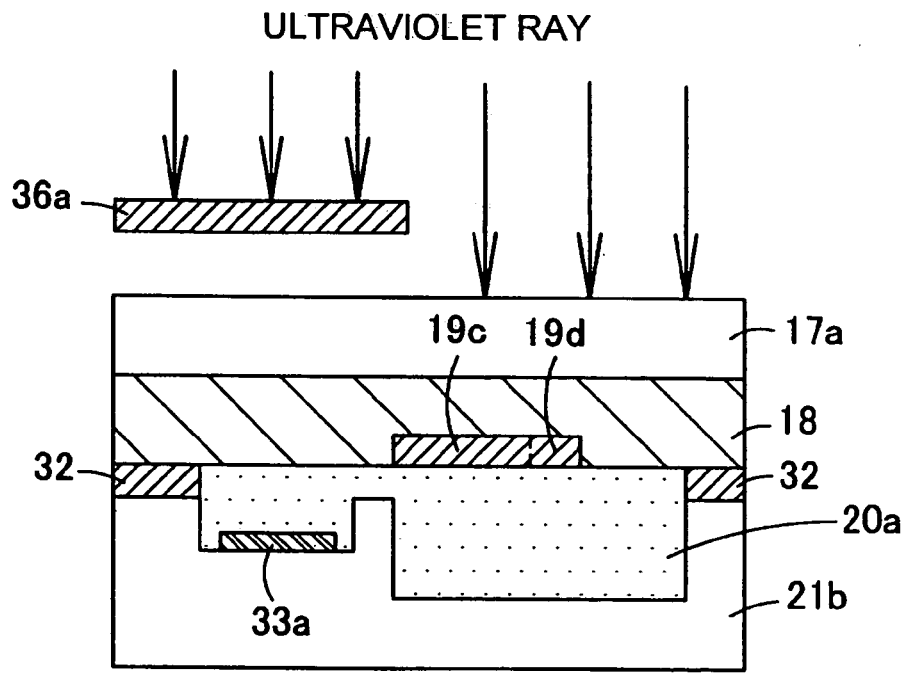
FIG. 16A shows a plane view corresponding to a cross section taken on line D–D' of FIG. 14, which explains the manufacturing method of the optical waveguide device shown in FIG. 14.
FIG. 16B shows a sectional view taken on line D–D' of FIG. 14.
Figure 16:
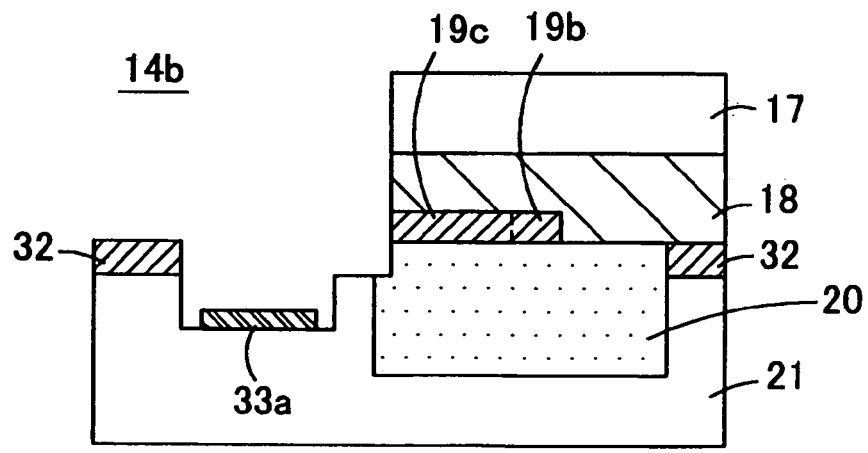

FIG. 16A shows the plane corresponding to the cross section taken on line D–D' of the optical waveguide device 14b shown in FIG. 14 before forming the filter placing groove 31, and FIG. 16B shows a sectional view taken on line D–D' of the optical waveguide device 14b shown in FIG. 14 after forming the filter placing groove 31. In bonding the base substrate 16b and the optical waveguide mother board 15a together with the uncured ultraviolet-curing resin 20a, as shown in FIG. 16A, covering the unnecessary parts of the upper cladding layer 20 such as the surface of the optical element placing portions 24a and 24b and the surface of the optical fiber guide 23a with a mask 36a which block the ultraviolet ray, only the uncured ultraviolet-curing resin 20a of the necessary part (upper cladding layer 20) can be cured when the uncured ultraviolet-curing resin 20a is irradiated with the ultraviolet ray.

Then, similarly to the manufacturing process described in the first embodiment, the unnecessary glass substrate 17a and lower cladding layer 18 is taken off by using the dicing blade, and the end faces of the cores 19c and 19d are simultaneously formed. In this case, though a part of the spacer 32 or the supporting substrate 21 may be cut away, it is not always necessary to cut away the part.

Since frictional heat is generated in the operation of the dicing blade, the dicing blade is cooled by putting cooling water to it. At the same time, since the uncured ultraviolet-curing resin 20a is washed away with the cooling water, the cut unnecessary parts in the glass substrate 17a and the lower cladding 18 are easily removed. In the case that the uncured ultraviolet-curing resin 20a is not thoroughly washed away only with the cooling water of the dicing blade, the uncured ultraviolet-curing resin 20a may be thoroughly washed away with solvent. Then, the optical waveguide device 14b shown in FIG. 16b is completed are divided into the individual waveguide chip with the dicing blade, the filter placing groove 31 is formed so that the core 19d is divided into the cores 19a and 19b, and the filter 29 is placed.

In order to achieve the mass production or simplification of the manufacturing process, even for the unnecessary part for the optical waveguide device, the optical waveguide motherboard 15a and the base substrate 16b are once bonded over the whole surface in the manufacturing process of the optical waveguide device. According to the manufacturing method of the optical waveguide device of the invention, the upper cladding layer is made of the resin such as the ultraviolet-curing resin which is not cured unless specific conditions are given to the resin, the unnecessary part remains while the unnecessary part is not cured, and the unnecessary part can be easily removed.

According to the manufacturing method of the optical waveguide device 14b of the embodiment, since the remaining uncured resin is washed away in the process forming the end face of the core with the dicing blade and the unnecessary part is removed, it is not necessary to provide the additional process for removing the unnecessary part and the manufacturing process can be simplified.

Further, since the spacer 32 is provided in the base substrate 16b of the optical waveguide device of the invention, the thickness of the upper cladding layer 20 can be uniformed by the spacer 32. For example, even if the amount or viscosity of the resin 20a which is dropped in order to form the upper cladding layer 20 is dispersed, since the core is not pressed below the height of the upper surface of the spacer 32 as shown in FIG. 16B, the dispersion is hardly generated in the height at which the cores 19a, 19b and 19c are placed, and the alignment of the optical axis between the cores 19a, 19b and 19c and the light emitting element, the light receiving element, or the optical fiber which is connected to the cores 19a, 19b and 19c is precisely performed.

Third Embodiment

Figure 17:
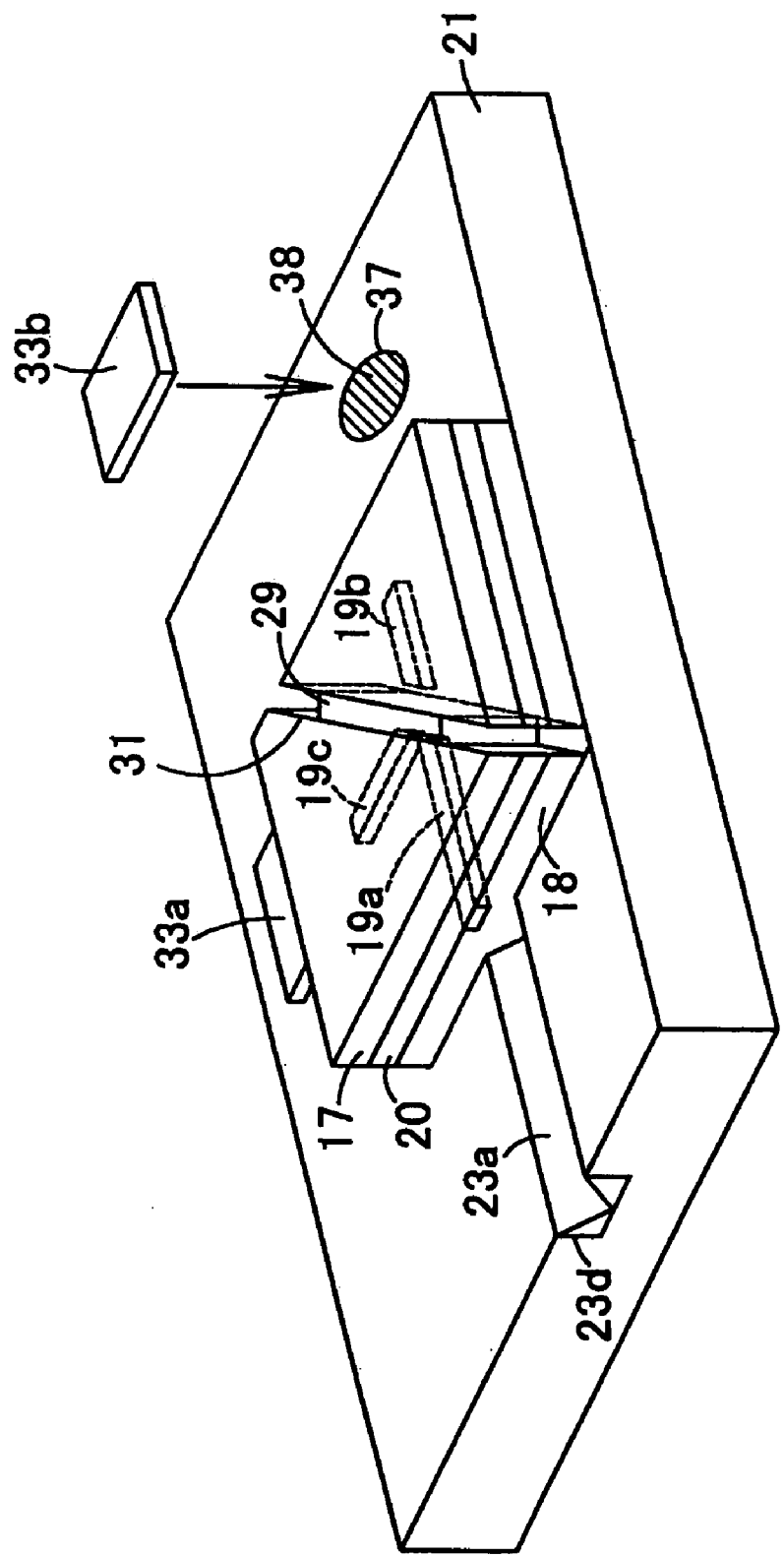
FIG. 17 is a schematically perspective view of the optical waveguide device according to still another embodiment of the invention.

FIG. 17 is the schematically perspective view of an optical waveguide device 14c according to still another embodiment of the invention. The optical waveguide device 14c of the invention includes the supporting substrate 21, a lead electrode 38 which is formed in a through hole 37 drilled through from the surface of the supporting substrate 21 to the backside, the element mounting benches 33a and 33b which covers the lead electrode 38, the lower cladding layer 18, the cores 19a, 19b and 19c which are formed inside the lower cladding layer 18, the filter 29 which is inserted in the filter placing groove 31, the upper cladding layer 20, and the cover glass 17. The V-shaped optical fiber guide 23a in which the optical fiber is placed is formed inside a concave groove 23d on the surface of the supporting substrate 21.

Figure 18:
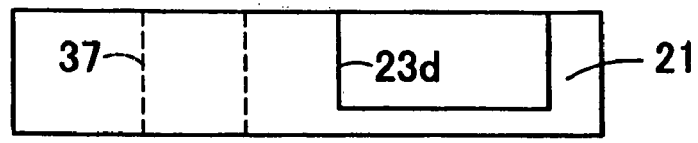
FIGS. 18A to 18C show views explaining the manufacturing process of the optical waveguide device shown in FIG. 17.
Figure 18:
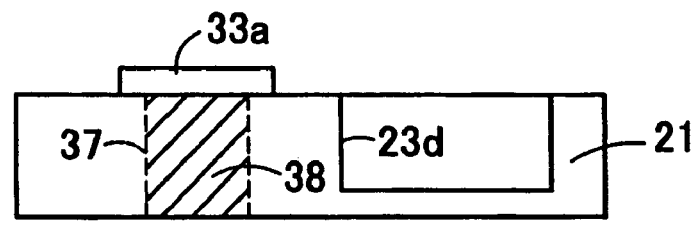
Figure 18:
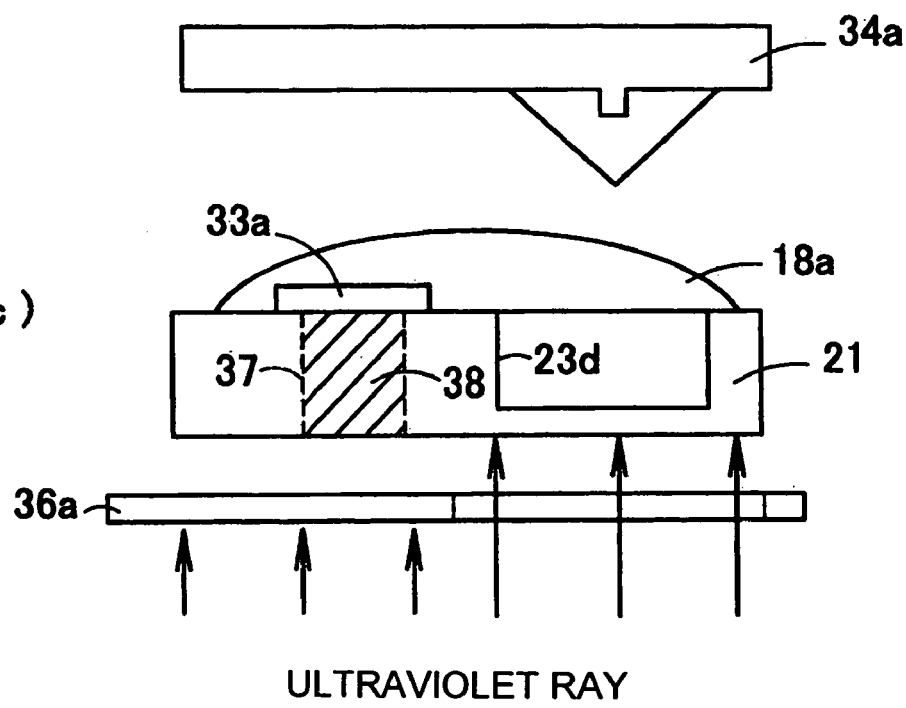

The manufacturing method of the optical waveguide device 14c of the embodiment will be simply described below. As shown in FIG. 18A, the concave groove 23d and the through hole 37 are formed in the supporting substrate 21 which is the glass substrate by the etching or the like. Then, as shown in FIG. 18B, the inside of the through hole 37 is embedded with a material having the high electrical conductivity or the metallic film is formed inside the through hole 37 to form the lead electrode 38, and the element mounting benches 33a and 33b are formed so as to cover the lead electrode 38. The element mounting benches 33a and 33b may be formed by evaporation of the metal.

As shown in FIG. 18C, in the surfaces opposite to the surface in which the element mounting benches 33a and 33b of the supporting substrate 21, the region in which the lower cladding layer 18 and the optical fiber guide 23a are not formed on the supporting substrate 21 is covered with the mask 36a which does not transmits the ultraviolet ray. Then, the lower cladding layer 18 having the core groove 35 and the optical fiber guide 23a are formed in such a manner that the ultraviolet-curing resin 18a is dropped onto the supporting substrate 21 in order to form the lower cladding layer 18, pressed with the stamper 34a having the same pattern as the optical fiber guide 23a, the cores 19c and 19d and the optical fiber guide 23a, and irradiated with the ultraviolet ray from the lower surface to cure the resin 18a. At this point, the ultraviolet-curing resin 18a of a part which is covered with the mask 36a remains while the resin 18a is not cured. When the optical fiber guide 23a and the core groove 35 are simultaneously formed in the above-described way, the alignment of the optical axis between the core and the optical fiber connected to the core is more precisely performed.

Figure 19:
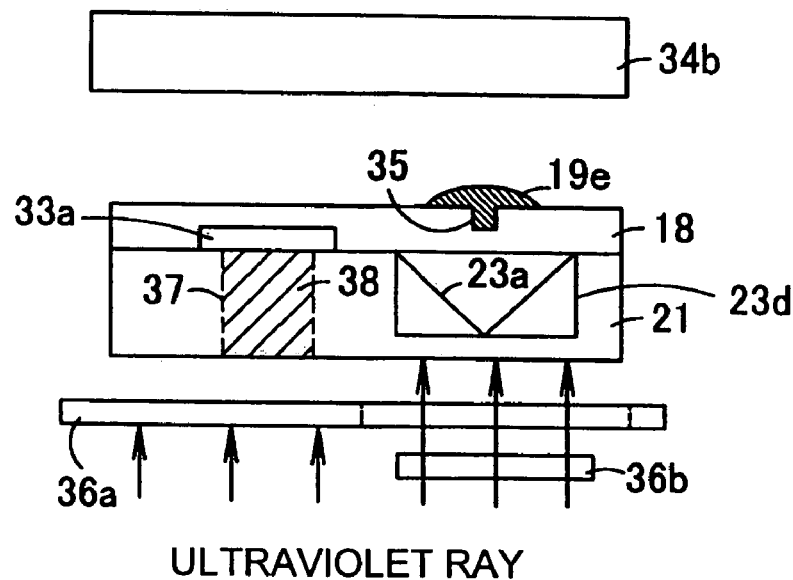
FIGS. 19A to 19C show continued views of FIG. 18.
Figure 19:
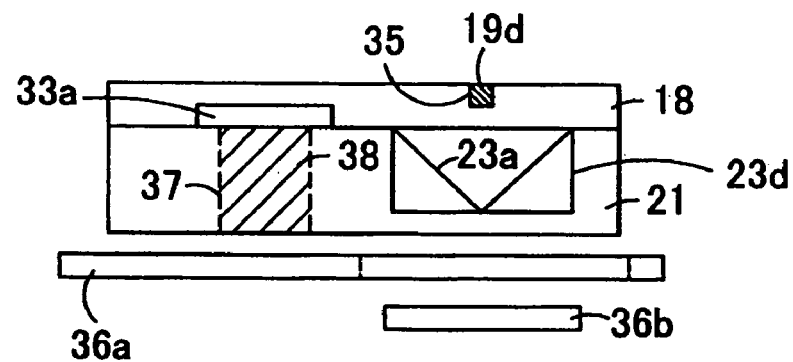
Figure 19:
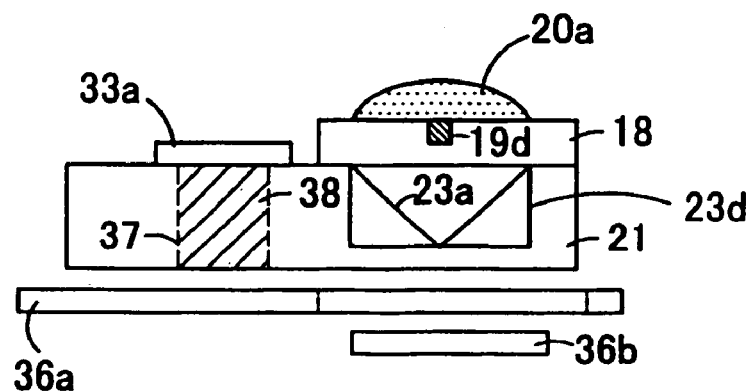

A mask 36b covering a part in which the optical fiber guide 23a is formed is superimposed on the mask 36a. As shown in FIGS. 19A and 19B, the ultraviolet-curing resin 19e having the refractive index higher than that of the ultraviolet-curing resin 18a forming the lower cladding layer 18 is injected into the core groove 35, pressed with the plane-shaped stamper 34b, and irradiated with the ultraviolet ray from the lower surface side to form the cores 19c and 19d. At this point, the formed cores 19c and 19d are those which intersect at right angles as described in the first embodiment and shown in FIG. 8. The ultraviolet-curing resins of parts which are covered with the masks 36a and 36b remain while the resin is not cured.

Figure 20:
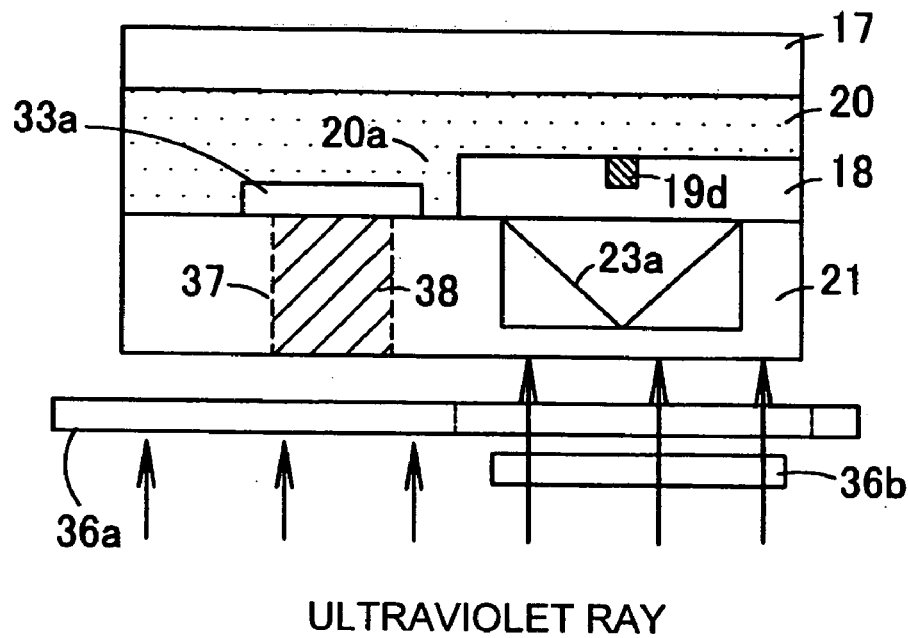
FIGS. 20A and 20B show continued views of FIG. 19.
Figure 20:
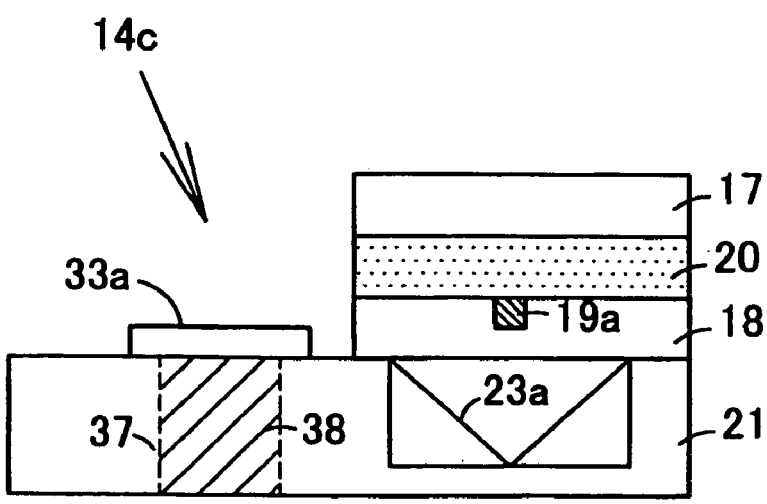

As shown in FIG. 19C, an uncured ultraviolet-curing resin 20a, which is the same type as that for the lower cladding layer 18, is dropped onto the core 19c and 19d and lower cladding layer 18. As shown in FIG. 20A, the ultraviolet-curing resin 20a is pressed with a cover glass 17, and ultraviolet rays are irradiated from the lower face side. At this point, there may be a problem that the ultraviolet-curing resin 20a also flows down to the surface of the supporting substrate 21, the element mounting benches 33a and 33b, or the optical fiber guide 23a. However, since these regions are covered with the masks 36a and 36b, there is no problem that the ultraviolet-curing resin 20a is cured. Then, the unnecessary cover glass 17 is cut away with the dicing blade and the end faces of the cores 19c and 19d are formed simultaneously. In doing so, the uncured ultraviolet-curing resin 20a is washed away with the cooling water of the dicing blade, and the unnecessary part can be removed as shown in FIG. 19B. In the case that the ultraviolet-curing resin 20a is not thoroughly washed away with the cooling water of the dicing blade, the ultraviolet-curing resin 20a may be thoroughly removed by further using the solvent. In the case that the plurality of optical waveguide devices 14c are formed at once as the mother board, those are divided into waveguide chips by using the dicing blade.

Then, the cut is made into the cover glass 17, the upper cladding layer 20, and lower cladding layer 18 with the dicing blade to form the filter placing groove 31 so as to divide the core 19d into the cores 19a and 19b. Finally, by placing the filter 29 between the cores 19a and 19b of the filter placing groove 31, the optical waveguide device 14c shown in FIG. 20B is completed.

Even if the part is not required for the optical waveguide device, there is the part which is temporarily formed in the manufacturing process of the optical waveguide device in order to achieve the mass production or the simplification of the manufacturing process. In the manufacturing method of the optical waveguide device of the embodiment, the upper cladding layer is made of the resin such as the ultraviolet-curing resin which is not cured unless specific conditions are given to the resin, a boundary part between the necessary part and the unnecessary part remains while the boundary part is not cured, and the unnecessary part can be easily removed.

In the manufacturing method of the optical waveguide device of the invention, since the uncured resin is washed away in the process in which the end face of the core is formed with the dicing blade and the unnecessary part is removed, it is not necessary to provide the additional process for removing the unnecessary part, and the manufacturing process can be simplified.

Fourth Embodiment

Figure 21:
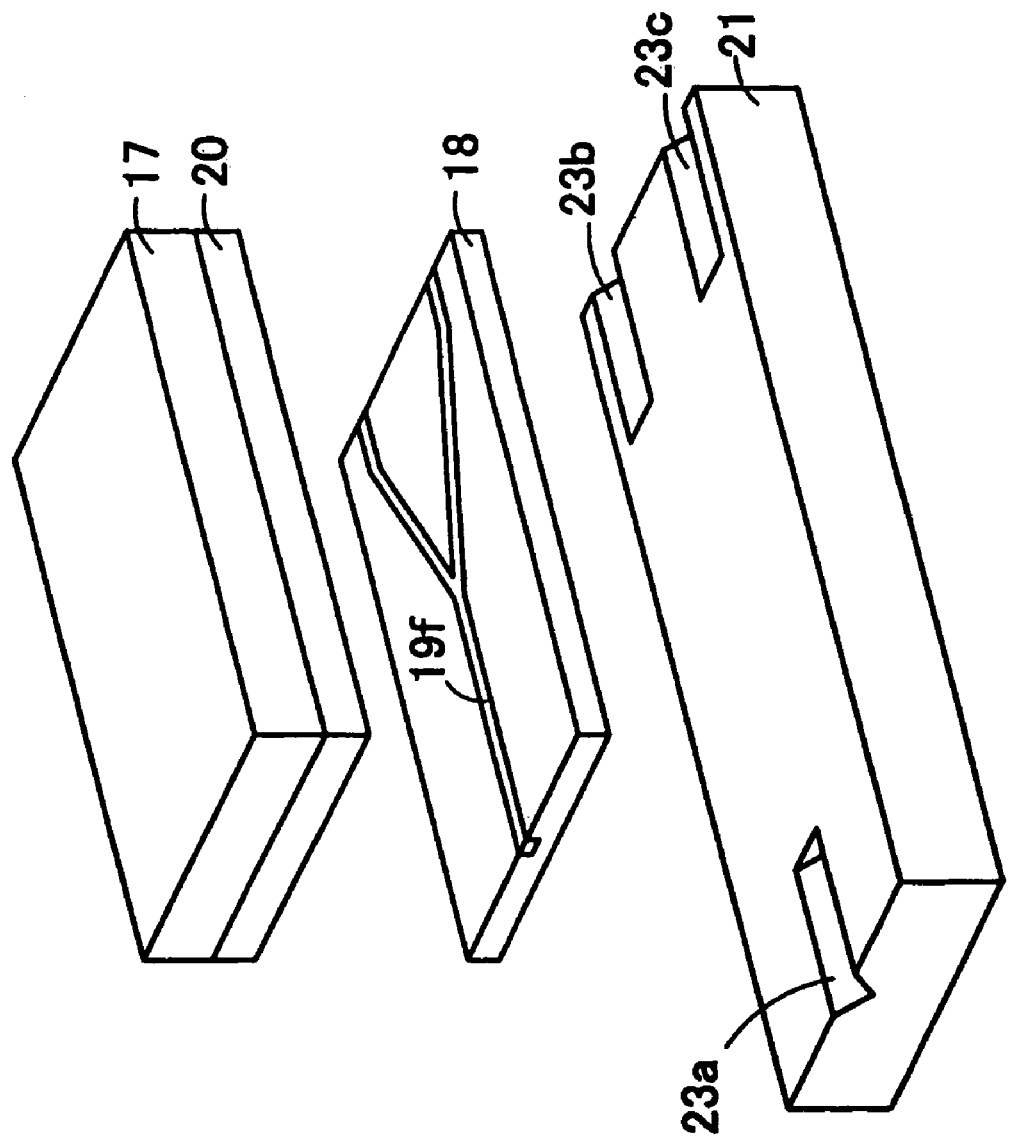
FIG. 21 shows a schematically exploded perspective view of the optical waveguide device according to still another embodiment of the invention.

FIG. 21 shows the schematically exploded perspective view of an optical waveguide device 14d according to still another embodiment of the invention. The optical waveguide device 14d includes the supporting substrate 21, the lower cladding layer 18, a core 19f, the upper cladding layer 20, and the cover glass 17. Optical fiber guides 23a, 23b and 23c which automatically align the optical axis of the optical fiber connected to the end face of the core 19f are formed on the surface of the supporting substrate 21 made of glass. In the case that the supporting substrate 21 is used as the silicon substrate, the optical fiber guides 23a, 23b, and 23c may be formed by the etching. The supporting substrate 21 may be also made in a manner that forms the transparent resin by injection molding, the stamper method, resin casting, or the like.

Figure 22:
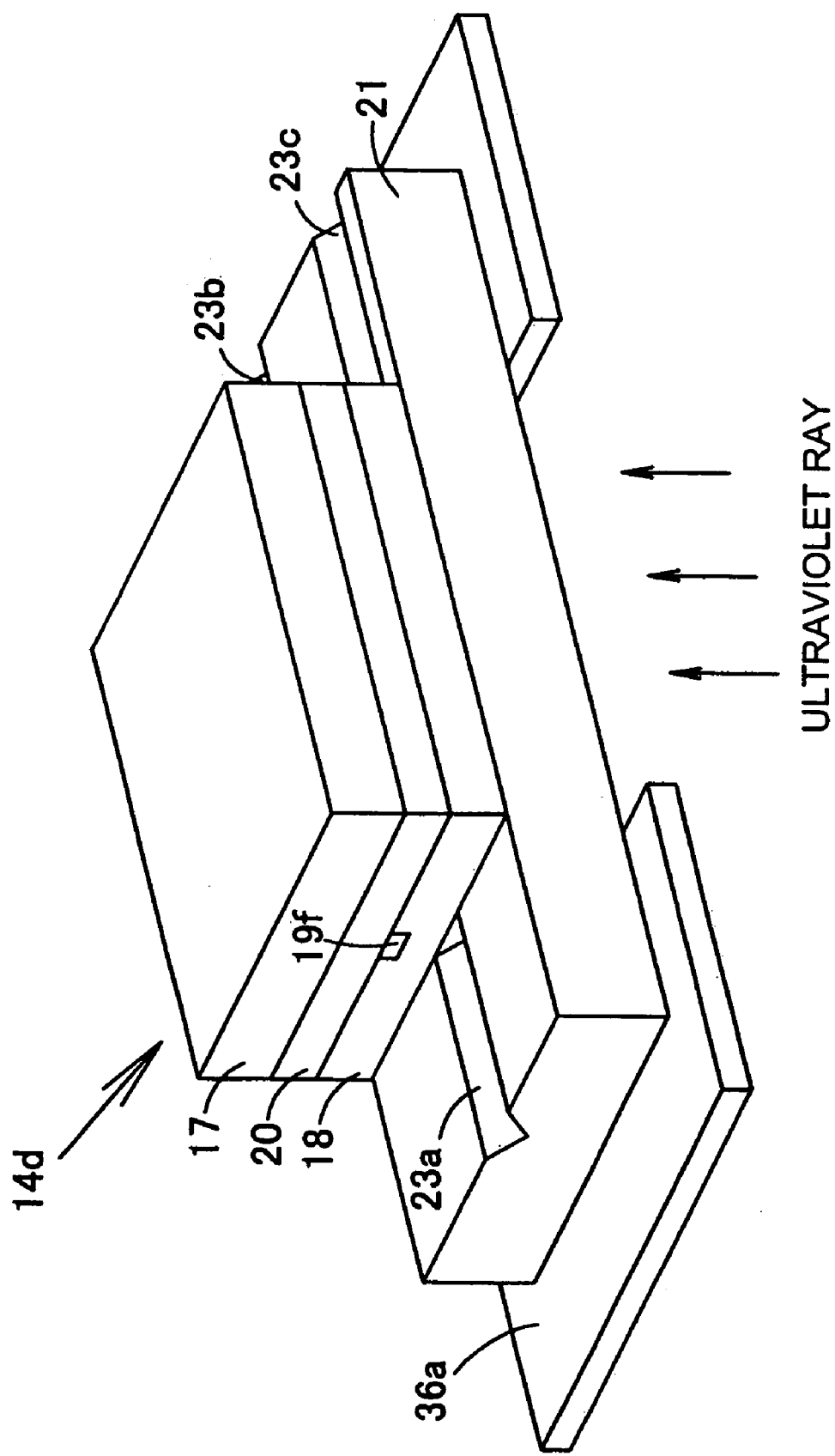
FIG. 22 shows a view explaining the manufacturing method of the optical waveguide device shown in FIG. 21.

The optical waveguide device 14d of this embodiment can be produced by the same manufacturing method for the optical waveguide device shown in the third embodiment, as shown in FIG. 22. The supporting substrate 21 may be covered with the mask 36a so that only the region where the lower cladding layer 18, the core 19f, and the upper cladding layer 20 are formed is irradiated with the ultraviolet ray.

Even if the part is not required for the optical waveguide device, there is the part which is temporarily formed in the manufacturing process of the optical waveguide device in order to achieve the mass production or the simplification of the manufacturing process. In the manufacturing method of the optical waveguide device of the invention, the upper cladding layer is made of the resin such as the ultraviolet-curing resin which is not cured unless specific conditions are given to the resin, a boundary part between the necessary part and the unnecessary part remains while the boundary part is not cured, and the unnecessary part can be easily removed.

Fifth Embodiment

Figure 23:
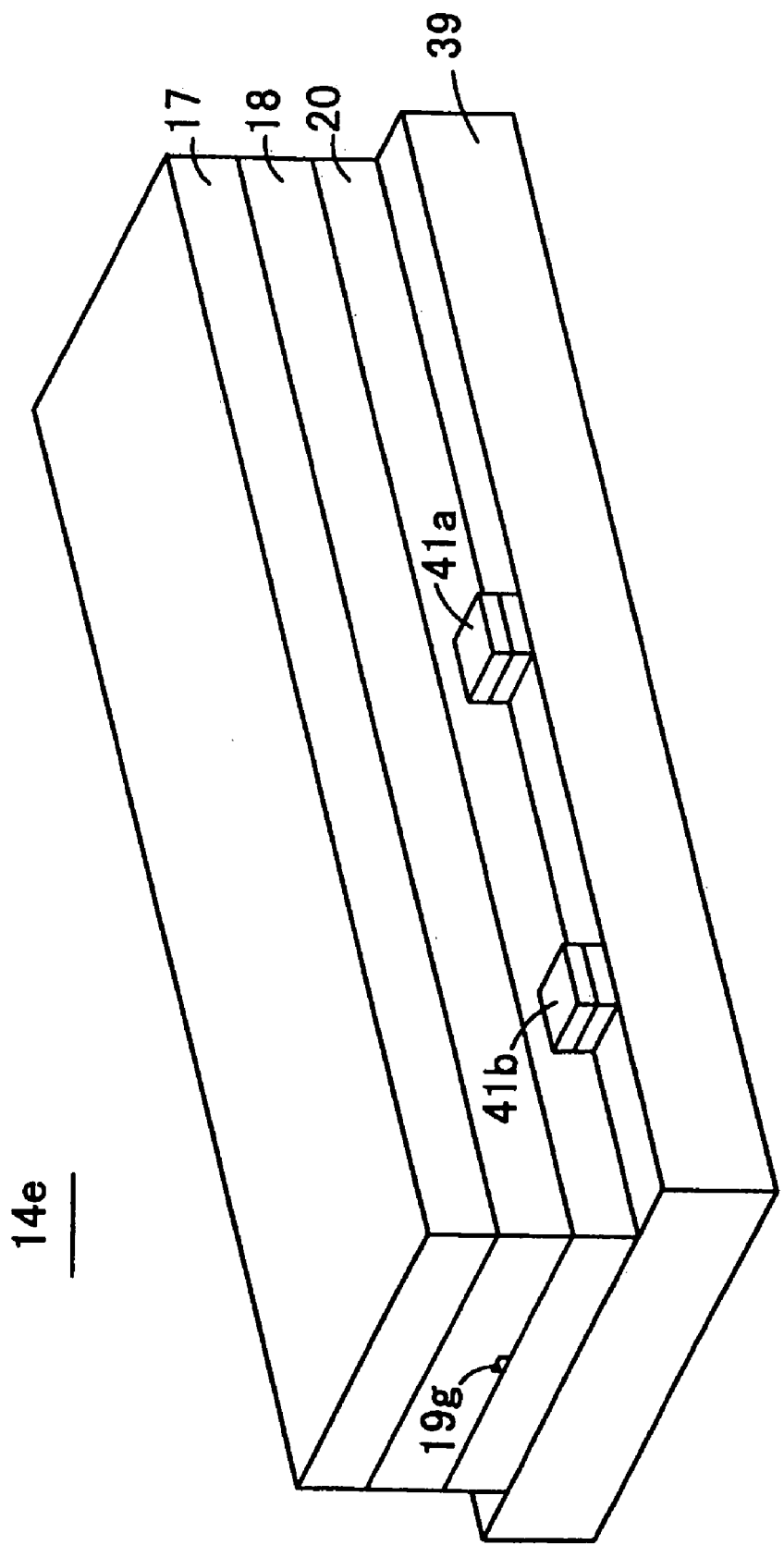
FIG. 23 shows a schematically perspective view of the optical waveguide device according to still another embodiment of the invention.
Figure 24:
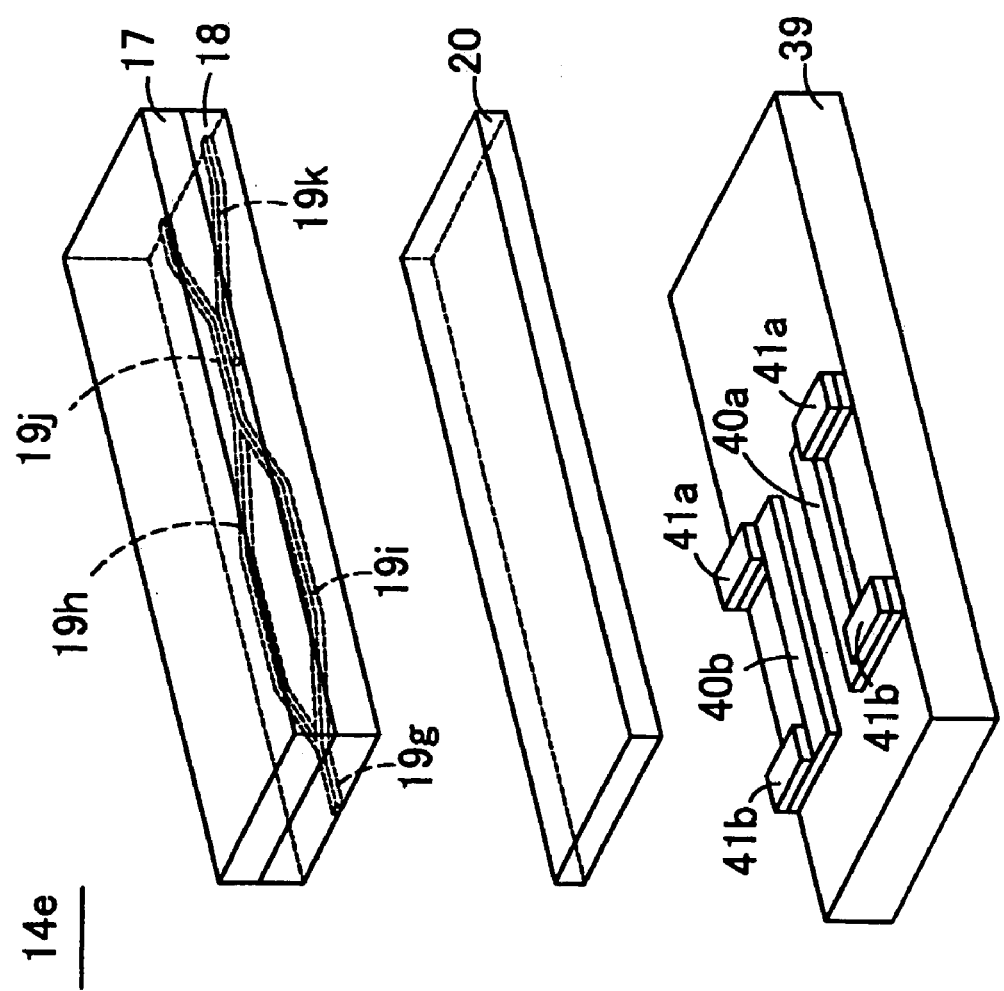
FIG. 24 shows a schematically exploded view of the optical waveguide device shown in FIG. 23.
Figure 25:
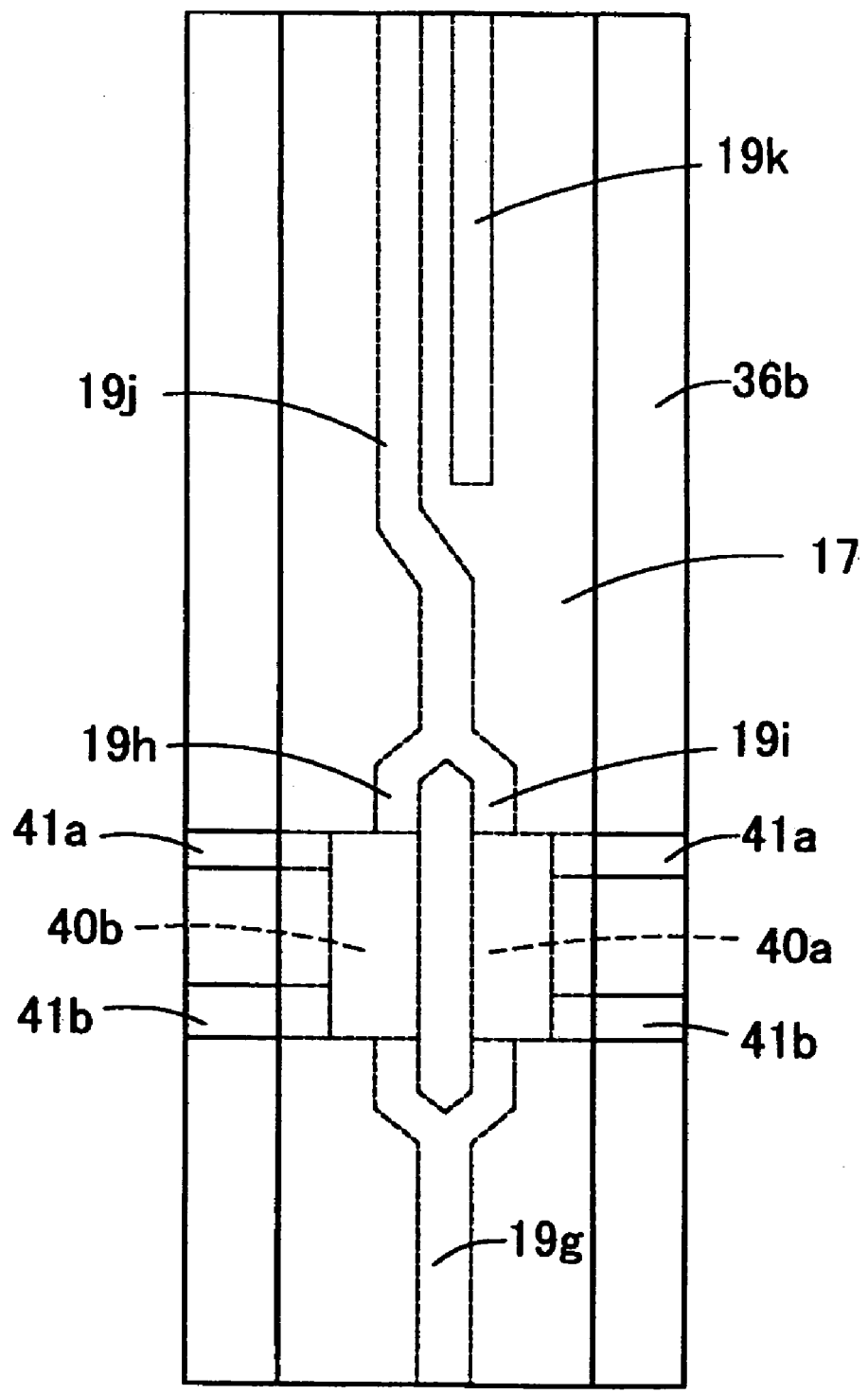
FIG. 25 shows a schematic plane view of the optical waveguide device shown in FIG. 23.

FIGS. 23, 24, and 25 show the schematically perspective view, the schematically exploded view, and the schematic plane view of an optical waveguide device 14e (optical attenuator) according to still another embodiment of the invention respectively. The optical waveguide device 14e of the invention includes a base glass 39, heaters 40a and 40b, electrode lead pads 41a and 41b, the upper cladding layer 20, the cores 19g, 19h, 19i, 19j, and 19k, the lower cladding layer 18, and the cover glass 17.

In the cores 19g to 19k of the optical waveguide device 14e of the embodiment, though the core is the single core 19g at an entrance of light incident, the core branches off into the two cores 19h and 19i on its way, and then the two cores converge to the single core 19j. The heaters 40a and 40b are placed on the surface of the base glass 39 lower the cores 19i and 19h, the heater 40a can heat the core 19i, and the heater 40b can heat the core 19h.

When one of the heaters 40a and 40b conducts to heat one of the cores 19i and 19h, the refractive index of heated one of the cores 19i and 19h is decreased and optical length of the light which is transmitted by the heated core 19i or 19h is changed, so that the phase difference between the light transmitted through the core 19i and the light transmitted through the core 19h is changed. Accordingly, the two lights having the different phases interfere with each other at a merging point of the two cores 19i and 19h, and power of the light outputted from the core 19k is changed according to its phase difference. As a result, the amount of attenuation of the outputted light can be controlled by controlling a current value conducting the heater 40a or the heater 40b to change heat value of the heater 40a or the heater 40b. Particularly, auto-power control can be performed so that the power of the light outputted from the core 19k becomes constant in such a manner that the light receiving element for monitoring is placed opposite to the core 19j for monitoring and the current value conducting the heaters 40a and 40b is feed-back-controlled while the amount of receiving light is monitored with the light receiving element.

In the closest portion between the cores 19j and 19k, the cores 19j and 19k are formed in parallel at intervals of about several times of the wavelength. The power of the light propagating through the core 19j can be transferred to the core 19k between the cores 19j and 19k which are close to such an extent, and a ration of the transferred light can be adjusted by setting the parallel portion to the proper length. In the optical waveguide device 14e of the embodiment, the 95% light is transferred to the core 19k and the remaining 5% light is outgoing from a light outgoing end of the core 19j in the light outputted from the merging point of the diverging cores 19i and 19h. Since the core 19k is connected to the optical fiber or the light receiving element, the light outgoing from the core 19k cannot be directly examined. However, intensity of the light outgoing from the core 19k can be indirectly observed by monitoring the light outgoing from the core 19j.

Figure 26:
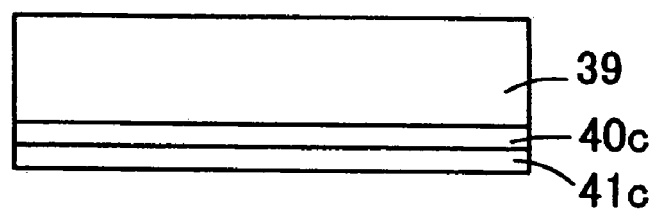
FIGS. 26A to 26D show views explaining the manufacturing process of the optical waveguide device shown in FIG. 23.
Figure 26:
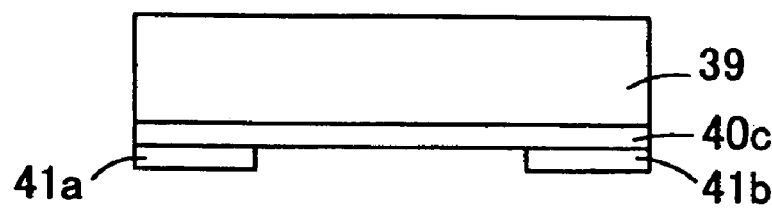
Figure 26:
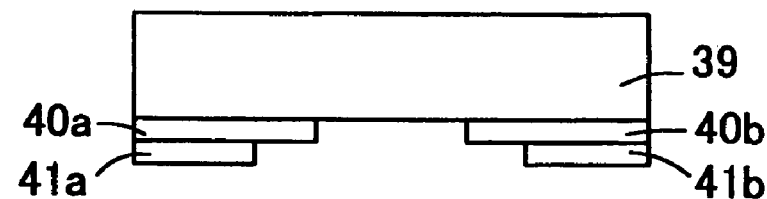
Figure 26:
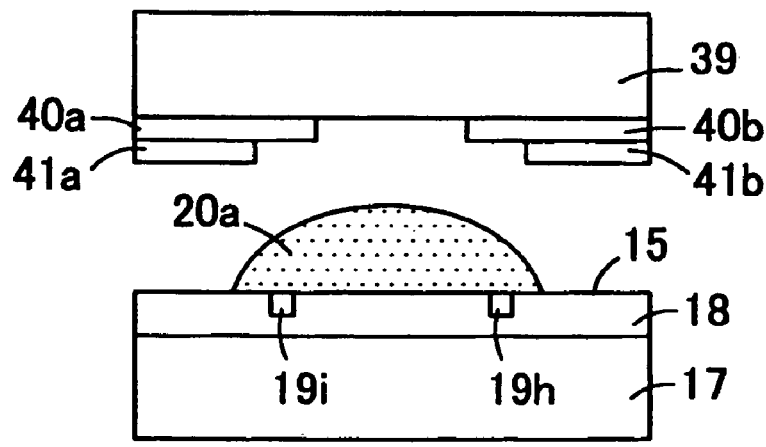

The manufacturing method of the optical waveguide device 14e of the invention will be described below. As shown in FIG. 26A, A titanium thin film 40c is formed on the surface of the base glass 39 which is the glass substrate by depositing or sputtering titanium (Ti) having high thermal conductivity, and an aluminum thin film 41c is formed on the titanium thin film 40c by depositing aluminum (Al).

As shown in FIG. 26B, the electrode lead pads 41a and 41b are formed by etching a part of the aluminum thin film 41c, and then the heaters 40a and 40b are formed by etching a part of the exposed titanium thin film 40c as shown in FIG. 26C.

As shown in FIG. 26D, by adopting the duplicating method using the resin, which was described in the first embodiment, the base glass 39 in which the electrode lead pads 41a and 41b and the heaters 40a and 40b are formed is bonded in a manner that drops the uncured ultraviolet-curing resin 20a, which has the same refractive index as that of the lower cladding layer 18 or the same level of the refractive index of the lower cladding layer 18, onto the surface of the lower cladding layer 18 in the optical waveguide substrate 15 on which the lower cladding layer 18 and the cores 19g to 19k are formed on the cover glass 17.

Figure 27A:
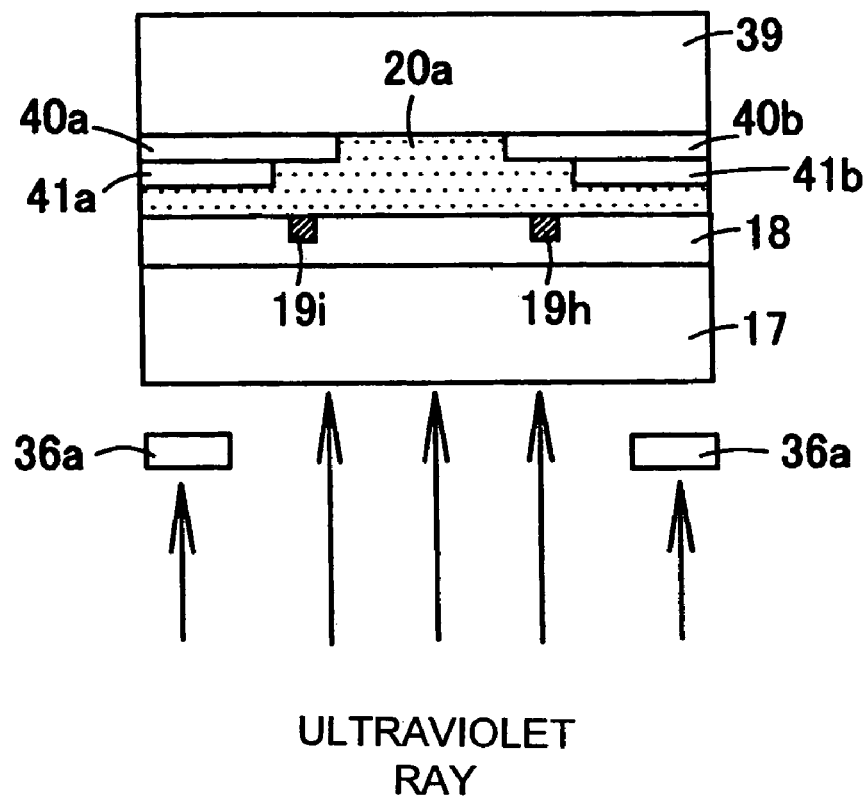
FIGS. 27A and 27B show continued views of FIG. 26.

At this point, as shown in FIG. 27A, a part where it is not necessary to form the upper cladding layer 20 is covered with the mask 36a from the lower surface of the cover glass 17, and the upper cladding layer 20 is formed in such a manner that the ultraviolet-curing resin 20a is irradiated with the ultraviolet ray from the lower side of the mask 36a to cure it.

Figure 27B:
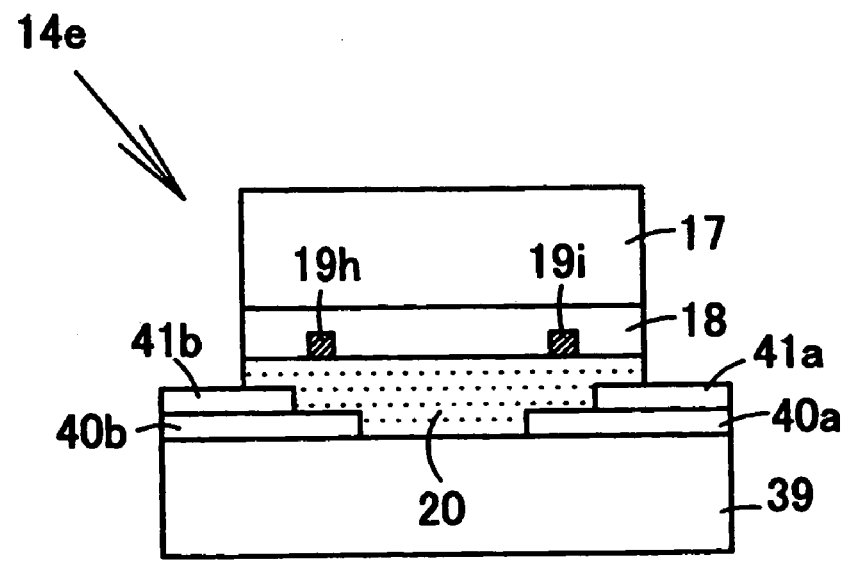

The unnecessary parts of the cover glass 17 and the lower cladding layer 18 are cut off with the dicing blade while the optical waveguide device is inversely turned the other way round so that the base glass 39 is placed on the lower side and the cover glass 17 is placed on the upper side, and the electrode lead pads 41a and 41b are exposed. As a result, the optical waveguide device 14e shown in FIG. 27B is completed. The cut-off cover glass 17 or lower cladding layer 18 and the remaining uncured resin 20a are washed away with the cooling water of the dicing blade. In the case that the ultraviolet-curing resin 20a is not thoroughly washed away with the cooling water of the dicing blade, the ultraviolet-curing resin 20a may be thoroughly removed by further using the solvent.

Sixth Embodiment

Figure 28:
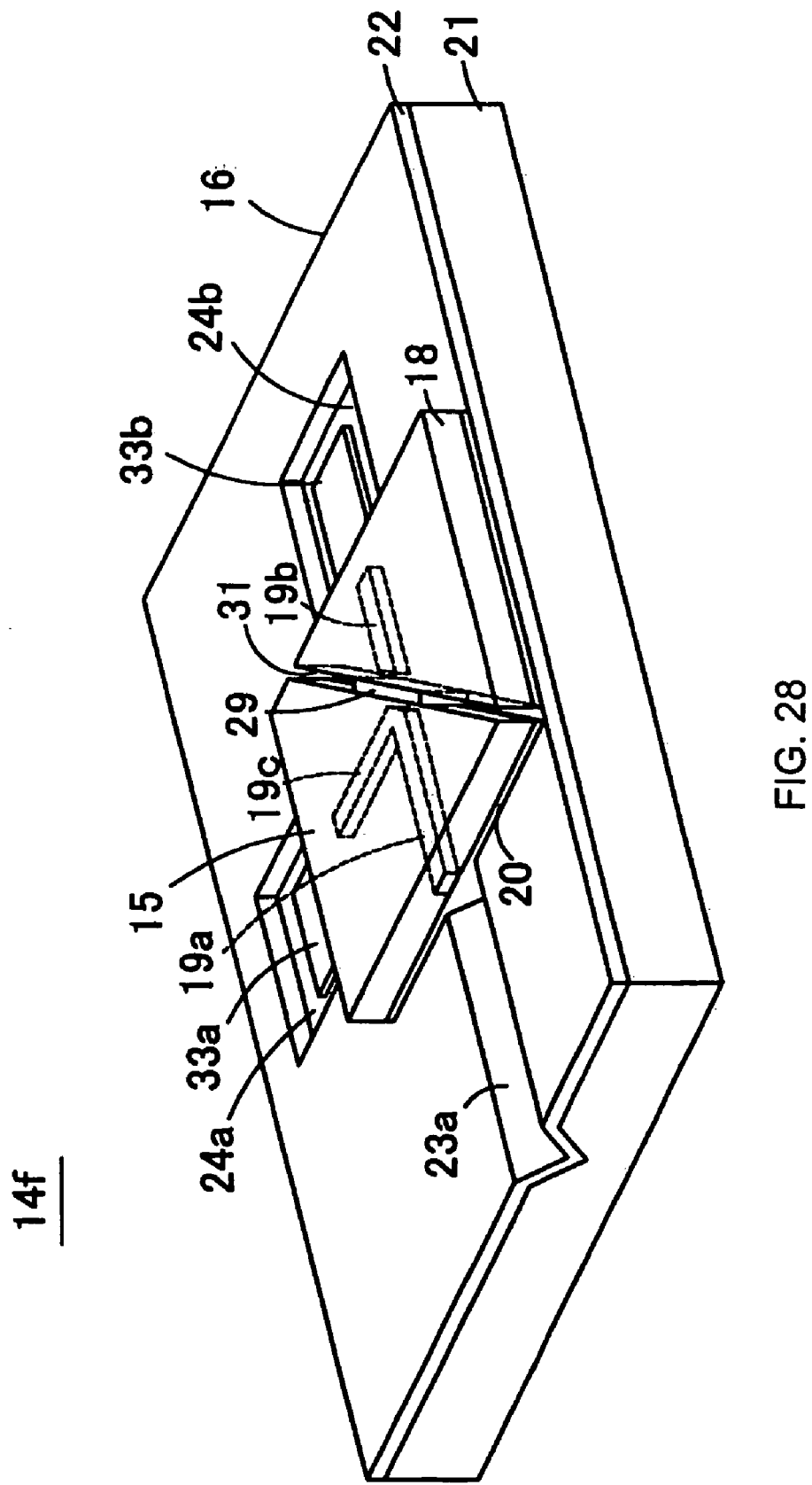
FIG. 28 shows a schematically perspective view of the optical waveguide device according to still another embodiment of the invention.
Figure 29:
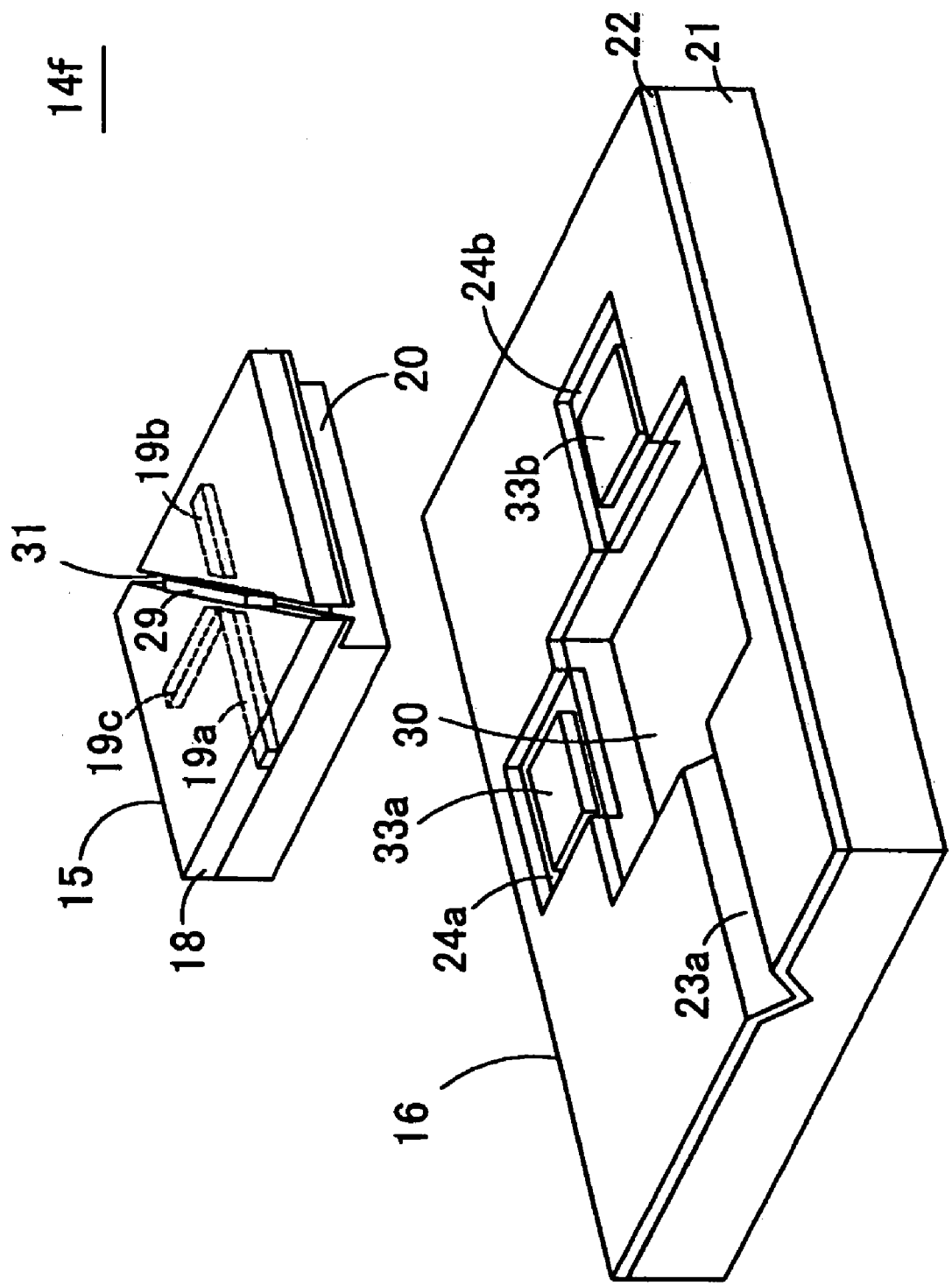
FIG. 29 shows a schematically exploded perspective view of the optical waveguide device shown in FIG. 28.

FIGS. 28 and 29 show the schematically perspective view and the schematically exploded perspective view of an optical waveguide device 14f according to still another embodiment of the invention respectively. The optical waveguide device 14f of the embodiment includes the substrate for mounting 16 and the optical waveguide substrate 15 and has the structure in which the cover glass 17 is removed from the optical waveguide device 14a. That is, the optical waveguide substrate 15 includes the lower cladding layer 18 made of the optical material having the high refractive index and the upper cladding layer 20 which is made of the optical material having the refractive index higher than that of the lower cladding layer 18 and the same optical material for the cores 19a, 19b, and 19c, the filter 29, and the lower cladding layer 18, which transmit the light. The filter 29 is the optical element which transmits only the light having a certain wavelength range and reflects the light having the wavelength range except the certain wavelength range. The filter 29 is placed inside the filter placing groove 31. The cores 19a and 19b embedded in the lower cladding layer 18 are arranged in line, the filter 29 is inserted in the filter placing groove 31 so as to partition the cores 19a and 19b and to be disposed at a 45° angle relative to the optical axis of the cores 19a and 19b, and the core 19c is arranged on the side face of the filter 29 so as to be disposed at a 90° angle relative to the optical axis of the cores 19a and 19b.

In the substrate for mounting 16, the waveguide fixing region 30 for laminating the optical waveguide substrate 15 is formed on a surface of a supporting substrate 21, the V groove-shaped optical fiber guide 23a and the concave optical element placing portions 24a and 24b are provided on a periphery of the waveguide fixing region 30. The upper surface of the supporting substrate 21 except the waveguide fixing region 30 is thoroughly covered with the metallic thin film 22 such as Ni or Au. In the case that the supporting substrate 21 is made of the silicon substrate, the metallic thin film 22 may be formed onto a $SiO_2$ film which is formed by oxidizing the surface of the supporting substrate 21 (hereinafter referred to as silicon substrate). Element mounting benches (electrode pads) 33a and 33b for mounting the light receiving element and the light emitting element are formed in each optical element placing portions 24a and 24b.

In the optical waveguide device 14f assembled as shown in FIG. 28, the optical waveguide substrate 15 is placed while the optical waveguide substrate 15 is vertically turned the other way round, the optical fiber guide 23a and the element mounting benches 33a and 33b are exposed from the optical waveguide substrate 15.

Figure 30:
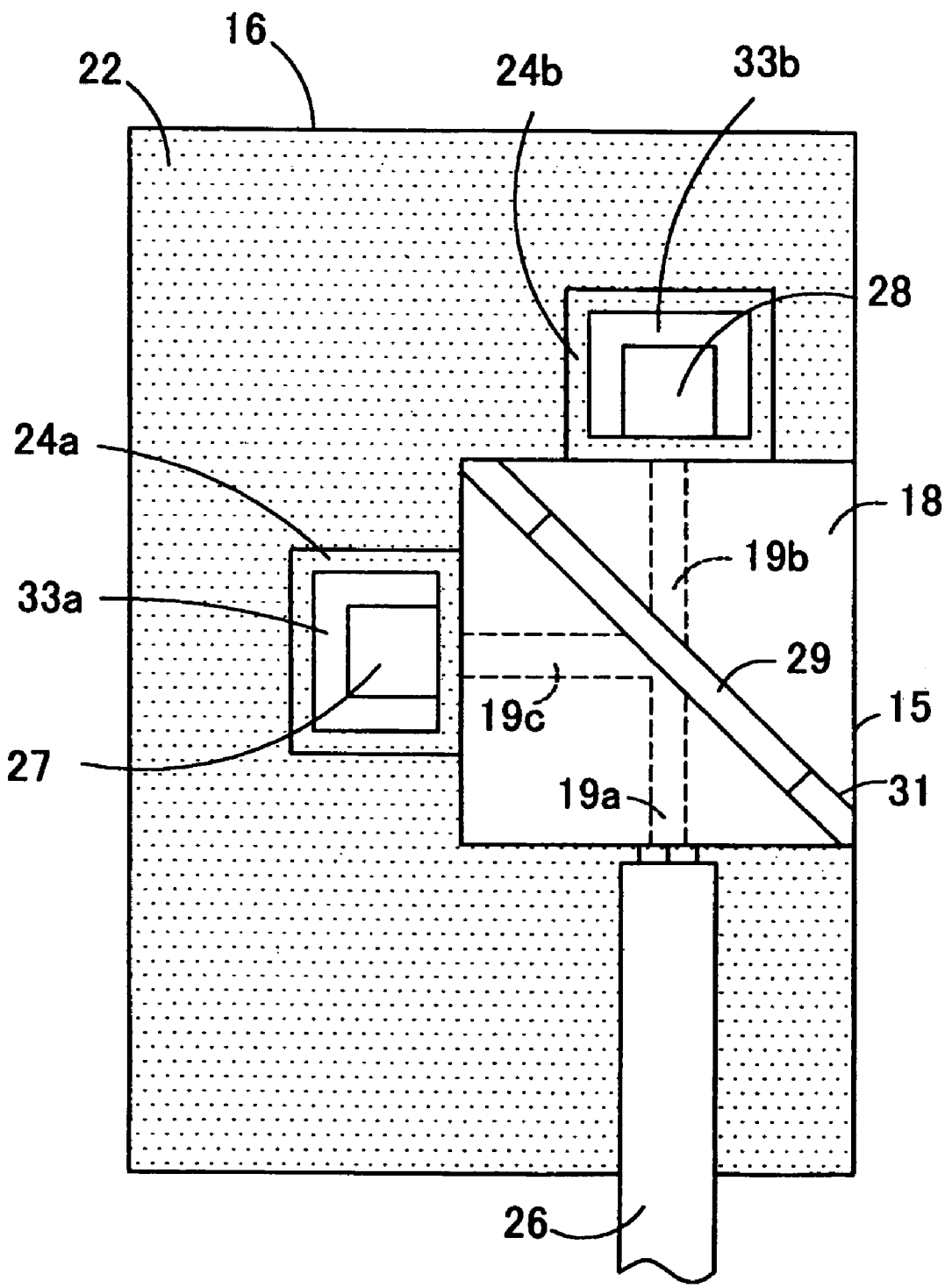
FIG. 30 shows a schematic plane view explaining the using mode of the optical waveguide device shown in FIG. 28.

FIG. 30 is the plane view showing a state in which the optical transceiver is constituted by mounting a light emitting element 28 and a light receiving element 27 on the optical waveguide device 14f and connecting the optical fiber 26. The light receiving element 27 and the light emitting element 28 are mounted respectively on the element mounting benches 33a and 33b in the optical element placing portions 24a and 24b by die-bonding a lower surface electrode. The light receiving element 27 is opposed to an end face of the core 19c The light emitting element 28 is opposed to the end face of the core 19b. The upper surface electrodes of the light emitting element 28 and the light receiving element 27 are connected to a circuit board or the like with a bonding wire. In this state, though the element mounting bench 33a is electrically connected to the element mounting bench 33b with the metallic thin film 22, there is no problem in the case that the sides of the element mounting benches 33a and 33b become ground electrodes. In the case that it is inconvenient that the element mounting bench 33a is electrically connected to the element mounting bench 33b, the metallic thin film 22 may be electrically separated by cutting the metallic thin film 22 with a dicing blade between the element mounting benches 33a and 33b. The optical fiber 26 is fixed with a bonding agent while the optical fiber 26 is stored in the optical fiber guide 23a to be positioned. Consequently, the optical axes of the core 19a and the optical fiber 26 are automatically aligned.

In the optical waveguide device 14f, the filter 29 is used one having characteristics which transmit the light having the wavelength outgoing from the light emitting element 28 and reflect the light having the wavelength outgoing from the optical fiber 26. Accordingly, when the light emitting element 28 emits the light to the core 19, the light propagates through the core 19b, transmits through the filter 29, propagates though the core 19a, and is incident to the optical fiber 26 to be transmitted by the optical fiber 26. The light (receiving signal) propagating through the optical fiber 26 is incident to the core 19a, reflected by the filter 29, propagates through the core 19c, and is received by the light receiving element 27. Thus, in the optical waveguide device 14f, the transmission and reception of the signal can be performed between the optical waveguide device 14f and an external other device connected to the optical waveguide device 14f through the optical fiber.

Figure 31:
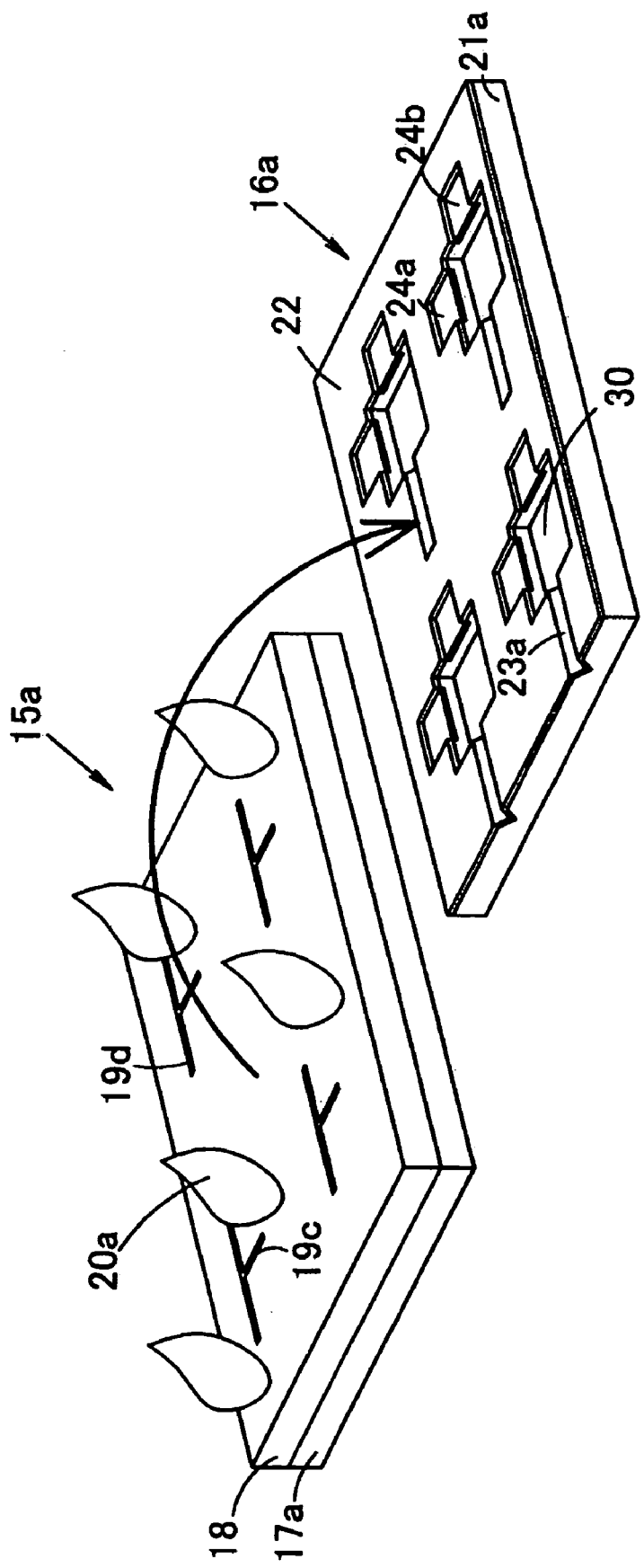
FIG. 31 shows a perspective view illustrating the manufacturing method of the optical waveguide device shown in FIG. 28.

The manufacturing method of the optical waveguide device 14f of the invention will be described below referring to FIGS. 31 to 35. The base substrate 16a shown in FIG. 31 is produced through the processes (processes shown in FIGS. 6 and 7) described in the first embodiment. The thickness of the silicon substrate 21a used is in the range of 500 to 1000 μm. The optical waveguide motherboard 15a shown in FIG. 31 is produced on the glass substrate 17a through the processes (processes shown in FIGS. 8 and 9) described in the first embodiment. The thickness of the glass substrate 17a is in the range of 500 to 1000 μm, the thickness of the lower cladding layer 18 is about 20 μm, and the cross section of the cores 19c and 19d is about 5 nm by 5 μm. After the base substrate 16a and the optical waveguide mother board 15a are produced in the above-described way, as shown in FIG. 31, the uncured ultraviolet-curing resin 20a is dropped onto the surface of the optical waveguide mother board 15a, and the optical waveguide mother board 15a is integrally bonded to the base substrate 16a with the ultraviolet-curing resin 20a as shown in FIG. 32A. The ultraviolet-curing resin 20a is cured in the waveguide fixing region 30 to become the upper cladding layer 20 having the thickness of about 20 μm.

It is necessary to precisely align the optical fiber guide 23a, the optical element placing portions 24a and 24b, and the cores 19c and 19d, when the base substrate 16a is bonded to the optical waveguide motherboard 15a. In order to align those components, the optical waveguide mother board 15a and the base substrate 16a may be bonded in such a manner that the alignment is precisely performed with alignment marks provided in the optical waveguide mother board 15a and the base substrate 16a. When the alignment is performed with the base substrate 16a having the large area and the optical waveguide mother board 15a having the large area, a complicated procedure such as the alignment among the individual components is not required, and it is efficient because the plurality of cores are precisely aligned with the fiber guide and the like.

After the base substrate 16a and the optical waveguide mother board 15a are integrally bonded, the glass substrate 17a on the lower cladding layer 18 is removed as shown in FIG. 32B. With reference to the method for removing the glass substrate 17a, the glass substrate 17a may be physically peeled off from the lower cladding layer 18 by applying force to the glass substrate 17a or the glass substrate 17a may be dissolved by the etching or the like to remove it. In the case that the glass substrate 17a is peeled off, the material having low adhesion properties may be previously formed between the glass substrate 17a and the lower cladding layer 18 or processing which reduce the adhesion properties between the glass substrate 17a and the lower cladding layer 18 may be previously performed to the glass substrate 17a. In the case that the adhesion properties of the glass substrate 17a and the lower cladding layer 18 are too low and surface treatment is performed in order to improve the adhesion properties, conditions for improving the adhesion properties may be released. In the case that the glass substrate 17a is removed by the etching, it is desirable to selectively etch the glass substrate 17a by using an etchant which could not etch the lower cladding layer 18.

Figure 33:
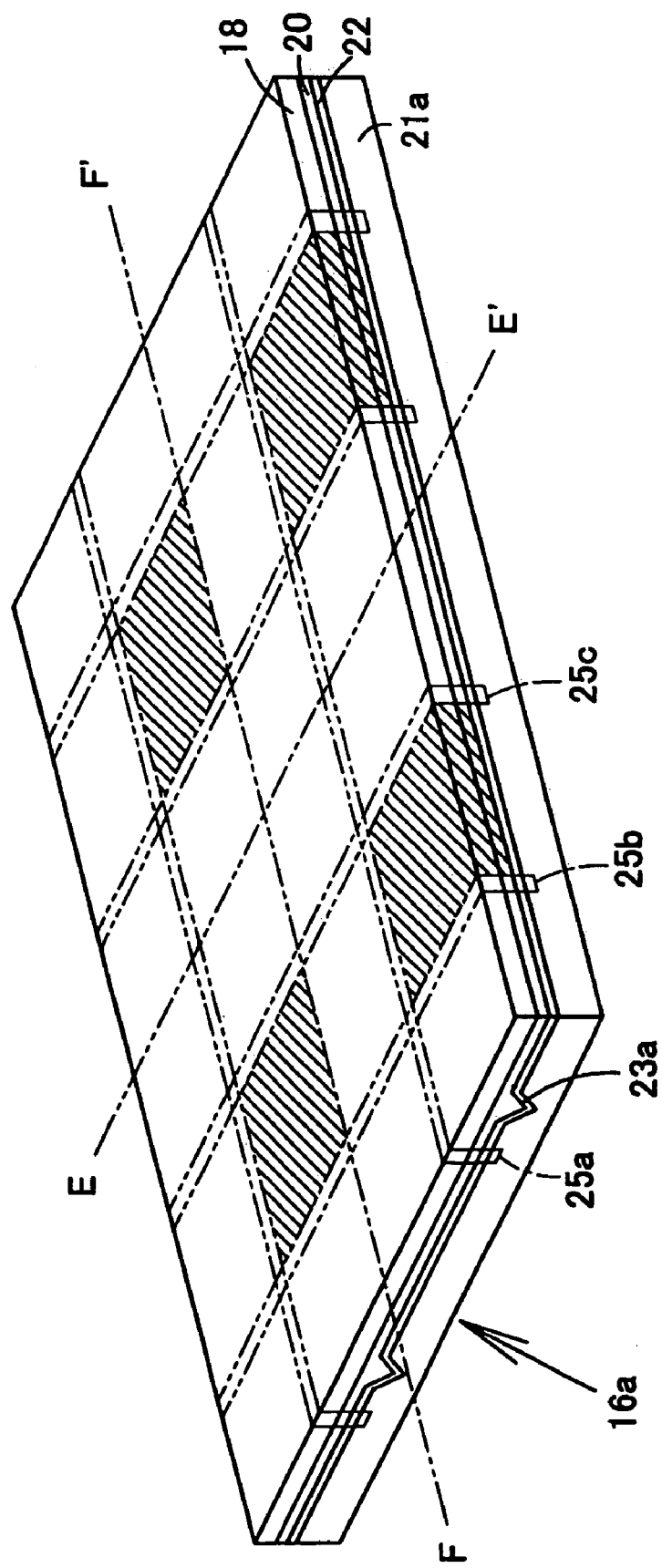
FIG. 33 shows a continued view of FIG. 32.

As shown in FIG. 33, the separating grooves 25a, 25b, and 25c are formed by making the cut in the lower cladding layer 18 and the upper cladding layer 20 with the dicing blade so as to pass through the edge of the waveguide fixing region 30. The end face of the cores 19c and 19d are simultaneously formed by this cutting process of the separating grooves 25a, 25b, and 25c. Among the lower cladding layer 18 or the upper cladding layer 20, which is divided by the separating grooves 25a, 25b, and 25c, because the adhesion at the interface between the metallic thin film 22 and the upper cladding layer 20 is weak in the region (region outside the waveguide fixing region 30) where the metallic thin film 22 is formed on the surface of the base substrate 16a, the unnecessary part can be easily peeled off from the base substrate 16a when the force is applied to the unnecessary part (region corresponding to the outside of the waveguide fixing region) of the lower cladding layer 18 or the upper cladding layer 20. Accordingly, the optical fiber guide 23a of the base substrate 16a or the element mounting benches 33a and 33b in the optical element placing portions 24a and 24b can be exposed, while only the region in which the cores 19c and 19d are formed, shown by oblique lines in FIG. 33, remains. Each end face of the cores 19c and 19d is exposed on the surface of the outer periphery of the lower cladding layer 18 which remains on the base substrate 16a.

In the forming of the separating grooves 25a, 25b, and 25c by dicing the lower cladding layer 18 or the upper cladding layer 20, as shown in FIG. 33, if the metallic thin film 22 is divided so that the separating grooves 25a, 25b, and 25c are diced deeper than the metallic thin film 22, the optical element placing portions 24a and 24b, i.e. the element mounting benches 33a and 33b can be electrically insulated.

Figure 34:
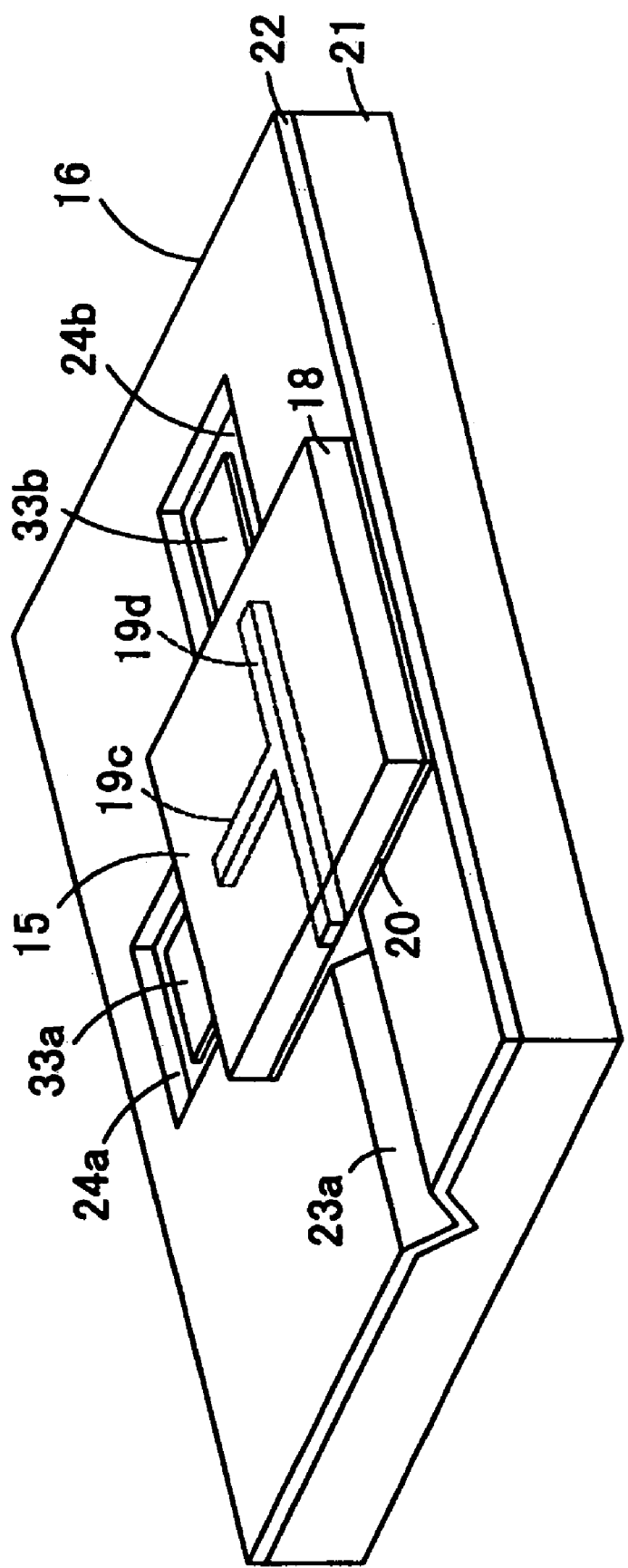
FIG. 34 shows a continued view of FIG. 33.

Then, the whole is cut along line E–E' and line F–F' of FIG. 33 to divide it into chips shown in FIG. 34, and the chip in which the optical waveguide substrate 15 is joined onto the substrate for mounting 16 is obtained. In the case that the unnecessary part of the lower cladding layer 18 or the upper cladding layer 20 remains, the unnecessary part is removed.

Though the separating grooves 25a, 25b, and 25c are formed by the dicing or the whole is divided into each chip by the dicing after the glass substrate 17a is removed, the sequence of the processes may be exchanged. That is, the glass substrate 17a may be removed after the separating grooves 25a, 25b, and 25c are formed by the dicing or the whole is divided into each chip by the dicing. The glass substrate 17a may be removed at the same time when the separating grooves 25a, 25b, and 25c are formed by the dicing or the whole is divided into each chip by the dicing. When the separating grooves 25a, 25b, and 25c are formed by the dicing or the whole is divided into each chip by the dicing after the glass substrate 17a is removed, since the glass substrate 17a can be re-used, cost of the manufacturing can be reduced.

Figure 35:
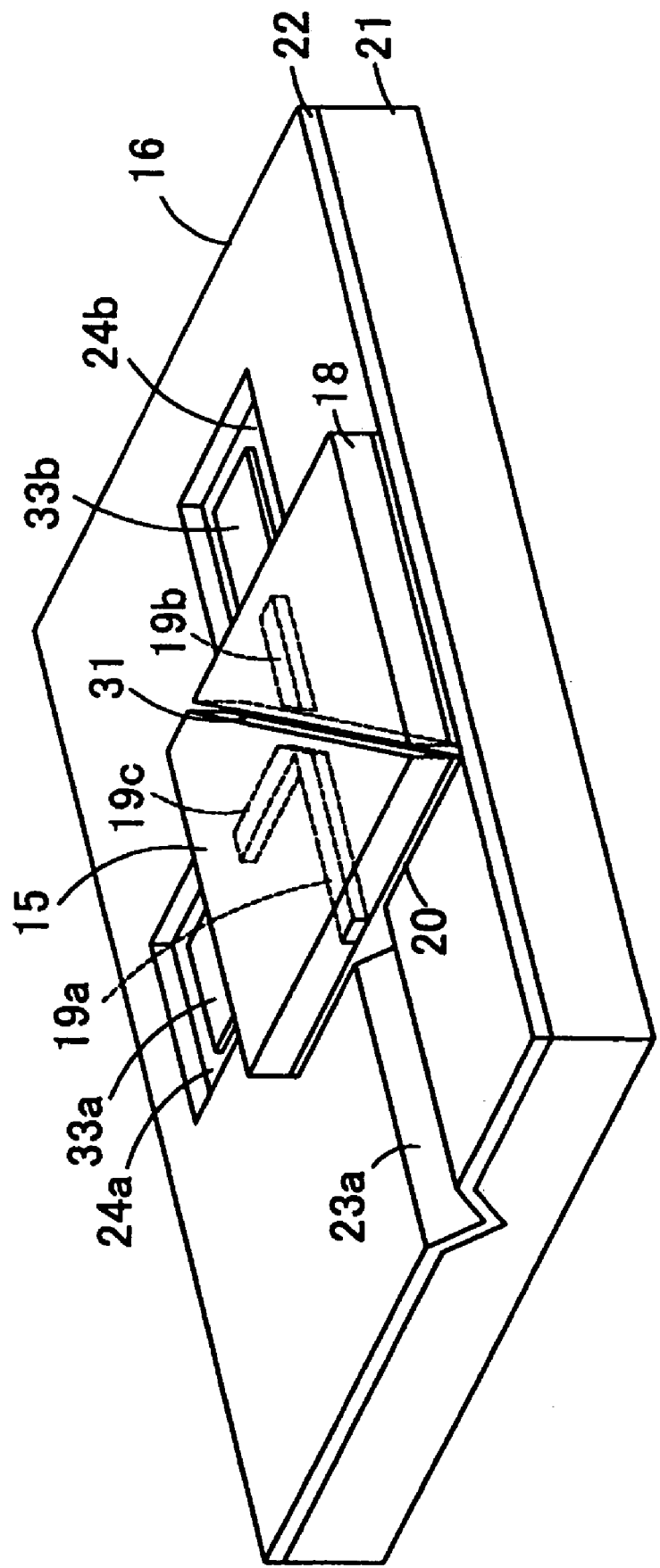
FIG. 35 shows a continued view of FIG. 34.

As shown in FIG. 35, the filter placing groove 31 is formed by making the cut in the lower cladding layer 18 with the dicing blade. At this point, the core 19d is divided to form the cores 19a and 19b. Finally the optical waveguide device 14f shown in FIG. 28 is completed by fitting the filter 29 using the multilayered reflecting film in the portion between the cores 19a and 19b of the filter placing groove 31. The filter 29 may be projected from the upper surface of the lower cladding layer 18.

In the manufacturing method of the optical waveguide device of the embodiment, the optical waveguide mother board 15a having the large area and the base substrate 16a having the large area are bonded with the upper cladding layer 20 and it is divided into the individual chip of the optical waveguide device 14f in the final process, so that the optical waveguide device 14f can be efficiently manufactured compared with the bonding of the individual optical waveguide substrate 15 and the individual substrate for mounting 16 and the manufacturing method of the embodiment is fit to the mass production. Since the base substrate 16a having the large area and the optical waveguide motherboard 15a having the large area are bonded, the alignment can be performed more precisely compared with the alignment between the small components.

In the optical waveguide device 14*f*, it is necessary to expose finally the optical fiber guide 23*a* and the optical element placing portions 24*a* and 24*b*. In the manufacturing method of the optical waveguide device of the embodiment, the adhesion of the bonding resin 20*a* (upper cladding layer 20) is weakened by previously forming the metallic thin film 22 on the base substrate 16*a* in the region corresponding to the unnecessary part of the optical waveguide mother board 15*a*. Therefore, even if all the surfaces of the optical waveguide mother board 15*a* and the base substrate 16*a* are bonded, the unnecessary part of the lower cladding layer 18 or the upper cladding layer 20 can be easily removed and the manufacturing process can be further simplified.

In the embodiment, the waveguide fixing region 30 is exposed from the metallic thin film 22. The other hand, the metallic thin film 22 may be also formed on the surface of the waveguide fixing region 30. Though the unnecessary part of the lower cladding layer 18 or the upper cladding layer 20 can be easily removed from the metallic thin film 22 by applying force, since the bonding state between the unnecessary part and the supporting substrate 21 are held in the optical waveguide substrate 15 in which the cores 19*a*, 19*b*, and 19*c* and the like are formed unless the peeling off is performed by applying the force, the unnecessary part does not become the obstacle.

In the above embodiments, the glass substrate 17*a* or the cover glass 17 is finally removed, so that only the waveguide region which does not include the cover glass 17 on the opaque supporting substrate 21 can be formed. That is, in the case that the cladding or the like is formed by using the ultraviolet-curing resin, the ultraviolet-curing resin can not be irradiated with the ultraviolet ray when the ultraviolet-curing resin is applied on the opaque substrate to hold it down with a metal mold, so that the waveguide region can not be formed. However, by adopting the method like the embodiment, the waveguide region can be also formed on the opaque substrate.

Accordingly, since the excess cover glass 17 is eliminated, the optical waveguide device 14*f* can be thinned. In the case that the filter placing groove 31 is provided, only the waveguide region such as the lower cladding layer 18 may be cut by the dicing in such a manner that the excess cover glass 17 is previously removed before the filter placing groove 31. Thus, the groove having narrower width can be formed. That is, if the dicing is performed with the cover glass 17 attached, since the blade may be cracked in the case of the thin dicing blade (for example, the blade having the width not more than about 50 μm), the dicing cannot be performed. However, such restriction is eliminated by removing the cover glass 17. Further, when the glass substrate 17*a* is removed by the peeling-off, the glass substrate 17*a* can be re-used and the cost of the manufacturing can be reduced.

Figure 36:
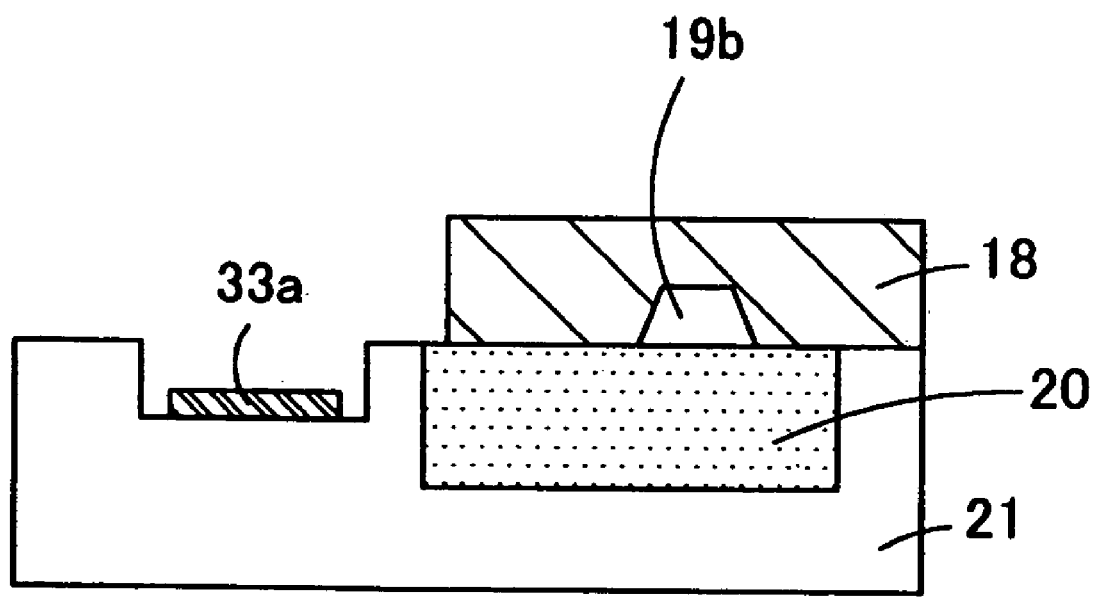
FIG. 36 shows a schematically sectional view of the optical waveguide device according to still another embodiment of the invention.

FIG. 36 is the schematically sectional view showing a modification of the above-described embodiments. In the modification, the width is broad on the side close to the upper cladding layer 20 or the supporting substrate 21 and the width is narrow on the side far away from the upper cladding layer 20 or the supporting substrate 21 in the cross section of the cores 19*a*, 19*b*, and 19*c*, for example the cross section is a trapezoid shape. In case that the cross section of the cores 19*a*, 19*b*, and 19*c* is formed in such a shape, the core groove 35 becomes broader in a direction in which a stamper 34*a* is drawn in forming the core groove 35 in the lower cladding layer 18 with the stamper 34*a* (see FIG. 9). The nature of peel-off can be improved between the stamper 34 and the lower cladding layer 18.

Seventh Embodiment

Figure 37:
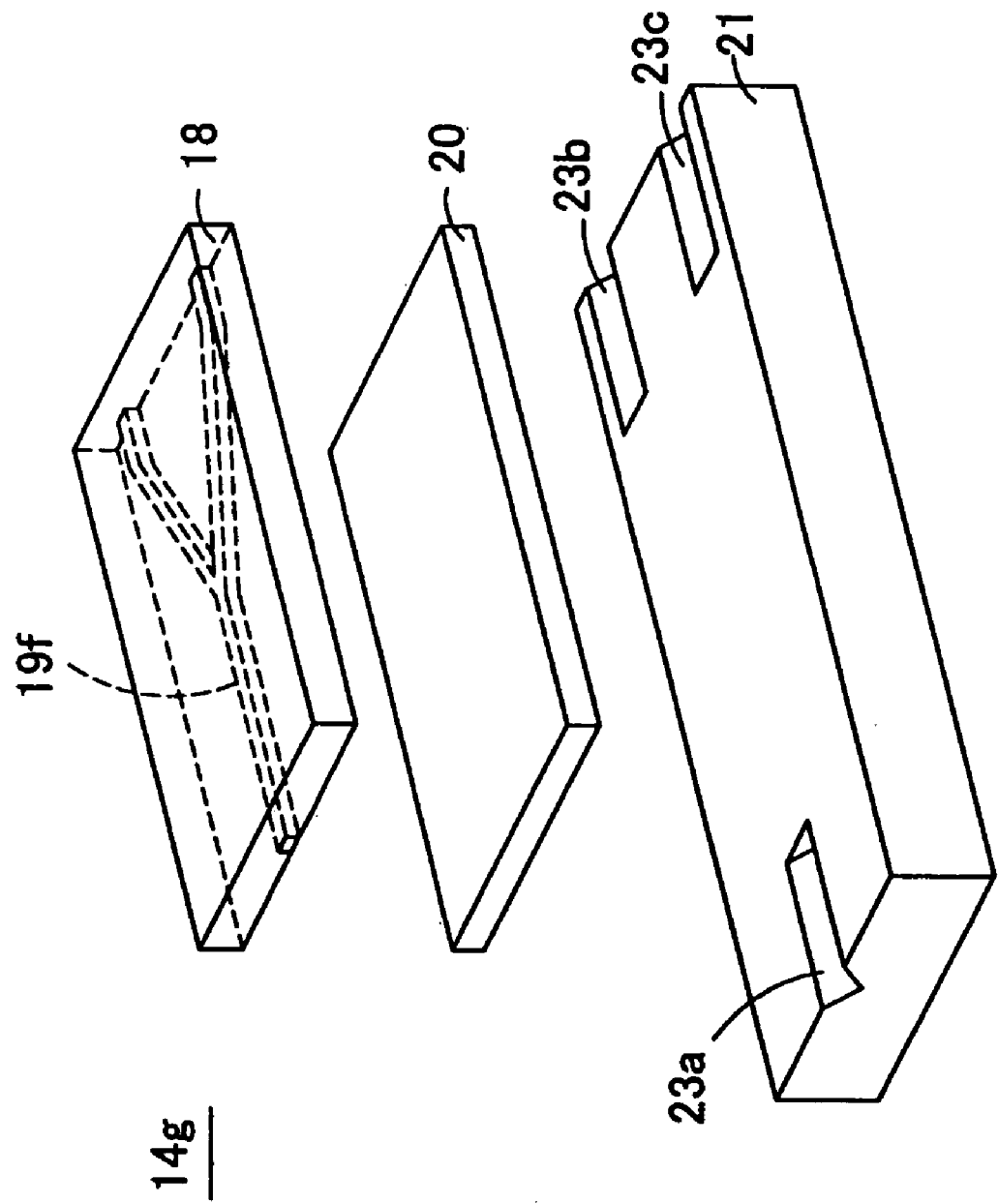
FIG. 37 shows an exploded perspective view of the optical waveguide device according to still another embodiment of the invention.

Similarly to the sixth embodiment, as to the optical waveguide devices mentioned after the second embodiment, the cover glass 17 can be also removed. FIG. 37 is the exploded perspective view showing an optical waveguide device (two-branch coupler with optical fiber guide) 14*g* having the same structure for the fourth embodiment shown in FIG. 21. However, in the optical waveguide device 14*g*, the opaque substrate such as the silicon substrate is used as the supporting substrate 21 having the optical fiber guides 23*a* to 23*c*, and the lower cladding layer 18 in which the core 19*f* is formed is bonded to the supporting substrate 21 through the upper cladding layer 20.

Similarly to the seventh embodiment, the optical waveguide device 14*g* is produced in such a manner that the core 19*f* is filled in the core groove of the lower cladding layer 18, which is formed on the upper surface of the transparent cover glass 17, the lower cladding layer 18 is bonded to the supporting substrate 21 with the ultraviolet-curing resin, similarly to FIG. 22 the upper cladding layer 20 is formed by partly irradiating the ultraviolet-curing resin with the ultraviolet ray to cure it, and the cover glass 17 is removed before or after the unnecessary parts of lower cladding layer 18 and upper cladding layer 20 is removed.

Eighth Embodiment

Figure 38:
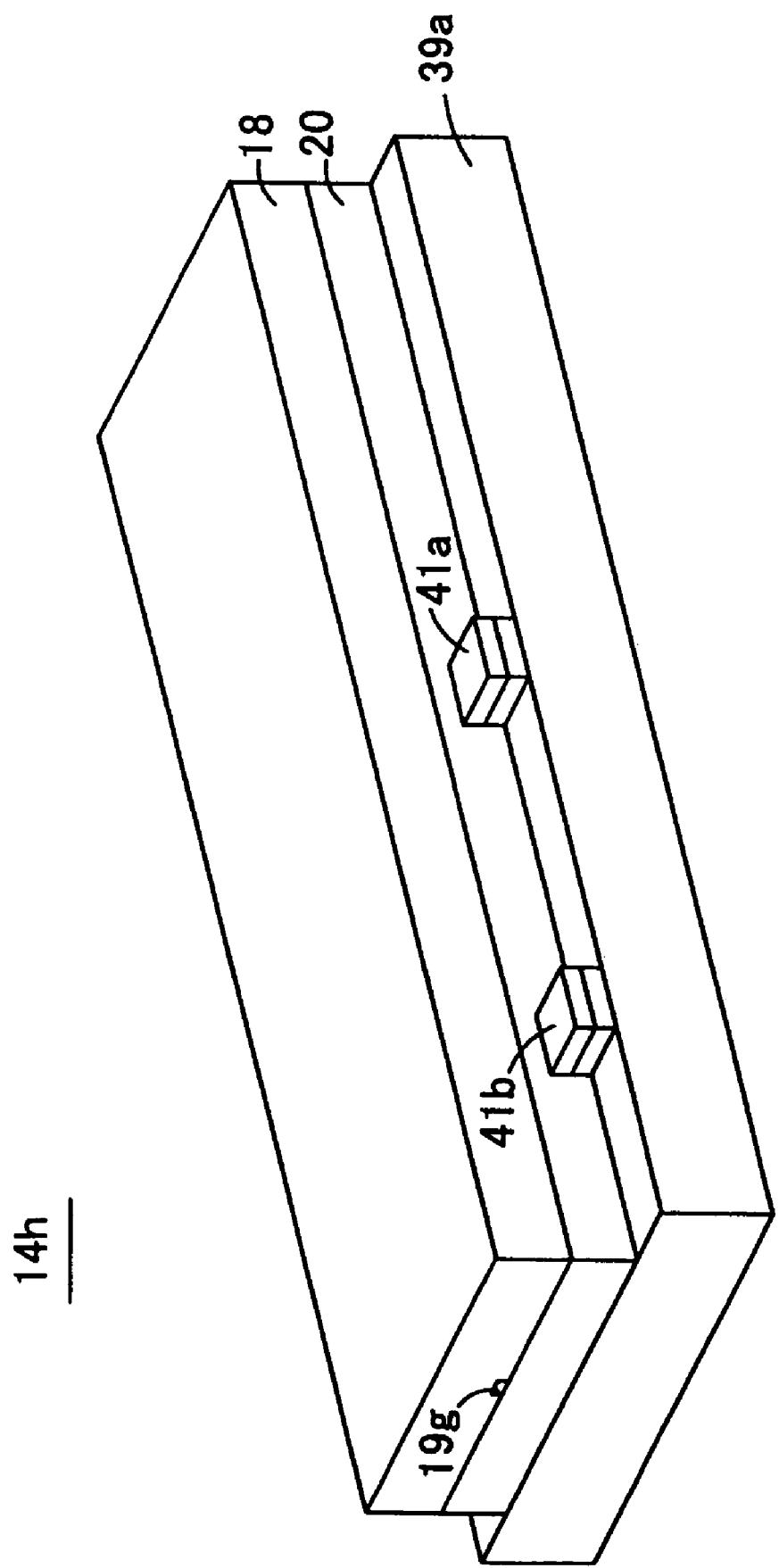
FIG. 38 shows a perspective view of the optical waveguide device according to still another embodiment of the invention.
Figure 39:
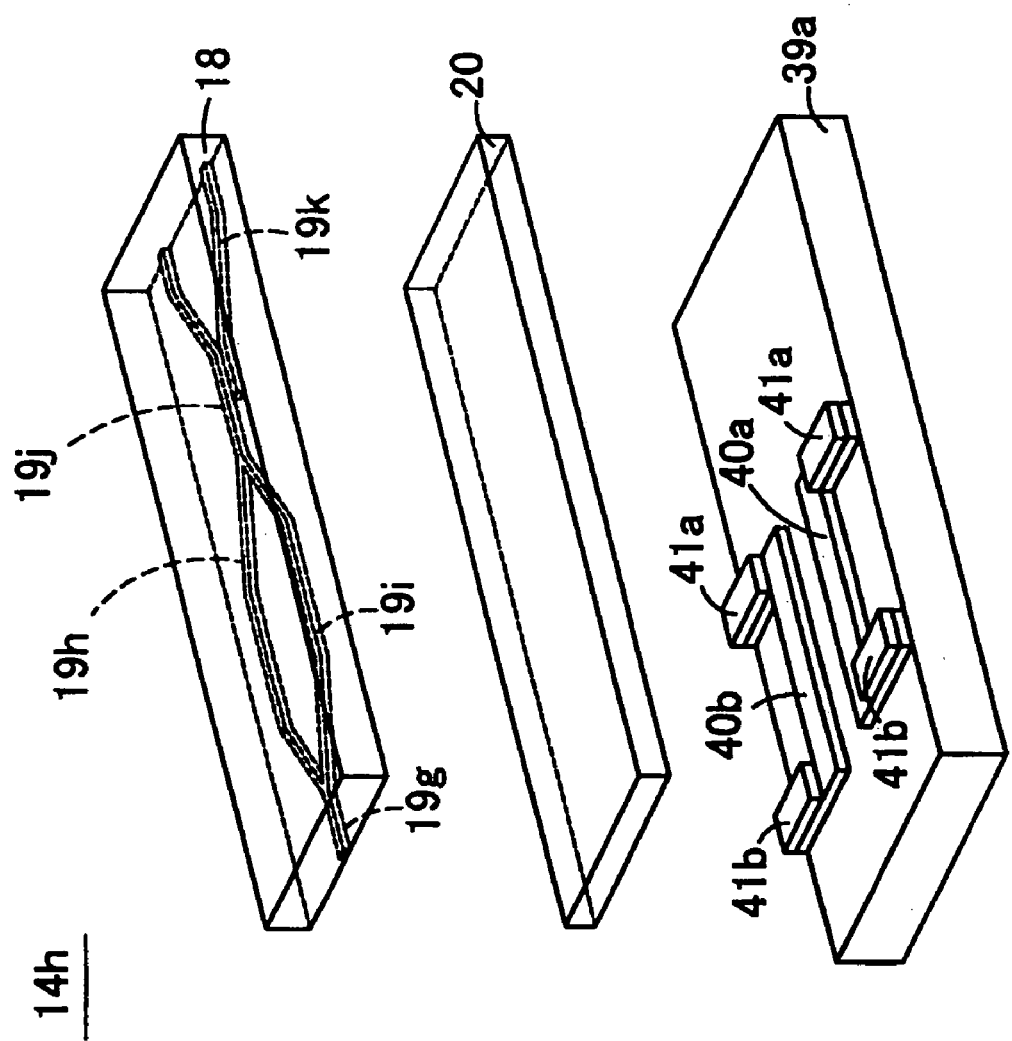
FIG. 39 shows an exploded perspective view of the optical waveguide device shown in FIG. 38.
Figure 40:
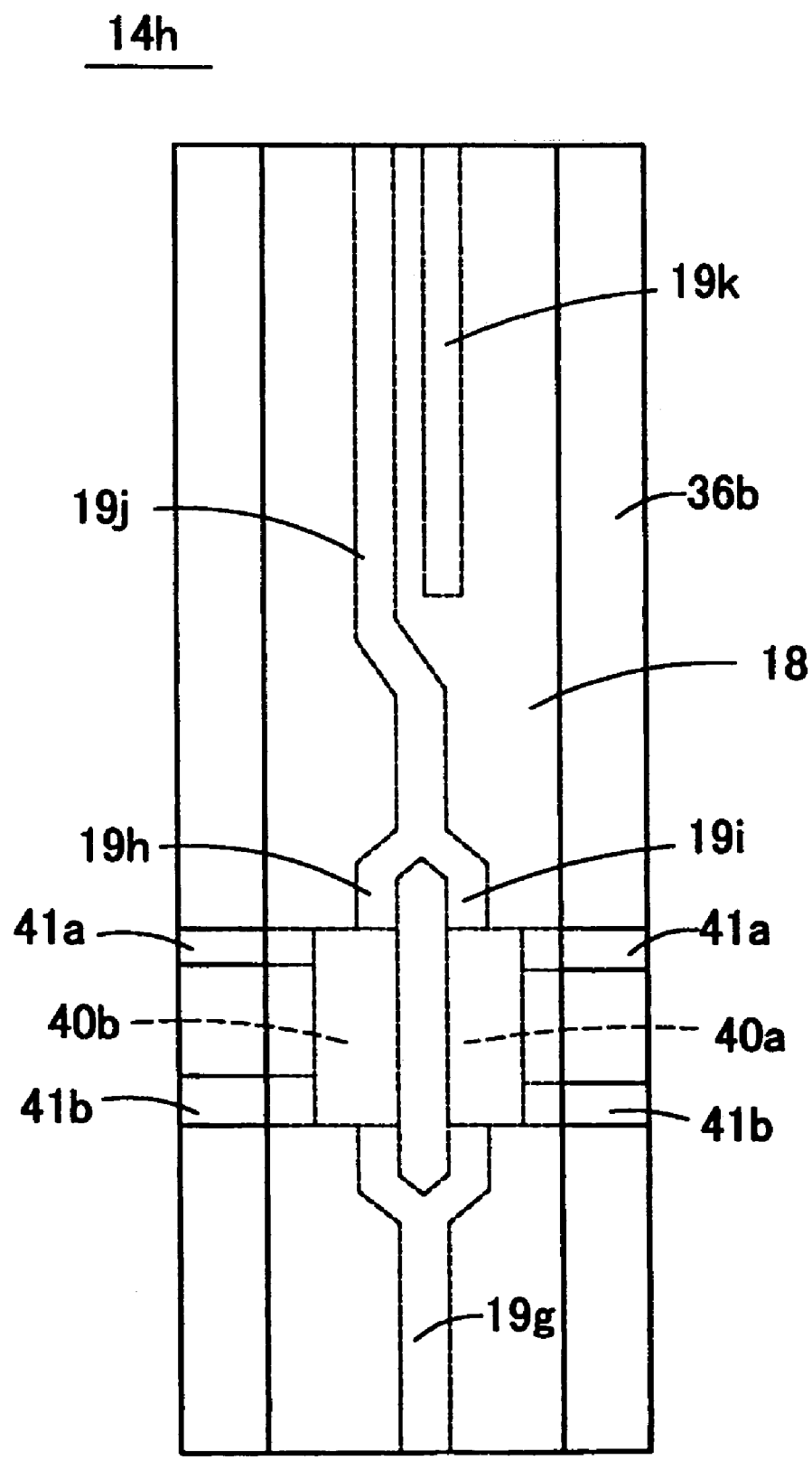
FIG. 40 shows a plane view of the optical waveguide device shown in FIG. 38.

FIGS. 38, 39, and 40 show the schematically perspective view, the schematically exploded perspective view, and the schematic plane view of an optical waveguide device 14*h* (optical attenuator) according to still another embodiment of the invention respectively. The optical waveguide device 14*h* of the embodiment is one in which the cover glass 17 is eliminated from the structure of the optical waveguide device 14*e* according to the fifth embodiment shown in FIGS. 23 to 25.

Figure 41:
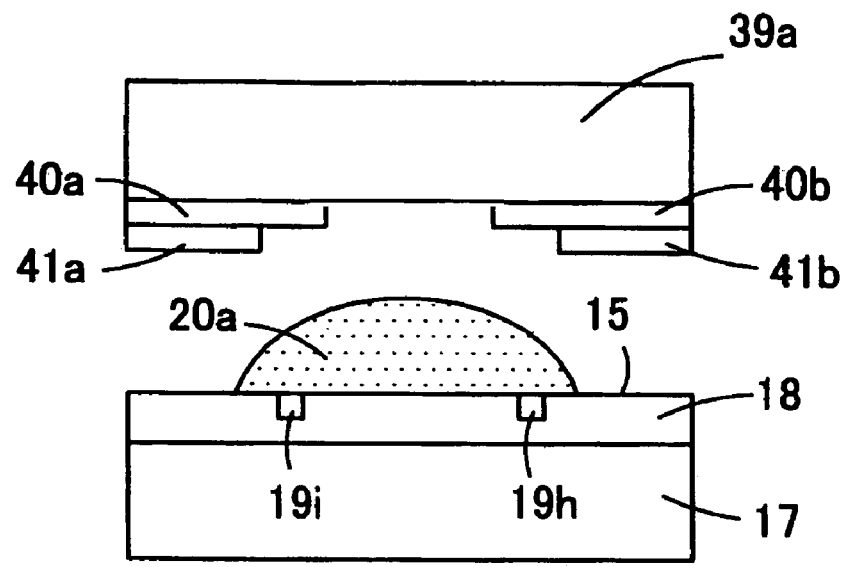
FIG. 41 shows a schematically sectional view explaining the manufacturing method of the optical waveguide device shown in FIG. 38.
Figure 41:
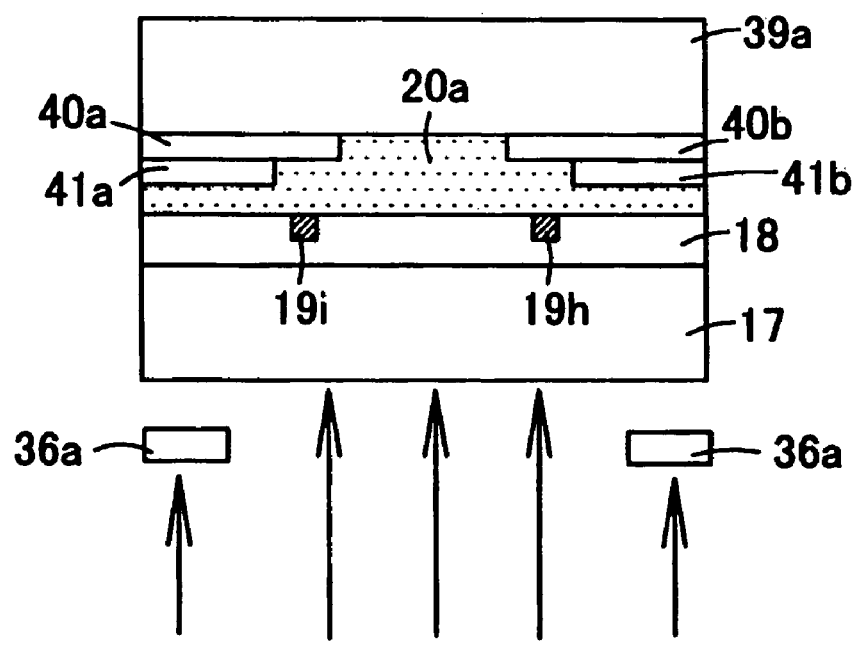

FIGS. 41A and 41B and FIGS. 42A and 42B describe the manufacturing method of the optical waveguide device 14*h* of the invention. An opaque silicon substrate 39*a* of which the heaters 40*a* and 40*b* and the pads 41*a* and 41*b* are formed on the lower surface, shown in FIG. 41A, is produced in the same processes as those shown in FIGS. 26A, 26B, and 26C. In the optical waveguide substrate 15 shown in FIG. 41A, similarly to the first embodiment, the lower cladding layer 18 and the cores 19*g* to 19*k* are formed on the transparent cover glass 17 by the duplicating method using the resin. As shown in FIG. 41A, the uncured ultraviolet-curing resin 20*a*, which has the same refractive index as that of the lower cladding layer 18 or the refractive index similar to that of the lower cladding layer 18, is dropped onto the surface of the lower cladding layer 18 in the optical waveguide substrate 15 to bond the silicon substrate 39*a* on which the electrode lead pads 41*a* and 41*b* and the heaters 40*a* and 40*b* are formed.

At this point, as shown in FIG. 41B, a part where it is not necessary to form the upper cladding layer 20 is covered with the mask 36*a* from the lower surface of the cover glass 17, and the upper cladding layer 20 is formed in such a manner that the ultraviolet-curing resin 20*a* is irradiated with the ultraviolet ray from the lower side of the mask 36*a* to cure it.

Figure 42:
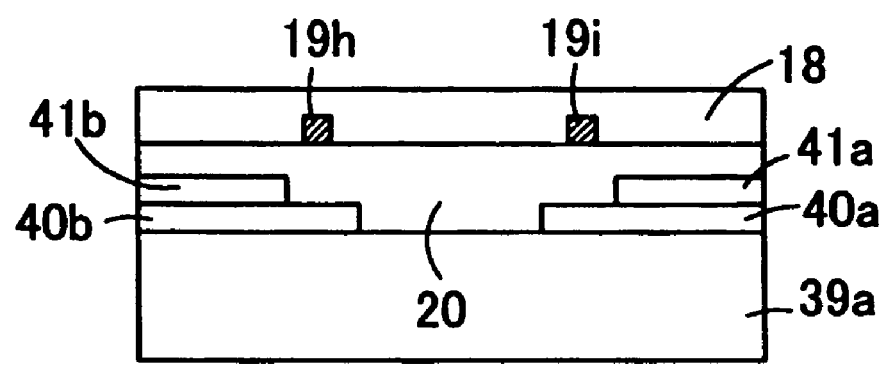
FIGS. 42A and 42B show continued views of FIG. 41.
Figure 42:
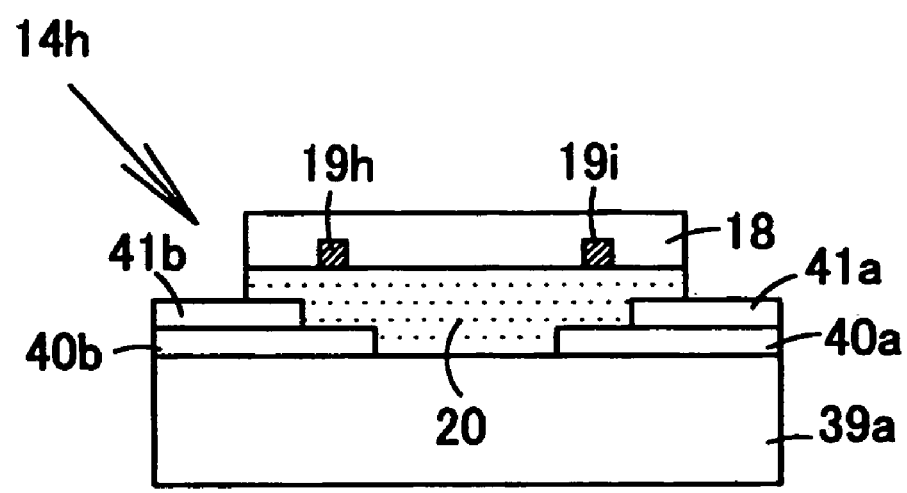

As shown in FIG. 42A, the cover glass 17 is cut off with the dicing blade while the optical waveguide device is inversely turned around so that the silicon substrate 39*a* is placed on the lower side and the cover glass 17 is placed on the upper side. Even in this case, with reference to the method for removing the cover glass 17, the cover glass 17 may be mechanically peeled off from the lower cladding layer 18 by applying force to the cover glass 17 or the cover glass 17 may be dissolved by the etching or the like to remove it. In the case that the cover glass 17 is peeled off, the material having low adhesion properties may be previously formed between the cover glass 17 and the lower cladding layer 18 or processing which reduce the adhesion properties between the cover glass 17 and the lower cladding layer 18 may be previously performed to the cover glass 17. In the case that the adhesion properties of the cover glass 17 and the lower cladding layer 18 is too low and the surface treatment is performed in order to improve the adhesion properties, the conditions for improving the adhesion properties may be released. In the case that the cover glass 17 is removed by the etching, it is desirable to selectively etch the cover glass 17 by using the etchant which could not etch the lower cladding layer 18.

Further, as shown in FIG. 42B, the optical waveguide device 14h shown in FIG. 38 is completed in such a manner that the unnecessary part of the lower cladding layer 18 is cut off with the dicing blade and the electrode lead pads 41a and 41b are exposed. The cut-off lower cladding layer 18 and the remaining uncured resin 20a are washed away with the cooling water of the dicing blade. In the case that the ultraviolet-curing resin 20a is not thoroughly washed away with the cooling water of the dicing blade, the ultraviolet-curing resin 20a may be thoroughly removed by further using the solvent.

Ninth Embodiment

Figure 43:
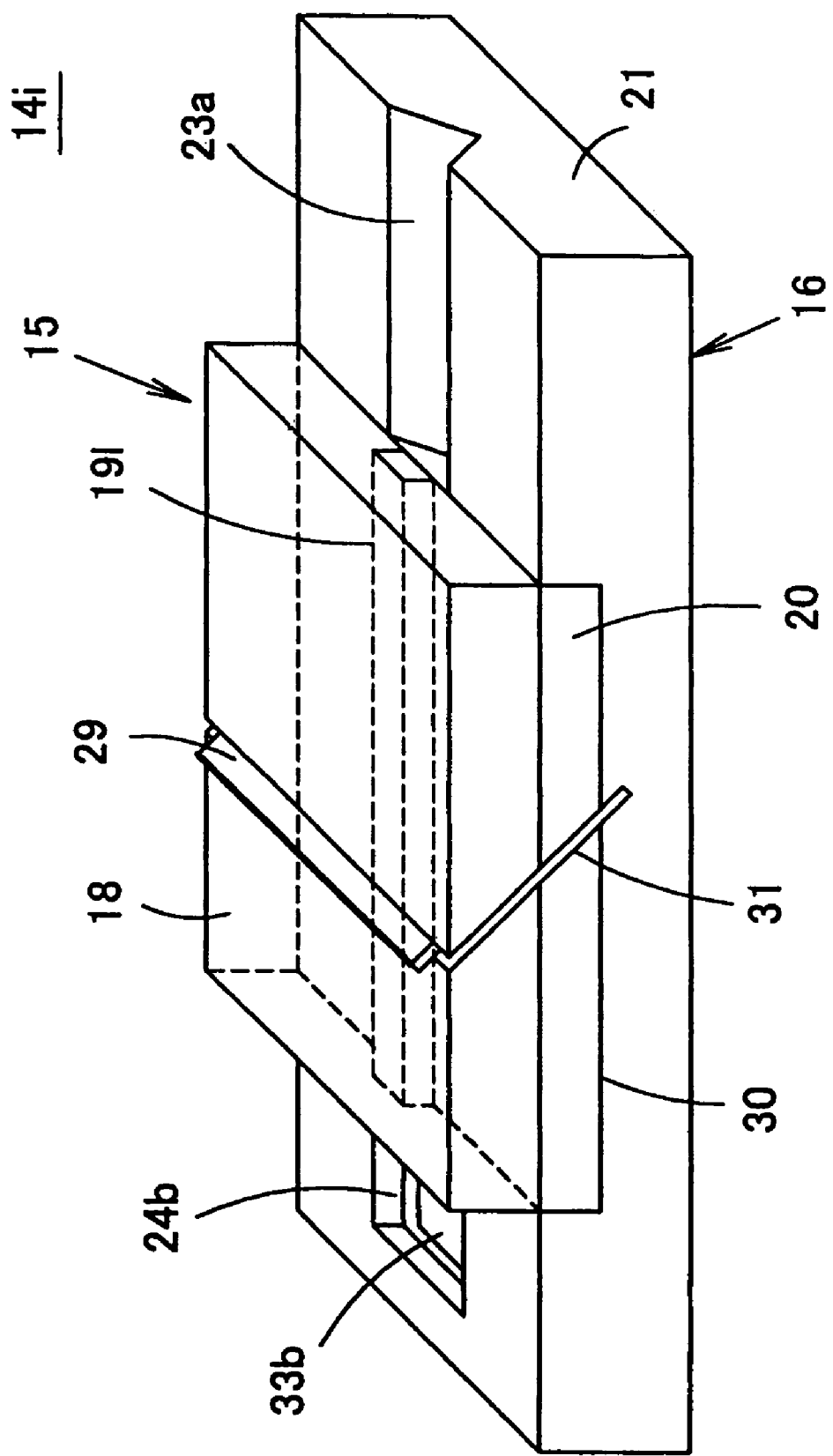
FIG. 43 shows a perspective view of the optical waveguide device according to still another embodiment of the invention.

FIG. 43 is the perspective view showing the structure of an optical waveguide device 14i according to still another embodiment of the invention. In the substrate for mounting 16 of the optical waveguide device 14i, the optical element placing portion 24b is provided in order to mount the light emitting element on the upper surface of the opaque supporting substrate 21 such as the silicon substrate, the element mounting bench 33b is provided inside the optical element placing portion 24b, the V-groove shaped optical fiber guide 23a is provided on one end of the supporting substrate 21 so as to be opposite to the optical element placing portion 24b, and the waveguide fixing region 30 is provided in the form of the concavity between the optical element placing portion 24b and the optical fiber guide 23a. A line-shaped core 191 is embedded in the lower surface of the lower cladding layer 18 and the upper cladding layer 20 is provided on the lower surface of the lower cladding layer 18. The optical waveguide substrate 15 is fixed on the substrate for mounting 16 so that the upper cladding layer 20 is embedded in the waveguide fixing region 30. The optical waveguide device 14i is also produced by removing the cover glass 17 in the same way as the sixth embodiment. The filter placing groove 31 is obliquely cut by the dicing in the lower cladding layer 18 and the upper cladding layer 20, and the filter 29 such as a WDM filter is inserted in the filter placing groove 31.

Figure 44:
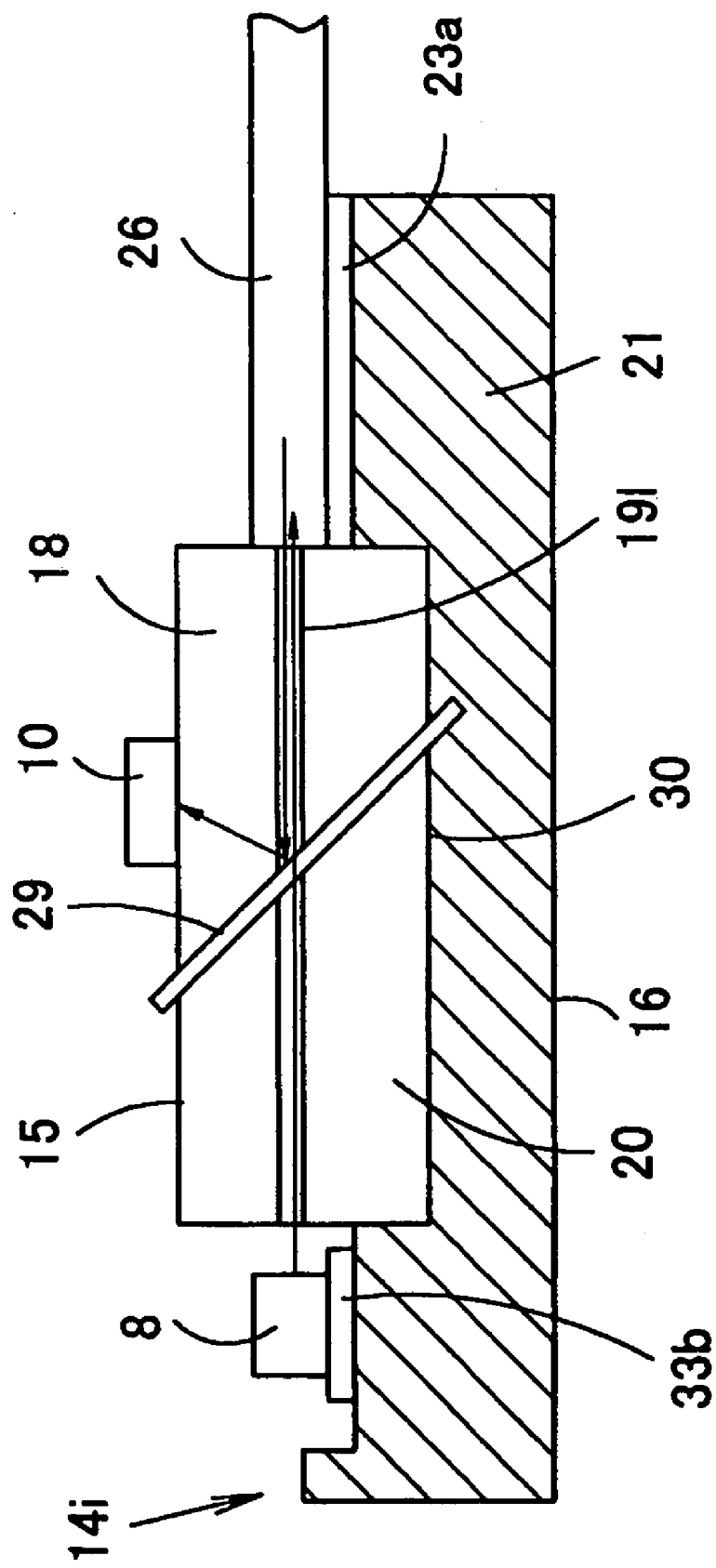
FIG. 44 shows a sectional view of an optical transceiver which is constituted by the optical waveguide device shown in FIG. 43.

FIG. 44 shows the state in which the optical waveguide device 14i is used as the optical transceiver. A light emitting element 8 is mounted on the element mounting bench 33b so that the light outgoing surface of the light emitting element 8 is opposite to the end face of the core 191. A chip-shaped or package type of light receiving element 10 is fixed on the upper surface of the lower cladding layer 18 while a light receiving surface of the light receiving element 10 faces downward. The optical fiber 26 is fixed in the optical fiber guide 23a so as to be opposite to the end face of the core 191.

The light outgoing from the light emitting element 8 propagates in the core 191, passes through the filter 29, and reaches the optical fiber 26. The light outgoing from the optical fiber 26 propagates through the core 191 to be reflected by the filter 29, and then the light is transmitted by the lower cladding layer 18 to be received by the light receiving element 10.

Figure 45:
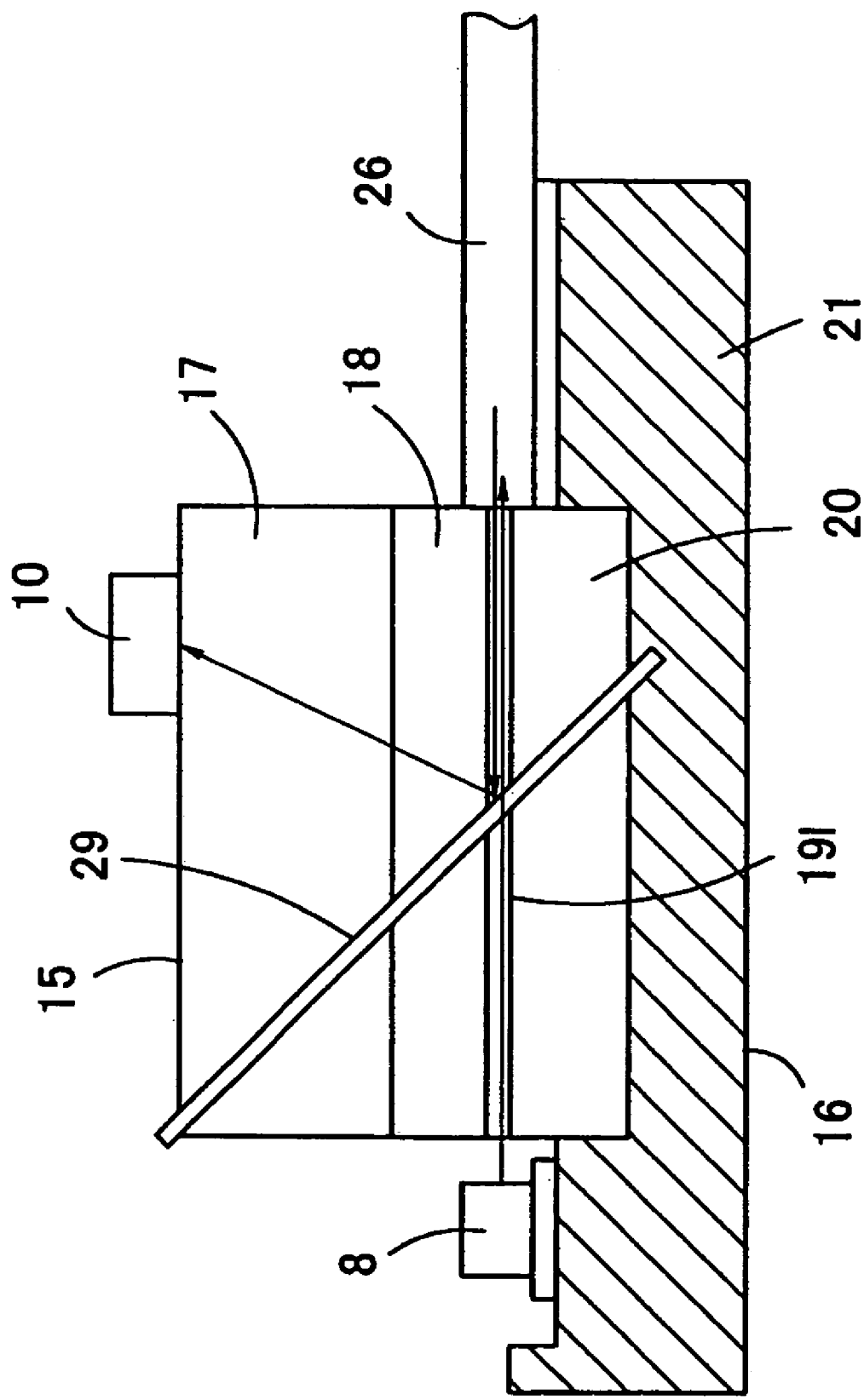
FIG. 45 shows a sectional view illustrating a comparative example to the optical waveguide device shown in FIG. 43.

FIG. 45 is the comparative example for comparing to the optical waveguide device 14i. In the optical waveguide device of the comparative example, the cover glass 17 remains on the lower cladding layer 18 and the light receiving element 10 is provided on the upper surface of the cover glass 17. In the comparative example, while the thickness of the lower cladding layer 18 is about 20 μm, the thickness of the cover glass 17 is in the range of about 500 to about 1000 μm, so that the distance between the reflecting position of the light by the filter 29 and the light receiving element 10 becomes farther and the reflected light is widened. Consequently, the light quantity which is detected by the light receiving element 10 becomes very small and light receiving sensitivity is decreased.

On the other hand, in the optical waveguide device 14i of the invention, since the distance between the reflecting position of the light by the filter 29 and the light receiving element 10 can be reduced by the distance in which the cover glass 17 is absent, the light receiving sensitivity can be improved.

The comparison of the light receiving quantity in the optical waveguide device 14i according to the invention and the comparative example is as follows. Supposing that the thickness of the lower cladding layer 18 is 20 μm and the thickness of the cover glass 17 is 1000 μm (=1 mm) (for example, the oblique angle of the filter is set to 40°), the distance from the reflected point by the filter 29 to the light receiving element is 20.3 μm in the case that only the lower cladding layer 18 is provided, and the distance from the reflected point by the filter 29 to the light receiving element is 1036 μm in the case that the cover glass 17 is provided. Accordingly, the ration of the light receiving quantity is about 1/2601 (the ratio is about 1/676 in case that the thickness of the cover glass 17 is set to 500 μm). In order to obtain the same light receiving quantity, the light receiving element having the about 2600 times light receiving area is required in the case that the cover glass 17 is provided, so that the cost of the light receiving element 10 is quite increased. Further, capacitance of the light receiving element is increased as the light receiving area is increased. Since the communication speed is inversely proportional to the light receiving area, when the light receiving element 10 having such a large area is used, it is impossible to perform the high-speed communication, and it cannot be practically used.

Figure 46:
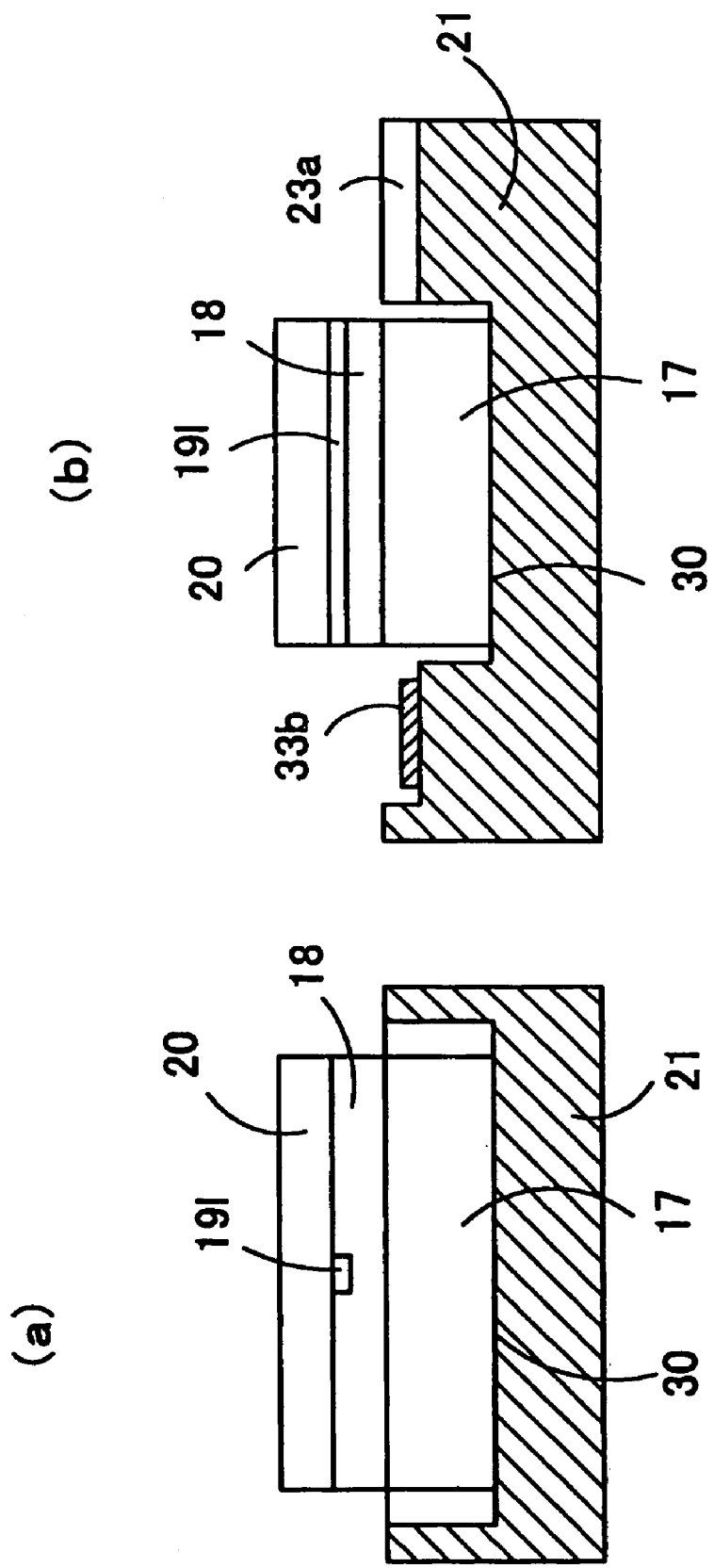
FIGS. 46A and 46B show schematically sectional views illustrating another comparative example.

With reference to the method for shortening the distance between the filter and the light receiving element while the cover glass 17 remains, as shown in FIGS. 46A and 46B, it is considered that the waveguide fixing region 30 is provided in the form of the concavity in the supporting substrate 21 made of the silicon substrate, the cover glass 17 of the optical waveguide substrate 15 faces to the lower side, and the cover glass 17 is stored in the waveguide fixing region 30. However, in such a structure, the waveguide fixing region 30 having the same depth as the thickness (500 to 1000 μm) of the cover glass 17 need to be provided in the supporting substrate 21 by the etching. Therefore, dispersion in accuracy of the depth of the waveguide fixing region 30 is too large, and it is absolutely impossible to adjust the height of the core of the optical fiber to the height of the core 191 of the waveguide.

For example, an average value of the amount of dispersion is about ±10% when the silicon substrate is etched with KOH having an etching rate of 0.5 to 1.0 μm/m for 17 to 33 hours. Supposing that the amount of dispersion in the etching is a normal distribution and standard deviation is set to σ, the average value is ±10% ±4σ, and it occupies the most part of the area in the normal distribution curve. On the other hand, when the amount of dispersion is suppressed within ±1 μm, the normal distribution has the width of ±1 μm=±0.04σ and it becomes about 3.2% of the area in the normal distribution. Yield becomes about 1/30, so that the cost is increased to about 30 times. Therefore, the structure shown in FIG. 46 has no practicality.

Tenth Embodiment

Figure 47:
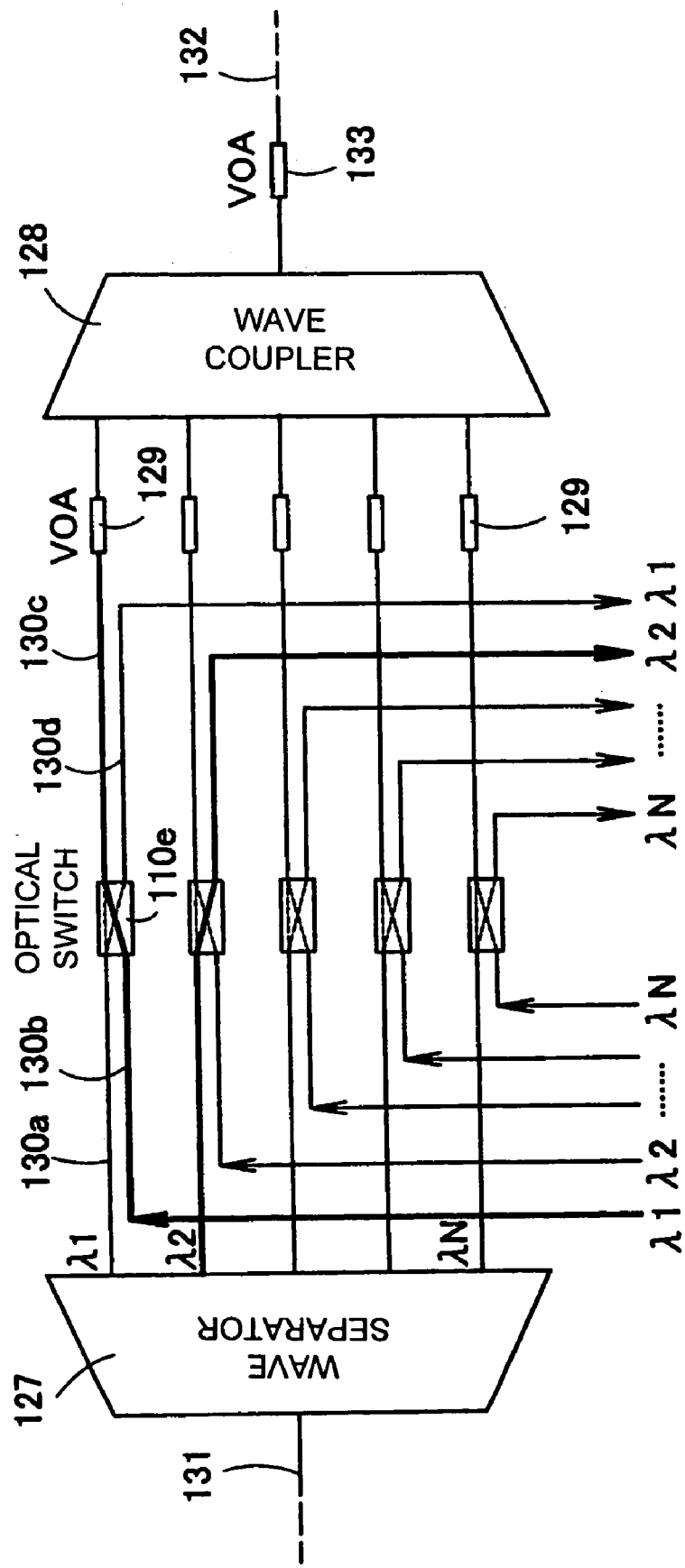
FIG. 47 shows a view explaining an optical communication apparatus which utilizes the optical waveguide device according to the invention.

FIG. 47 is the schematic view showing an apparatus for coupling and separating a light wave, in which the optical attenuators 129 and 133 according to still another embodiment of the invention are used (for example, the optical waveguide device shown in FIGS. 23 and 24). The wave separator 127 and the wave coupler 128 are the device which is used in the wavelength division multiplexed (WDM) optical communication system which transmits the plurality of optical signals having the different wavelengths with one optical fiber 131. The wave separator 127 is the device in which the optical signal transmitted with the one optical fiber 131 is separated in each wavelength to output each wavelength to the different optical fibers respectively. The wave coupler 128 is the device in which the optical signals having the different wavelengths inputted with the plurality of optical fibers are coupled to output it to the one optical fiber 132. The optical waveguide device according to the invention may be used as an optical switch 110e.

The optical switch 110e (2×2 optical switch) is the optical waveguide device which can switch a traveling direction of the light propagating through the core and radiate the light only from the selected core. The variable optical attenuators (VOA) 129 and 133 show the same as the one shown in the fifth embodiment. Two entrances of light incident are provided in each optical switch 110e, one of the two entrances of light incident is connected to the wave separator 127 with an optical fiber 130a, and the light beams having the wavelengths λ1, λ2, ..., λN separated with the wave separator 127 is inputted to the one light incident end. The other is the entrance of incident of the light signal transmitted with an optical fiber 130b which in not connected to the wave separator 127. The optical fiber 130b may be connected to other wave separator except the wave separator 127.

Further, two light outgoing ends are provided in each optical switch 10e, one of the two light outgoing ends is connected to the wave coupler 128 through the variable optical attenuators (VOA) 129 with an optical fiber 130c, and the other of the two light outgoing ends is connected to an optical fiber 130d which in not connected to the wave coupler 128. The optical fiber 130d may be connected to another wave coupler except the wave coupler 128.

In the optical communication system using the wave coupler and separator, for example, the optical fibers 131 and 132 constitute a trunk network line in a network within city or an intercity network and transmit the wavelength division multiplexed signal. Supposing that all the optical switches 110e are connected to the side of the wave coupler 128, after the wavelength division multiplexed signal transmitted through the trunk network line including the optical fiber 131 is separated into the light beams having the wavelengths λ1, λ2, ..., λN by the wave separator 127, the signal passes through each optical switch 110e to the side of the wave coupler, power of the signal of each wavelength is uniformed with the optical attenuator 129, the signal of each wavelength λ1, λ2, ..., λN is coupled again with the wave coupler 128, the power of the whole wavelength division multiplexed signals is adjusted with the optical attenuator 133 so as to be set to a specified value, and the signal is transmitted to the trunk network line.

On the other hand, for example, if the optical switch 110e corresponding to the wavelength λ1 is switched to the side different from the side of the wave coupler, only the signal of the wavelength λ1 among the signals separated by the wave separator 127 is taken out to an access network line including the optical fiber 130d. If the signal of the wavelength λ1 has been transmitted from the access network line including the optical fiber 130b, the signal of the wavelength λ1 from the line is transmitted to the wave coupler 128 with the optical switch 11e, superimposed on the wavelength division multiplexed signal transmitted from the optical fiber 131 to be outputted to the trunk network line including the optical fiber 132.

In the optical network system, it is necessary that a user network in each home is connected to the trunk network with the access network (subscriber optical network), and an optical network unit for performing opto-electric conversion is required between the access network and the user network. Further, an optical line terminal for performing the opto-electric conversion is required at an exchange office (facilities center of telephone network operator) between the access network and trunk network.

Figure 48:
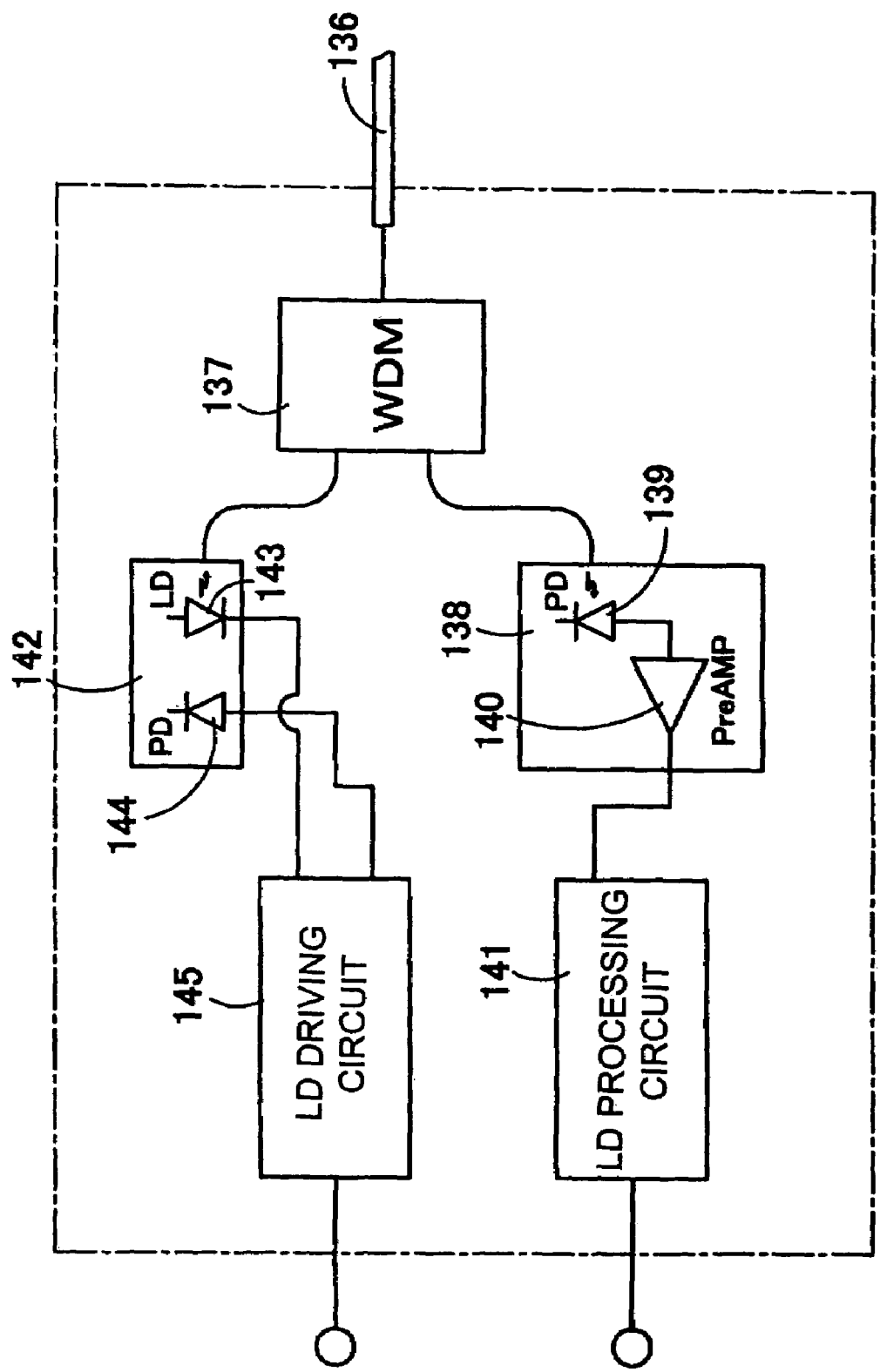
FIG. 48 shows a block diagram illustrating a configuration of an optical network unit.

FIG. 48 is a block diagram showing a configuration of the above-described optical network unit. A reference numeral of 136 indicates the optical fiber constituting the access network, and the optical fiber transmits the optical signal having the wavelength of 1550 nm and the optical signal having the wavelength of 1310 nm. WDM 137 is provided at the position opposite to the end face of the optical fiber 136. In WDM 137, the optical signal having the wavelength of 1550 nm transmitted through the optical fiber 136 is outputted from an outputting portion and the optical signal having the wavelength of 1310 nm inputted from an inputting portion is connected to the optical fiber 136.

The optical signal having the wavelength of 1550 nm outputted from the outputting portion in WDM 137 is inputted into an opto-electric conversion module (PIN-AMP module) 138. The opto-electric conversion module 138 includes a photo diode 139 and a preamplifier 140. In the opto-electric conversion module 138, the inputted optical signal is received with the photo diode 139 to convert it into the electric signal, amplified with the preamplifier 140, and inputted to a data processing circuit 141. Then, the electric signal processed with the data processing circuit 141 is transmitted to a telephone or a controller for home use, which is connected to the optical network unit.

On the other hand, an opto-electric conversion module 142 connected to the inputting portion in WDM 137 includes a laser diode 143 and a light receiving element for monitoring 144. The laser diode 143 emits the light having the wavelength of 1310 nm, and the laser diode 143 is driven by a laser diode driving circuit 145. The output is controlled so that the power of the optical signal emitted from the laser diode 143 becomes constant in such a manner that the optical signal emitted from the laser diode 143 is received with the light receiving element for monitoring 144. Accordingly, the electric signal transmitted from the telephone or the home appliance is transmitted to the laser diode driving circuit 145, the electric signal is converted into the optical signal in such a manner that the laser diode 143 is driven by the electric signal inputted into the laser diode driving circuit 145, and the optical signal is transmitted to the optical fiber 136 through WDM 137.

In the above-described optical network unit, the optical network unit can be miniaturized by using the optical waveguide device according to the invention. For example, the filter 29 and the cores 19a, 19b, and 19c in the optical waveguide device (optical transceiver) 14a described from FIG. 3 may be used as WDM 137, the light receiving element 27 mounted on the optical waveguide device 14a may be used as the light receiving element 139 in the opto-electric conversion module 138, and the light emitting element 28 mounted on the optical waveguide device 14a may be used as the laser diode 143 in the opto-electric conversion module 142. The optical network unit can be formed in one-chip by mounting the preamplifier 140, the data processing circuit 141, the light receiving element for monitoring 144, the laser diode driving circuit 145, and the like on the supporting substrate 21 of the optical waveguide device 14a.

Though the case of the optical network unit (ONU) was described here, the optical waveguide device of the invention can be also used for the optical line terminal (OLT).

According to the manufacturing method of the optical waveguide device of the invention, the unnecessary part generated in the mass production of the optical waveguide device can be easily removed. Further, since it is not necessary to provide the additional process for the removal of the unnecessary part, the manufacturing process can be simplified, the time taken for producing the optical waveguide device can be shortened, and the cost of the manufacturing can be suppressed.

According to the manufacturing method of other optical waveguide device of the invention, the optical waveguide device can be thinned.

While the invention has been described with respect to a limited number of embodiments, those who skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of manufacturing an optical waveguide device, comprising:
    forming a first substrate, wherein the step of forming the first substrate includes forming at least one optical waveguide region in a manner of applying photo-curing resin onto a plate, transferring a profile of a stamper to the photo-curing resin applied on the plate by the stamper, and irradiating light to the photo-curing resin to cure the photo-curing resin;
    disposing a second substrate to face a surface of the first substrate on which the optical waveguide region is formed, and bonding the first substrate and the second substrate together; and
    removing the plate from the bonded substrates.

2. The method according to claim 1, wherein the step of forming the first substrate includes forming a plurality of the optical waveguides simultaneously.

3. The optical waveguide device according to claim 2, further comprising processing the optical waveguide region after the step of removing the plate.

4. The method according to claim 3, wherein the step of processing the waveguide optical region is a process of forming a filter groove.

5. The method according to claim 3, wherein the step of processing the waveguide optical region is a process of exposing an end portion of the optical waveguide region.

6. The method according to claim 2, further comprising separating the plurality of optical waveguide regions after the step of removing the plate.

7. The method according to claim 1, wherein the plate is transparent.

8. The method according to claim 1, wherein the second substrate is opaque.

9. The method according to claim 1, further comprising forming a functional region on the second substrate.

10. The method according to claim 9, further comprising applying the photo-curing resin as being uncured on at least one of a surface of the first surface on which the at least one optical waveguide region is formed and a surface of the second on which the functional region is formed, wherein the first substrate and the second substrate are bonded together by curing the uncured photo-curing resin.

11. The method according to claim 1, wherein the plate is removed by peeling-off from the bonded substrates.

12. The method according to claim 1, wherein the plate is removed by an etching process.

13. The method according to claim 1, wherein a layer having a lower adhesive property than an adhesion between the first substrate and the second substrate is disposed between the plate and the optical waveguide region.

14. The method according to claim 1, wherein a refractive index of the resin is substantially equal to a refractive index of the photo-curing resin.

* * * * *